United States Patent [19]
Saxton et al.

[11] Patent Number: 5,197,120
[45] Date of Patent: * Mar. 23, 1993

[54] METHODS AND SYSTEMS FOR GENERATING PARAMETRIC DESIGNS

[75] Inventors: Jay R. Saxton, Bellingham; Andrew J. Sodt, Seattle; Dan J. Suslo, Bellingham, all of Wash.

[73] Assignee: Synthesis, Inc., Bellingham, Wash.

[ * ] Notice: The portion of the term of this patent subsequent to Nov. 21, 2006 has been disclaimed.

[21] Appl. No.: 439,869

[22] Filed: Jan. 16, 1990

Related U.S. Application Data

[62] Division of Ser. No. 925,278, Oct. 30, 1986, Pat. No. 4,882,692.

[51] Int. Cl.$^5$ .............................................. G06F 15/20
[52] U.S. Cl. ................................... 395/139; 395/141; 395/149; 395/156; 340/725; 340/726
[58] Field of Search ................ 364/518, 521; 395/139, 395/141, 149, 156; 340/725, 726

[56] References Cited

U.S. PATENT DOCUMENTS

| | | | |
|---|---|---|---|
| 4,475,104 | 10/1984 | Shen | 340/723 X |
| 4,549,275 | 10/1985 | Sukonick | 364/521 |
| 4,551,810 | 11/1985 | Levine | 364/512 |
| 4,686,580 | 8/1987 | Kato et al. | 382/47 X |
| 4,882,692 | 11/1989 | Saxton et al. | 395/139 |

Primary Examiner—Heather R. Herndon
Attorney, Agent, or Firm—Hughes & Multer

[57] ABSTRACT

A method for generating a parametric design on a computer without the use of a programming language. A drawing processor is used to create a master drawing from which other drawings of different dimensions can then be synthesized by modification of the master drawing. Instead of each dimension in the master drawing being given a fixed value, it is given a label. These labels are replaced at run time by dimensions the user provides or dimensions which are calculated as described in a design plan. When the program is run, the system uses simple language to prompt the user for each design value. It incorporates the response with data previously entered into the design plan. If a response is unclear, a request is made for clarification. As a draftman would do, the invention merges the design values with data from both the design plan and the master drawing to create a finished drawing. In executing a parametric design, the user selects the controlling design plan to be used as a basis of the design. Acting on information contained therein, other design plans may be loaded and executed automatically. As a result, images of associated master drawings are modified and/or combined to represent the design. The final design is represented by electronically stored data which can be utilized to create a visual display such as a drawing and/or directly to manufacture a part, structure, etc. As an option, the user's direct role in the process can be supplanted by a computer program.

32 Claims, 55 Drawing Sheets

| ENTITY | NUMBER OF POINTS | | LOCATION OF REFERENCE POINT(S) WITHIN THE ENTITY |
|---|---|---|---|
| LINEAR HORIZONTAL OR VERTICAL DIMENSION | 4 |  | EXTENSION LINE ORIGINS (2) AND ENDPOINTS OF EXTENSION LINE (1) AND DEPTH-OF-FIELD LINE (1) |
| LINEAR ROTATED OR ALIGNED DIMENSION | 2 |  | ENDPOINTS OF THE TWO EXTENSION LINES |
| LINE | 2 |  | THE ENDPOINTS OF THE LINE |
| ARC | 2 |  | THE ENDPOINTS OF THE ARC |
| TRACE | 4 | 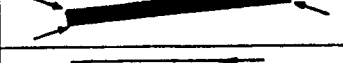 | THE ENDS OF ITS CENTERLINE |
| SOLID | 4 | 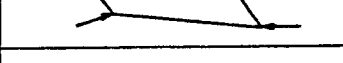 | EACH OF ITS VERTICES |
| RIGHT-ALIGNED TEXT | 1 | RIGHT  | RIGHT END OF TEXT |
| LEFT-ALIGNED TEXT | 1 | 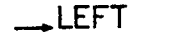 LEFT | LEFT END OF TEXT |
| CENTER-ALIGNED TEXT | 1 | CENTER 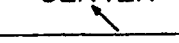 | CENTER OF TEXT |
| ALIGNED TEXT | 2 | 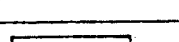 ALIGNED 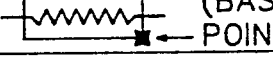 | BOTH ENDS OF TEXT |
| SHAPE | 1 | 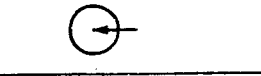 (BASE POINT) | INSERTION POINT |
| CIRCLE | 1 | 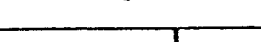 | CENTER OF THE CIRCLE |
| POINT | 1 | . ← | THE POINT ITSELF |
| POLYLINE | 2 PER SEGMNT | 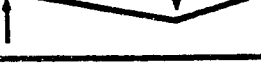 | ADJACENT NODES ALONG POLYLINE |

Fig. 1

```
SYNTHESIS
MAIN MENU
   0.  EXIT
   1.  CREATE A NEW RECTIFIABLE
       DRAWING
   2.  EDIT AN EXISTING DRAWING
   3.  EDIT A DESIGN GENERATOR
   4.  BLOCKBUST (UPGRADE DRAWING)
   5.  RUN AN AUTOMATED DESIGNER
   6.  RECTIFY A DRAWING
   7.  EXECUTE A MULTI-DESIGN
ENTER YOUR CHOICE:
NAME OF THE DESIGN? :  ◇: WINDOWS
OUTPUT DRAWING NAME? :  ◇: WINDOW-A
```
↓ 2

```
               "WINDOW" DESIGN PLAN
ANSWER THE FOLLOWING QUESTIONS TO
DESIGN A WINDOW:
   WHAT IS THE WINDOW'S WIDTH?
   WHAT IS THE WINDOW'S HEIGHT?

YOU HAVE THE OPTION TO PROVIDE THE WINDOW
WITH ELABORATE UPPER AND LOWER CASEMENTS.

SHOULD WINDOW HAVE ELABORATE
   UPPER CASEMENT (1=YES 0=NO)?
SHOULD WINDOW HAVE ELABORATE
   LOWER CASEMENT (1=YES 0=NO)?

ENTER YOUR CHOICE:
NAME OF THE DESIGN?:  ◇: WINDOWS
OUTPUT DRAWING NAME?:  ◇: WINDOW-A
```
↓ 4

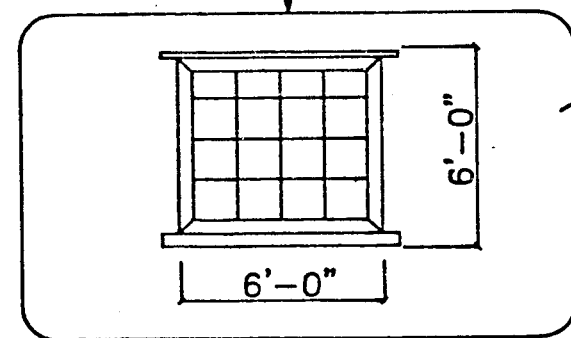
6

Fig. 6

| LABEL | VARIABLE | MEASUREMENT | TEXT |
|---|---|---|---|
| | | | WINDOW DESIGN SESSION |
| | | | ANSWER THE FOLLOWING QUESTIONS TO |
| | | | DESIGN A WINDOW |
| $1 | WIDTH | 4.0000 | 4'-0" |
| $2 | HEIGHT | 5.0000 | 5'-0" |
| | | | YOU HAVE THE OPTION TO PROVIDE |
| | | | THE WINDOW WITH ELABORATE UPPER |
| | | | AND LOWER CASEMENTS |
| $3 | UPPER | 1.0000 | 1'-0" |
| $4 | LOWER | 1.0000 | 1'-0" |

| DESIGN MASTER | | X-INSERT | Y-INSERT | SCALE | ROTATE |
|---|---|---|---|---|---|
| WINDOW.DEZ WINDOW | | 0.0000 | 0.0000 | 1.0000 | 0.0000 |
| ^ AUTO-ON | | | | | |

ROW 3==>GETNUM("WHAT WIDTH IS THE WINDOW?",4)

Fig. 9

```
LABEL    VARIABLE    MEASUREMENT    TEXT

ANSWER THE FOLLOWING QUESTIONS TO
DESIGN A DOOR
$1       WIDTH       3.000000       3'-0"
$2       HEIGHT      7.500000       7'-6"

SPEC    MASTER    INSERT X,Y    SCALE    ROTATE
DOORS   DOOR      0.00   0.00   1.00     0.00
>PROMPT [WHAT IS THE DOOR'S HEIGHT?]
```

Fig. 18

```
              WALL DESIGN
ANSWER THE FOLLOWING QUESTIONS TO DESIGN
THE  FRONT AND SIDE VIEWS OF A WALL:
$1       FRONT      10.000000      10'-0"
$2       SIDE.      10.000000      10'-0"
$3       BETWEEN    10.000000      10'-0"
$4       HEIGHT     10.000000      10'-0"

SPEC    MASTER    INSERT X,Y    SCALE    ROTATE
WALLS   WALL      0.00   0.00   1.00     0.00
>PROMPT [WHAT IS THE HEIGHT OF THE WALL?]
$2          SIDE.      10.000000      10'-0"
```

Fig. 19

ROOF DESIGN
ANSWER THE FOLLOWING QUESTIONS TO
DESIGN A ROOF:

| | | | |
|---|---|---|---|
| $1 | WIDTH | 10.000000 | 10'-0" |
| $4 | BETWEEN | 4.000000 | 4'-0" |
| $3 | LENGTH | 2.000000 | 2'-0" |
| $2 | HEIGHT | 6.000000 | 6'-0" |

| SPEC | MASTER | INSERT X,Y | SCALE | ROTATE |
|---|---|---|---|---|
| ROOFS | ROOF | 0.00  0.00 | 1.00 | 0.00 |
| $4 | BETWEEN | 4.000000 | | 4'-0" |

Fig. 20

"DOORS" DESIGN PLAN

ANSWER THE FOLLOWING QUESTIONS TO
DESIGN A DOOR:

WHAT IS THE DOOR'S WIDTH?
WHAT IS THE DOORS HEIGHT?

Fig. 21

"WALL" DESIGN PLAN

THE FRONT AND SIDE VIEW OF A WALL:

WHAT IS THE LENGTH OF THE FRONT OF THE WALL?
WHAT IS THE LENGTH OF THE SIDE OF THE WALL?
WHAT IS THE DISTANCE BETWEEN WALLS?
WHAT IS THE HEIGHT OF THE WALL?

Fig. 22

"ROOF" DESIGN PLAN

ANSWER THE FOLLOWING QUESTIONS TO DESIGN A ROOF:

WHAT IS THE WIDTH OF THE ROOF?
WHAT IS THE ROOF'S LENGTH?

Fig. 23

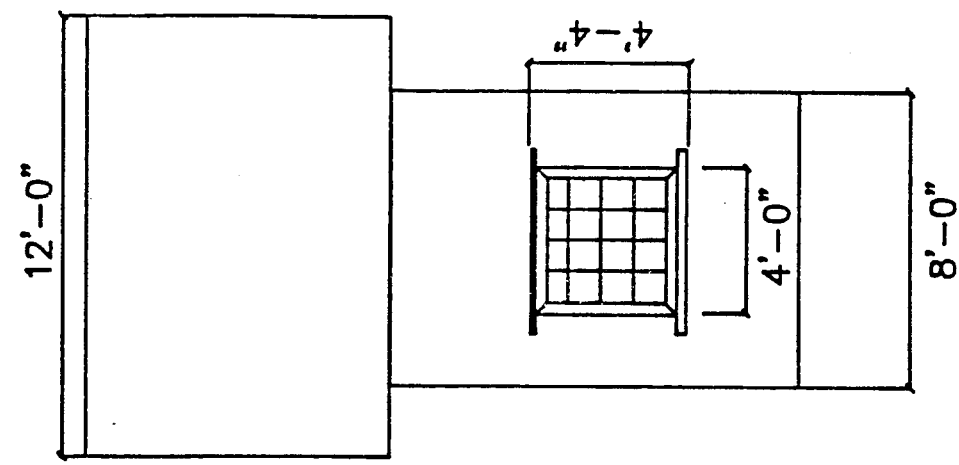
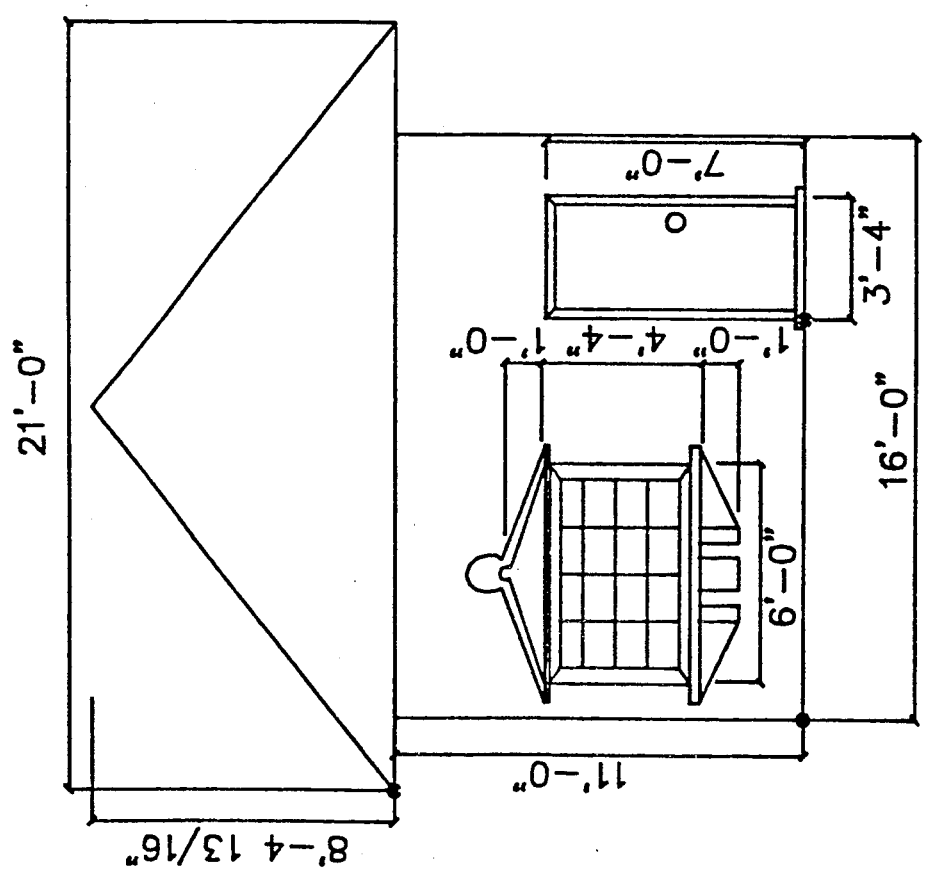
FIG. 24

WELCOME TO THE HOUSE DESIGN MODULE

ANSWER THE FOLLOWING QUESTIONS TO DESIGN A HOUSE.

HOW WIDE SHOULD THE HOUSE BE?
HOW LONG SHOULD THE HOUSE BE?
WHAT IS THE WIDTH OF THE DOOR?
WHAT IS THE HEIGHT OF THE DOOR?
NEXT, DESIGN THE WINDOWS FOR THE FRONT OF THE HOUSE.

WINDOW DESIGN SESSION.

ANSWER THE FOLLOWING QUESTIONS TO DESIGN A WINDOW.

WHAT IS THE WIDTH OF THE WINDOW?
WHAT IS THE HEIGHT OF THE WINDOW?
YOU HAVE THE OPTION TO PROVIDE THE
WINDOW WITH ELABORATE UPPER AND LOWER CASEMENTS.
NEXT, DESIGN THE WINDOWS FOR THE FRONT OF THE HOUSE.
SHOULD THE WINDOW HAVE ELABORATE UPPER CASEMENT?
SHOULD THE WINDOW HAVE ELABORATE LOWER CASEMENT?
HOW MUCH SPACE WOULD YOU LIKE ON THE ENDS OF THE ROW?
HOW MANY OBJECTS WOULD YOU LIKE IN THE ROW?
NEXT, DESIGN THE WINDOWS FOR THE SIDES OF THE HOUSE.

WINDOW DESIGN SESSION.

ANSWER THE FOLLOWING QUESTIONS TO DESIGN A WINDOW.

WHAT IS THE WIDTH OF THE WINDOW?
WHAT IS THE HEIGHT OF THE WINDOW?
YOU HAVE THE OPTION TO PROVIDE THE
WINDOW WITH ELABORATE UPPER AND LOWER CASEMENTS.
SHOULD THE WINDOW HAVE ELABORATE UPPER CASEMENT?
SHOULD THE WINDOW HAVE ELABORATE LOWER CASEMENT?
HOW MUCH SPACE WOULD YOU LIKE ON THE ENDS OF THE ROW?
HOW MANY OBJECTS WOULD YOU LIKE IN THE ROW?

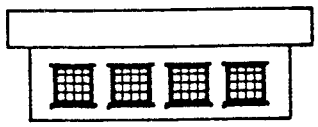

Fig. 25

```
WELCOME TO THE HOUSE DESIGN SESSION.
ANSWER THE FOLLOWING QUESTIONS TO DESIGN A HOUSE.
LABEL     VARIABLE-NAME      VALUE      TEXT
          EAVE_LENGTH         2.00
          ROOF_HEIGHT         5.00
          HOUSE_WIDTH        20.00
          HOUSE_HEIGHT       15.00
          HOUSE_LENGTH       20.00

WALL_HEIGHT        10.00
          ROOF_LENGTH        24.00      24'0"
          ROOF_WIDTH         24.00      24'0"

SPACE               4.00
          EX_ROOF_SPACE       1.00      1'0"
          EX_ROOF_HEIGHT      1.00      1'0"
          EX_ROOF_LENGTH      1.00

EX_ROOF_YINS        1.00
SPEC-FILE    MASTER    X-INSERT    Y-INSERT    SCALE
HOME.DEZ     NEW        0.00        0.00        1.0
  ^   AUTO-ON
ROW 3 ==>PROMPTSTR("HOW LONG ARE THE ROOF EAVES?")
```

Fig. 28

| LABEL | VARIABLE-NAME | VALUE | TEXT |
|---|---|---|---|
| | OBJNAME | 1.00 | WINDOW.DEZ |
| | CALCOBJ | | WINDOW.DEZ |
| | TOTLENGTH | 20.00 | |
| | ENDSPACE | 0.00 | |
| | OBJWIDTH | 4.00 | |
| | MAXOBJ | 5.00 | |
| | NUM_OBJ | 2.00 | |
| | SPACE_BETWEEN | 12.00 | |
| | START_XINS | 30.00 | |
| | START_YINS | 2.00 | |
| | XINS_1 | 2.00 | |
| | XINS_2 | 18.00 | |
| | XINS_3 | 34.00 | |
| | XINS_4 | 50.00 | |
| | XINS_5 | 66.00 | |
| | EX_XINS_1 | 1.00 | |
| | EX_YINS_2 | 1.00 | |
| | MAKE_1 | | WINDOW.DEZ |

| SPEC-FILE | MASTER | X-INSERT | Y-INSERT | SCALE |
|---|---|---|---|---|
| ROW.DEZ | NEW.DWG | 0.00 | 0.00 | 0.00 |

V    AUTO-ON
ROW 2==>GETNUM("WHAT IS THE LENGTH OF THE ROW?")

Fig. 29

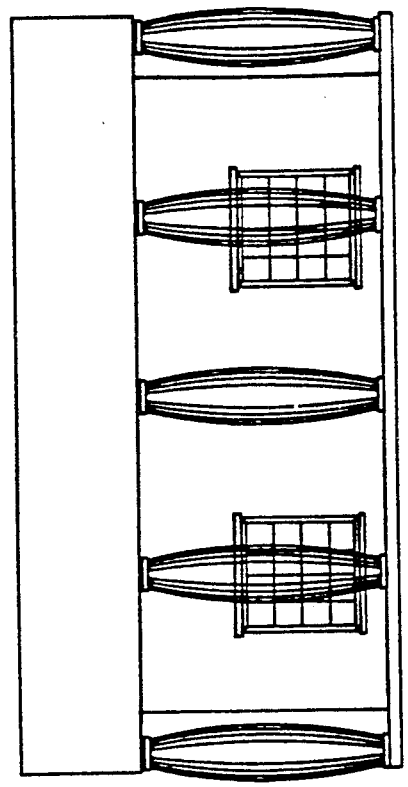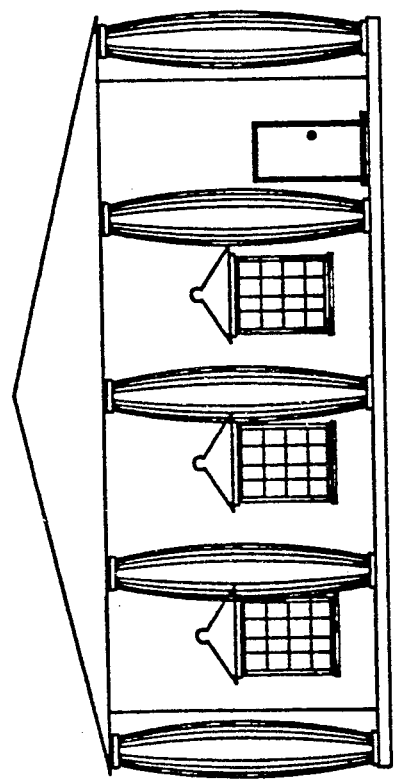
Fig. 49

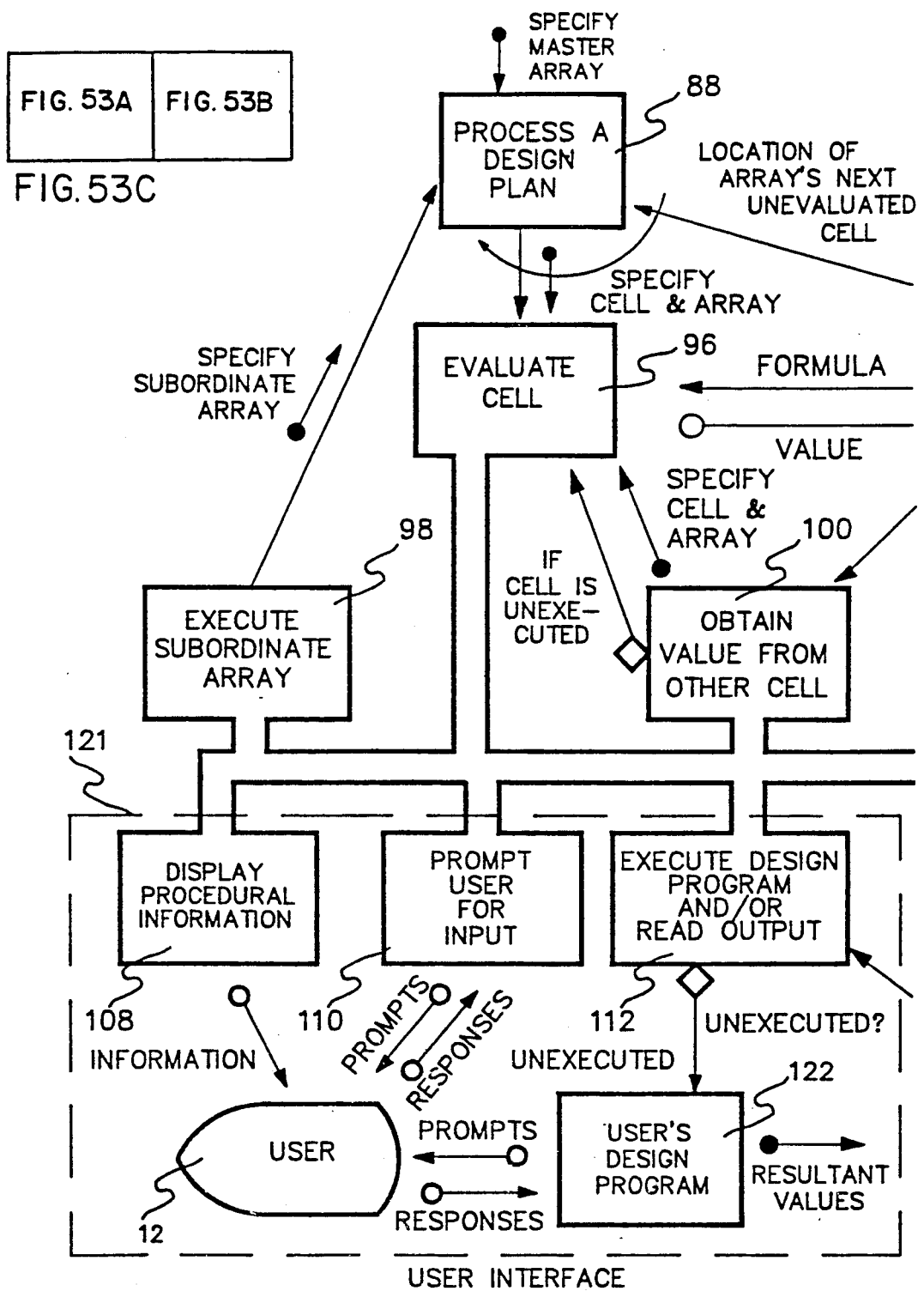
Fig. 53A  TO/FROM  Fig. 53B

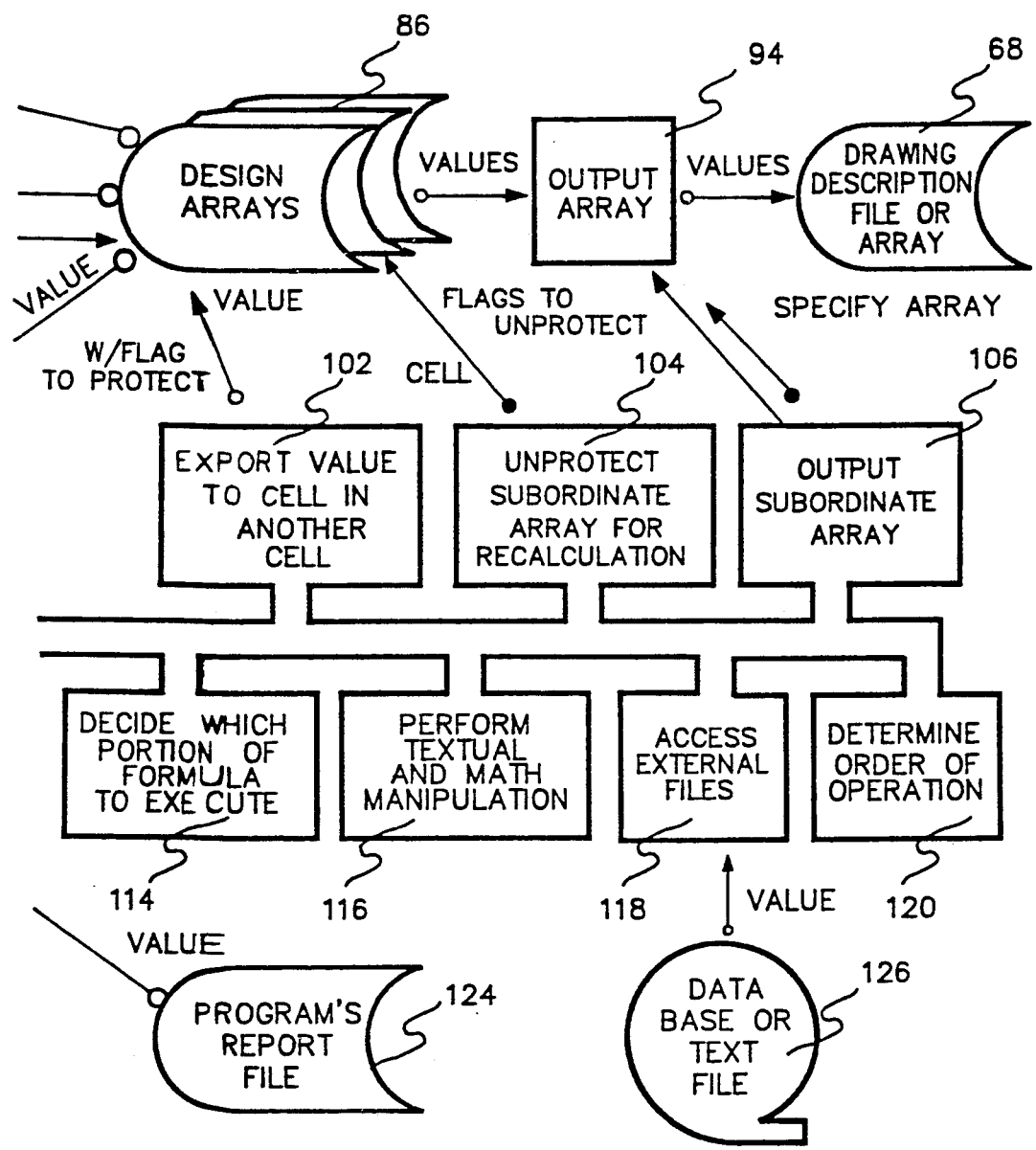
Fig. 53B TO/FROM Fig. 53A

METHODS AND SYSTEMS FOR GENERATING PARAMETRIC DESIGNS

CROSS REFERENCE TO RELATED APPLICATION

This application is a division of application No. 925,278 filed 30 Oct. 1986 by Jay R. Saxton et al. for METHODS AND SYSTEMS FOR GENERATING PARAMETRIC DESIGNS, now U.S. Pat. No. 4,882,692.

TECHNICAL FIELD OF THE INVENTION

The present invention relates to the computer aided design of manufactured parts by a process which we refer to as modular parametric design.

"Modular parametric design" refers to a system or process which enables a computer to create, to interpret and to relate modules which are capable of both designing and directing the production of a manufactured part by creating an electronically stored image of the part which may be to scale and dimensioned.

BACKGROUND OF THE INVENTION

Computer-aided design (CAD) is a fairly recent advancement in the drafting and design process. While CAD shortened the production time for drafting, it still necessitated complex and laborious procedures to perform parametric design. The techniques were awkward to learn, difficult to use and lacking in power. The only comprehensive approach made use of programming language to write a special purpose program which could both design and draw. Establishing such a design was time consuming and awkward. Other approaches lacked power and could not truly perform parametric design. As a result, an informed operator was required to guide their process during a design's execution. Executing such a design was awkward and prone to error.

Furthermore, CAD did not have the capability of combining data representing different parts or modules of an overall design. This is a significant drawback as all assemblies, and even many parts, can most expeditiously be designed by treating them as integrated aggregations of modular features, parts, and/or sub-assemblies.

Representative of the heretofore proposed CAD systems is the one disclosed in U.S. Pat. No. 4,549,275 issued Oct. 22, 1985, to Sukonic for GRAPHICS DATA HANDLING SYSTEMS FOR CAD WORKSTATION.

A competing system which utilizes computer aid in design creation is disclosed in U.S. Pat. No. 4,451,895 issued Jun. 9, 1983, to Sleikowski for INTER-ACTIVE COMPUTER AIDED DESIGN. This system is of even less interest than CAD systems such as those disclosed in the above-identified Sukonic patent, in part because it is not capable of generating parametric designs.

Another computer-aided design technique that has heretofore been employed involves the parametric enhancement of drawing editing, a technique which makes use of drawing processors. Certain drawing processors such as the AUTOCAD® and the Hewlett-Packard, Euchlid, and Medusa processors, have extremely powerful editing capabilities which include elements of parametric design. However, these all share the limitation that the user is dealing with one detail, or at most, one drawing, at a time.

There are two approaches to the above mentioned-parametric enhancement of drawing editing.

The first is the built-in language approach. To create a unique image, the user must write program code which describes the geometry of the drawing in terms of its coordinates such as the two end points of a line. The built-in language approach has the additional disadvantages that the user can create only one drawing as a result of running a design.

This is undesirable because most designs are depicted in a series of related drawings. For example describing a particular part might entail depicting it in several views: It might be depicted individually (in order to provide details describing the part itself); then again in an assembly drawing (in order to show its physical relationship to surrounding parts); and finally, in a concept drawing (in order to show its function).

The second approach makes use of drawing rectification. Rectification is an editing capability. To rectify a drawing is to make it correct according to its dimension; i.e. the drawing is modified and brought into conformity with its dimensions. Using this enhancement to drawing editing as a basis for parametric design, the user employs equations in the dimensions of the drawing in place of fixed values. The equations, which may involve trigonometric formulas, relate the geometry of different parts of the drawing to one another.

The user can automatically edit the drawing by entering the drawing processor and providing values corresponding to the independent variables in these equations. The user can even use a computer program from outside the drawing processor to calculate these values.

The drawing rectification approach contains the following problems:

1. The design process is not controlled by the computer. This means the user must be educated as to his or her role in producing a-particular design. Since the user has to control the process, the chance of a procedural error being introduced is greatly increased.
2. The user, rather than the program, must decide which drawing to rectify in order to depict the design. Choosing the appropriate parameterized picture, the single most important decision in the process, is left up to the user. An informed user is required as he or she must be aware of the current inventory of parameterized drawings. The process of choosing the appropriate design is awkward and relatively slow.
3. This approach limits the depiction of the design to a single drawing. Most designs cannot be depicted with a single drawing.
4. Since the user is editing an image on the drawing processor, there is a great probability that he will inadvertently change an aspect of the original drawing, introducing an error into the image being edited.

SUMMARY OF THE INVENTION

We have now invented, and disclosed herein, a novel process for generating parametric designs which does not have those limitations of computer-aided design techniques discussed above.

In our novel design process, one or more design modules are created and stored. Each module is composed of two types of information: a design plan and one or more master drawings. Once the modules have been set up and the design process invoked, the modules control the design process, synthesizing the final design by modification (or rectification) of a computer selected master drawing or by merging all or selected portions of two or more master drawings The operator's role is limited to responding to prompts, which are decided upon by the modules. The operator does not have to deal with an on-screen image in creating a part, only with prompts requesting dimensions. These prompts are written in simple English.

The design plan is edited in much the same manner as a spreadsheet. However, it is important to differentiate between the two because no spreadsheet program is adequate for establishing a design algorithm in our process (those which come close enough to be mentioned as prior art are SYMPHONY® and FRAMEWORK®. Some of the drawbacks of spreadsheets which make them unsuitable for our purposes are:

1. A spreadsheet such as SYMPHONY® lacks decision-making capabilities fundamental to designing. For example, SYMPHONY® does not provide a function that chooses which of several designs to execute, depending upon the outcome of a single test. To work around the limitation would be impractical in many cases.
2. Even where it is capable of calculating design values, the spreadsheet proves prohibitively awkward for doing so. Extensive use of macros would be required. For example something as fundamental to the design process as prompting the user for information requires a difficult to-program macro.
3. The parametric design process requires at certain relationships be pre-established between its elements. Whereas spreadsheet "templates" allow for this, there are severe limitations viz., (a) relationships are not dynamically reconfigurable (the user cannot reconfigure units conversion from feet-inches-sixteenths to decimal units while engaged in editing); (b) relationships are awkward to use, sometimes requiring a group of cells as is the case with unit conversion; (c) default relationships cannot be easily overridden. This is a severe drawback for parametric design where certain numeric values must be automatically converted into their textual equivalent and where the user may wish to switch back and forth between different units of measurement (for example feet-inches-sixteenths, decimal feet, etc.). As a result, in many cases the user would be better off to provide individual formulas, establishing relationships one-at-a-time as required rather than configuring default relationships.
4. The spreadsheet format would be extremely confusing to use in establishing a parametric design. A large number of cells would be required for bookkeeping: i.e., for either holding macro code or for holding temporary variables. Thus, most of the large number of cells that would necessarily have to be employed would be superfluous to the actual design process.
5. When a parametric design program is run, even an experienced operator requires full screens of procedural information to instruct him as well as prompts of adequate length. With a spreadsheet, he sees a matrix of cell values (irrelevant during execution) and a single-line prompt placed somewhere on the screen. For an operator who is endeavoring to run an off-the-shelf parametric design on a factory floor, for example, the spreadsheet is therefore inappropriate, as well as prohibitively confusing.
6. Because the operator is s 111 inside the editor during the execution of a spreadsheet, he can change formulas, either accidentally or to "improve" the design. Such inadvertent design alterations and tampering are unacceptable for industries that require parametric designs because the probable cost of one bad design is measured in thousands of dollars.
7. The spreadsheet lacks the capability of establishing design modules which can either stand alone or interact with one another as is the case in the novel parametric design systems disclosed herein. (In the latter case all are resident in memory at the same time, passing information and control between themselves.) This means that any design encoded in a spreadsheet has all of the herein discussed disadvantages inherent in a non-modular design.

In contrast, the parametric design modules employed in our novel process disclosed herein are characterized by the following capabilities:

1. A module can perform engineering calculations and gather information according to its encoded algorithm;
2. A module can create an electronically stored image (or set of images) which depict what it designs, or add information to a composite image which is contributed to by many modules; a non-modular parametric design has thesis capabilities;
3. The parametric design, rather than the user, controls the design process. The user is relegated to the role which is determined by the design. His involvement, if any, once the design is initiated is limited to responses to prompts for design information. This role is clearly defined for him by screens of information. The user does not have to deal with an image in the process;
4. A module can operate alone or in conjunction with other modules. It can be a stand-alone designer; it can be supervised by other modules; or it can itself supervise other modules, subordinate to itself.

A module is blind as to whether it is being supervised. With absolutely no modification to the module, it can be made to serve other modules. When standing alone, a module might prompt the user for design information or calculate information. When subordinate to another module, it might accept exactly the same information directly from the supervising module. It can also be required to pass back any of the values it calculates to its supervisor module. Whether a module produces an image of what it designs or is simply used to perform analysis is decided by its supervisor module.

The novel approach to computer-aided design disclosed herein can also be used to generate non-modular parametric designs. The term "non-modular parametric design" refers to a technique which has these capabilities:

1. It can perform engineering calculations and gather information according to its encoded algorithm;
2. It can create an electronically stored image or set of images which depict what it designs, or it can automatically add information to a composite image which is contributed to by other designs;
3. The parametric design, rather than the user, controls the design process. The user is relegated to the role which is determined by the design. His involvement, if any, once the design is initiated is limited to responses to prompts for design information. This role is clearly defined for him by screens of information. The user does not have to deal with an image in the process.

Our novel technique can also be employed to generate non-modular parametric designs. Although the present invention does not provide the only technique for establishing a non-modular parametric design, its process for doing so is unique. No other process is based on the use of a master drawing and a design plan as disclosed herein.

This is important because our approach provides a way of establishing and executing a non-modular parametric design which is superior to all other approaches. With our system a stand-alone module can be set up in about the time otherwise required to instruct a draftsman. Thereafter, drawings that might otherwise require a draftsman hours, or days, can be completed in minutes. Furthermore, our straightforward approach for both editing and executing a design is less likely to result in the introduction of an error. This makes our approach vastly superior both in terms of speed and in terms of establishing and executing a design. In addition, it doesn't require the user to learn a programming language.

Independent modules provided by our system afford the additional advantage that they can later be integrated into a multicomponent design with absolutely no modification, and no allowance made at the time they were originally established for their eventual mode of use.

Currently, there is no process, other than that of the current invention, for creating a modular parametric design. The only non-modular alternative is to write a computer program in a language such as COGO® or FORTRAN. If for no other reason than its non modularity, this approach makes the creation of large-scale parametric designs much less economically feasible.

Specifically, a COGO® or FORTRAN design program must be written in unitary as opposed to modular form because of the limitations inherent in writing a computer program. Explicit provisions must be made for passing information to other programs, for inputting information from other programs, and for deciding which steps of the program execute.

For example, a FORTRAN program that designs an entire building must be written to take into consideration the relationship each portion of the building has to the building as a whole. Code which designs a single portion of the structure would require extensive modification before it could stand alone as a design unit. As stand-alone code it would have to obtain all governing parameters from the user. However, as part of a program that designed the whole structure, the portion of code that designed exactly the same part would be required to interact with other code that designed the surrounding parts of the structure. This would be required so as to make the physical dimensions and other parameters match Not only would it have to pass and receive information, but it would have to do so in a manner that coordinated the foregoing analysis.

This greatly decreases the short-term benefit as code is written. A long-term, complex programming effort would have to be planned. Since, in general, the relationship between a program's complexity and the time required to produce that program is more geometric than it is linear, this has severe economic implications.

The novel design modules disclosed herein have the formatted appearance of a customized design program when it is executed (in contrast to the module's spreadsheet-like appearance when edited), printing full screens of information and prompts to the user; and these modules have the power to perform modular parametric designs.

In addition to the earlier-mentioned benefits, the modular parametric design approach disclosed and claimed herein provides a unique method for establishing a design algorithm. The method is considerably easier to learn and much faster to use than any of the above-mentioned prior art approaches to parametric design. A non-programmer using it can create a design in a fraction of the time otherwise required by an experienced team of programmers.

To summarize, our novel approach to the creation of parametric designs makes use of information of two types: 1) that contained in master drawings as a vehicle for producing images representing the design; and 2) that contained in a design plan as a vehicle for: a.) establishing the design; b.) modifying and/or combining master drawing images to represent the design and; c.) controlling and exchanging information with other design modules.

OBJECTS OF THE INVENTION

From the foregoing, it will be apparent to the reader that one important and primary object of the present invention resides in the provision of novel, improved processes of utilizing computers as an aid in the generation of parametric designs, particularly in circumstances where repetitive drawing tasks are involved.

Other related and also important but more specific objects of our invention reside in the provision of processes as identified in the preceding object:

which allow parametric designs to be generated much more rapidly and economically and with fewer resources than they can be by employing currently available CAD techniques;

which are user friendly in that they do not involve the use of a computer programming language or the modification of an on-screen (or displayed) image;

which are less subject to error than heretofore available computer related design technologies in that the design process is controlled and executed by the computer, minimizing the possibility of procedural errors being made by the user;

which, in conjunction with the preceding object, are also user friendly in that the user need not possess either programming or technical designing knowledge;

which has the capability, once a master design plan having a design algorithm encoded therein has been selected, of automatically loading and executing other design plans to thereby produce information relevant to the generation of the wanted design;

which are capable of generating accurate, customized drawings, which may be to scale and dimensioned, in a matter of minutes;

which are capable of integrating user supplied data and data from one or more electronically stored design modules in creating a parametric design;

which, in conjunction with the preceding object, have the capability of performing any mathematical calculations that may be necessary to convert the user supplied data to data which is compatible with that available from the electronically stored design modules;

in which the data generated for the parametric design is in a format in which it can be used either to produce a drawing or to directly produce a manufactured part;

which are less prone to the introduction of procedural errors than heretofore available computer related design techniques in that the design process is computer, rather than user, controlled;

which are superior in that the user is not required to select the drawing that is to be modified to produce the final design;

which can be used to create drawings that are either stylized (not to scale) or drawn to scale;

Still another important and primary object of the present invention is the provision of novel systems in which parametric designs can be generated by techniques as characterized in the preceding objects.

Other related and still important, but more specific objects of the invention reside in the provision of systems as aforesaid:

which are capable of creating, interpreting, and relating design modules;

which are capable of both designing and directing the production of a manufactured part or stored image;

which are capable of: automatically choosing the appropriate image and modifying it to represent the design, choosing a scale factor and applying it to the drawing so it fits on a page, and of combining several images into a single drawing.

And yet another important and primary object of the present invention is the provision of novel design plans and design control modules for such systems.

Related and important but again more specific objects of our invention reside in the provision of such design plans:

which can be edited for a design algorithm to be called up during the parametric design process;

which can be set up in a manner akin to that used to provide instructions to a draftsman;

which provide on-screen information and prompts at run time.

Other important objects, features, and advantages of our invention will be apparent to the reader from the foregoing and the appended claims and as the ensuing detailed description and discussion proceeds in conjunction with the accompanying drawings.

BRIEF DESCRIPTION OF THE DRAWINGS

In the drawing:

FIG. 1 is a chart representing drawing entities and their reference points;

FIG. 6 depicts the process of creating a window drawing;

FIG. 9 shows the appearance of a WINDOW design plan as presented by the design editor, the drawing being annotated to show the various regions of the design plan.

Figure 26:
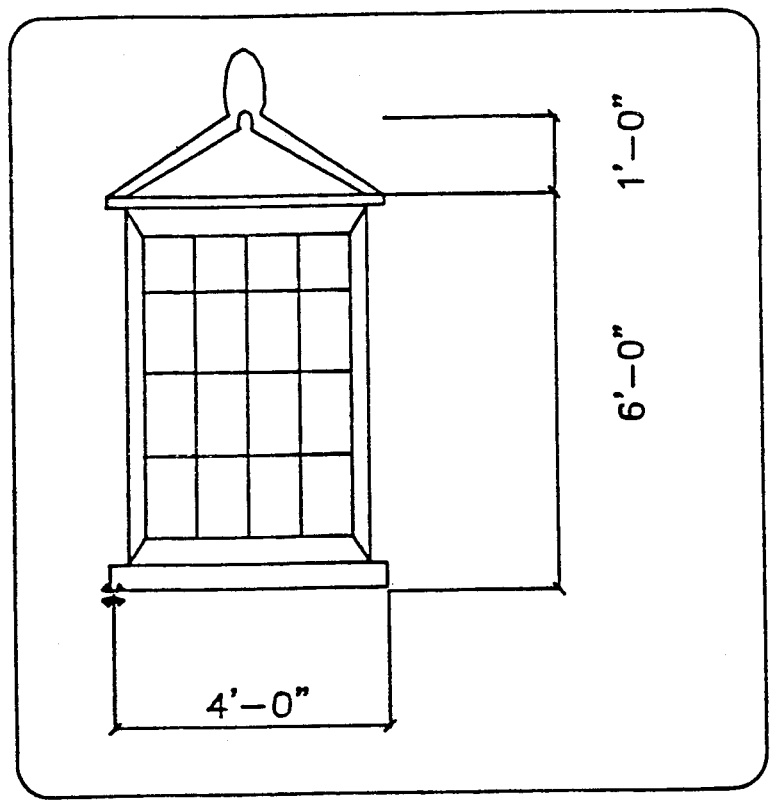
Figure 27:
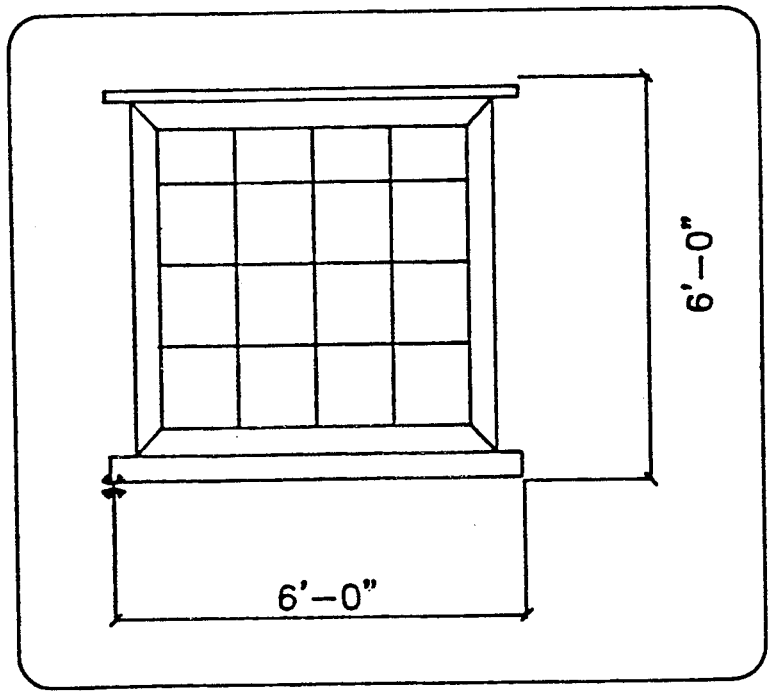
Figure 30:
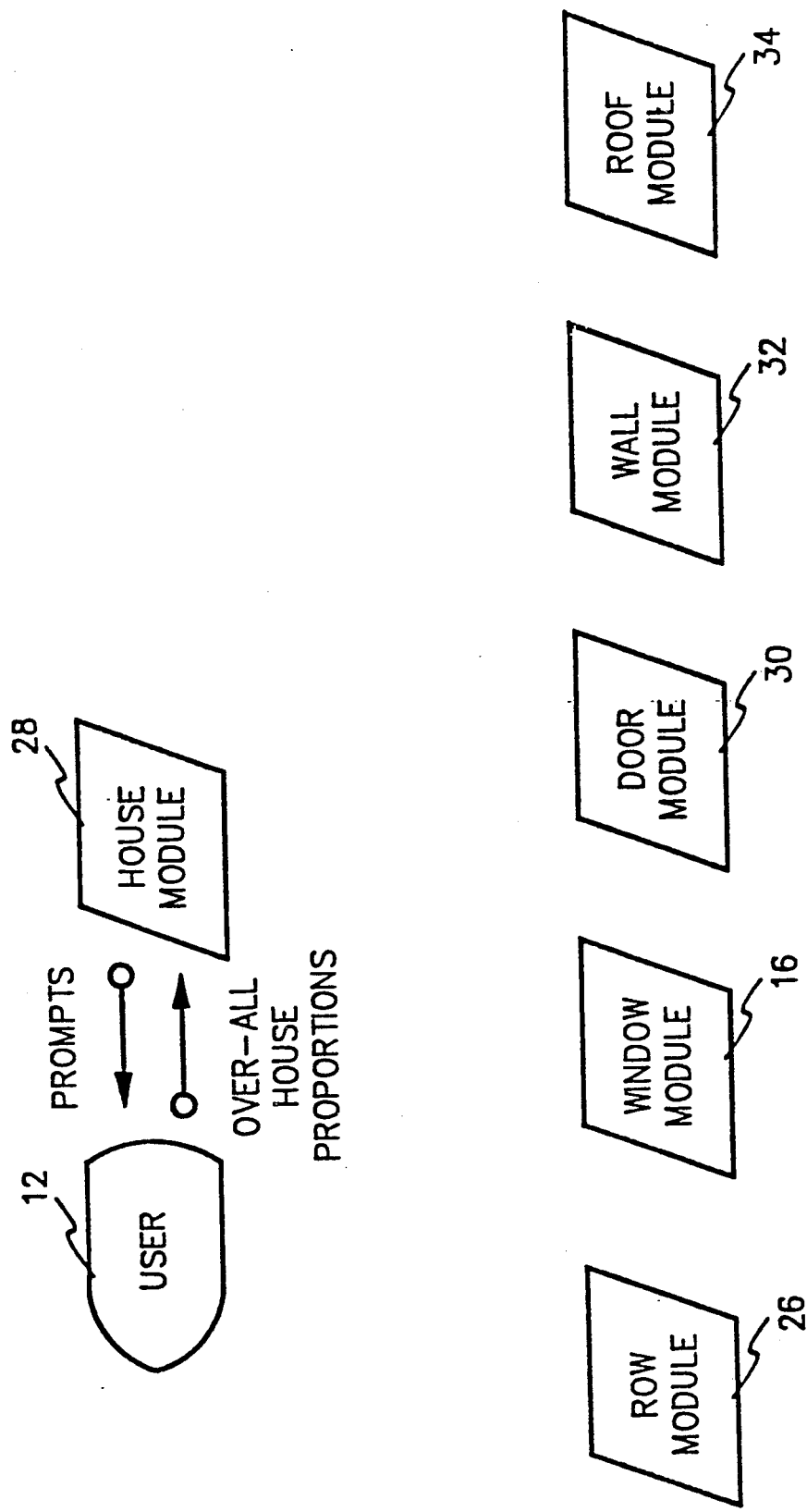
Figure 31:
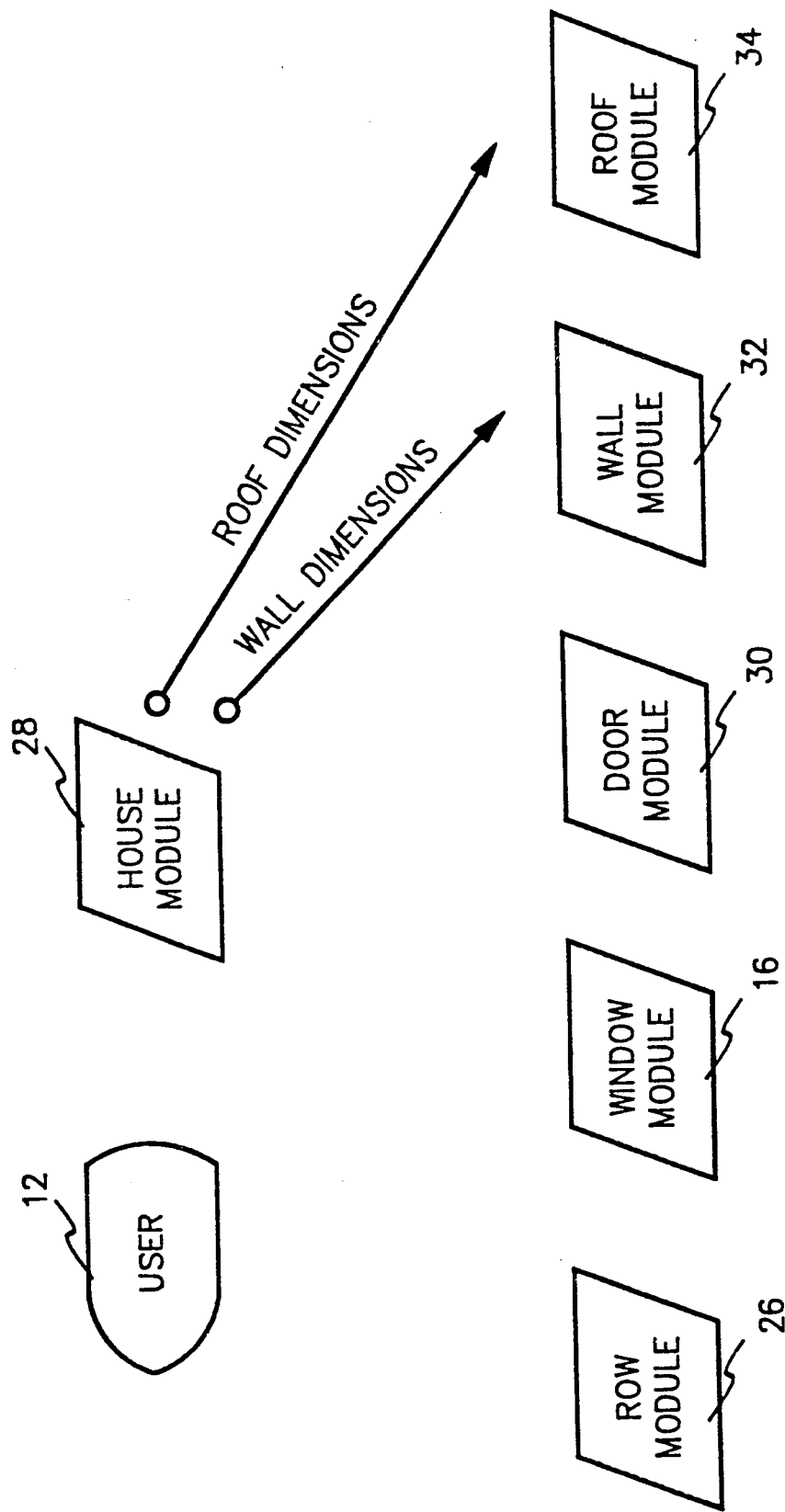
Figure 32:
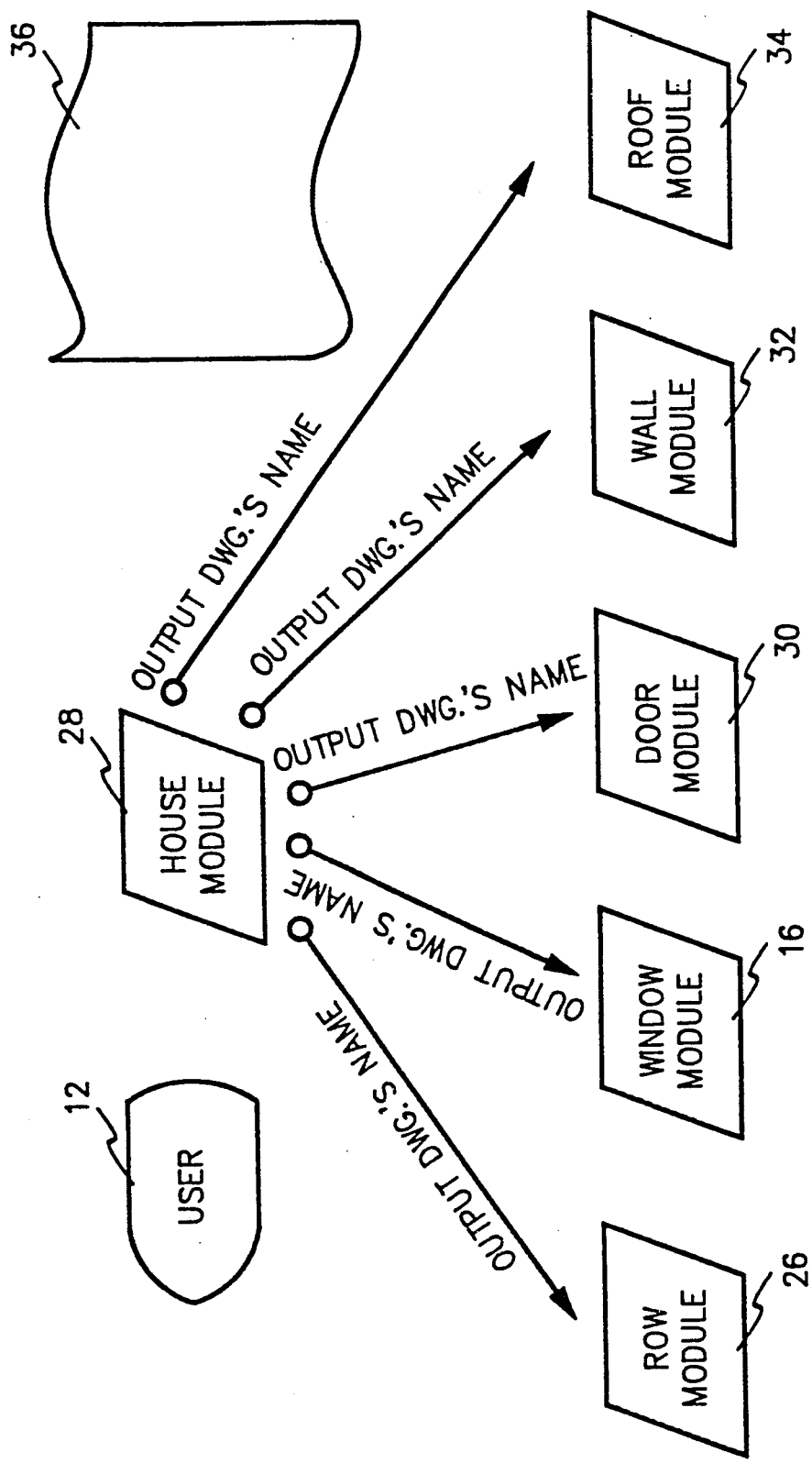
Figure 33:
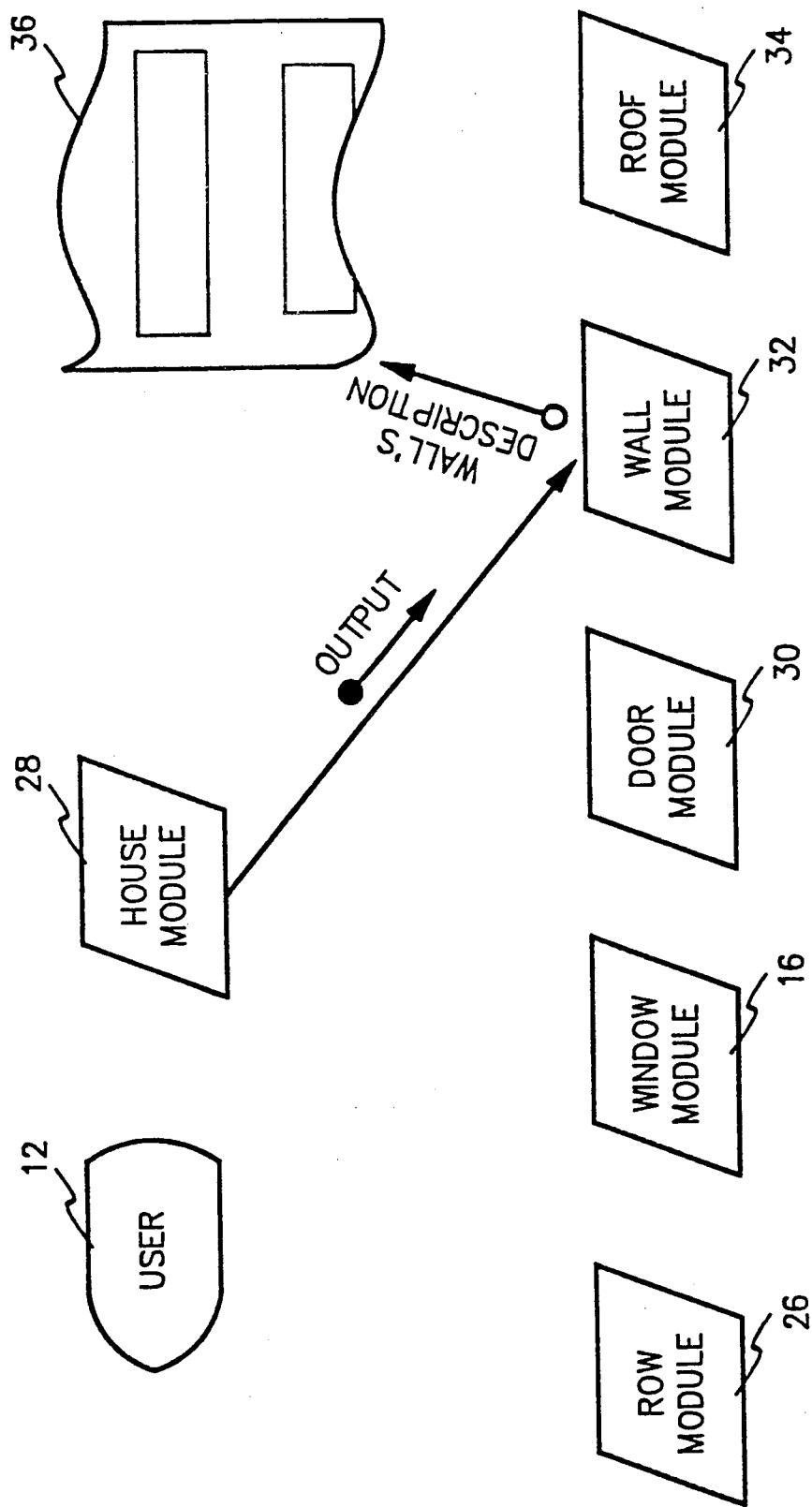
Figure 34:
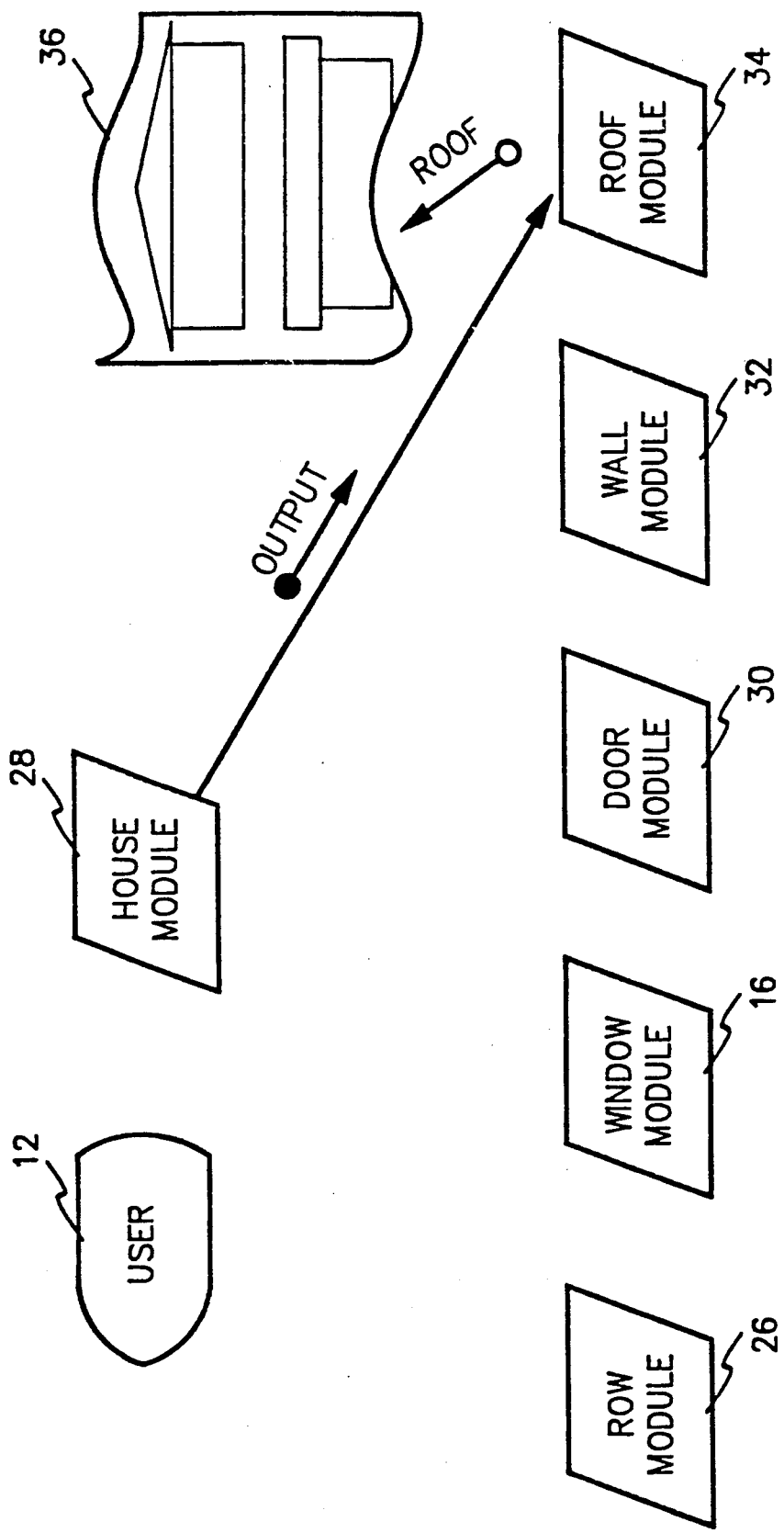
Figure 35:
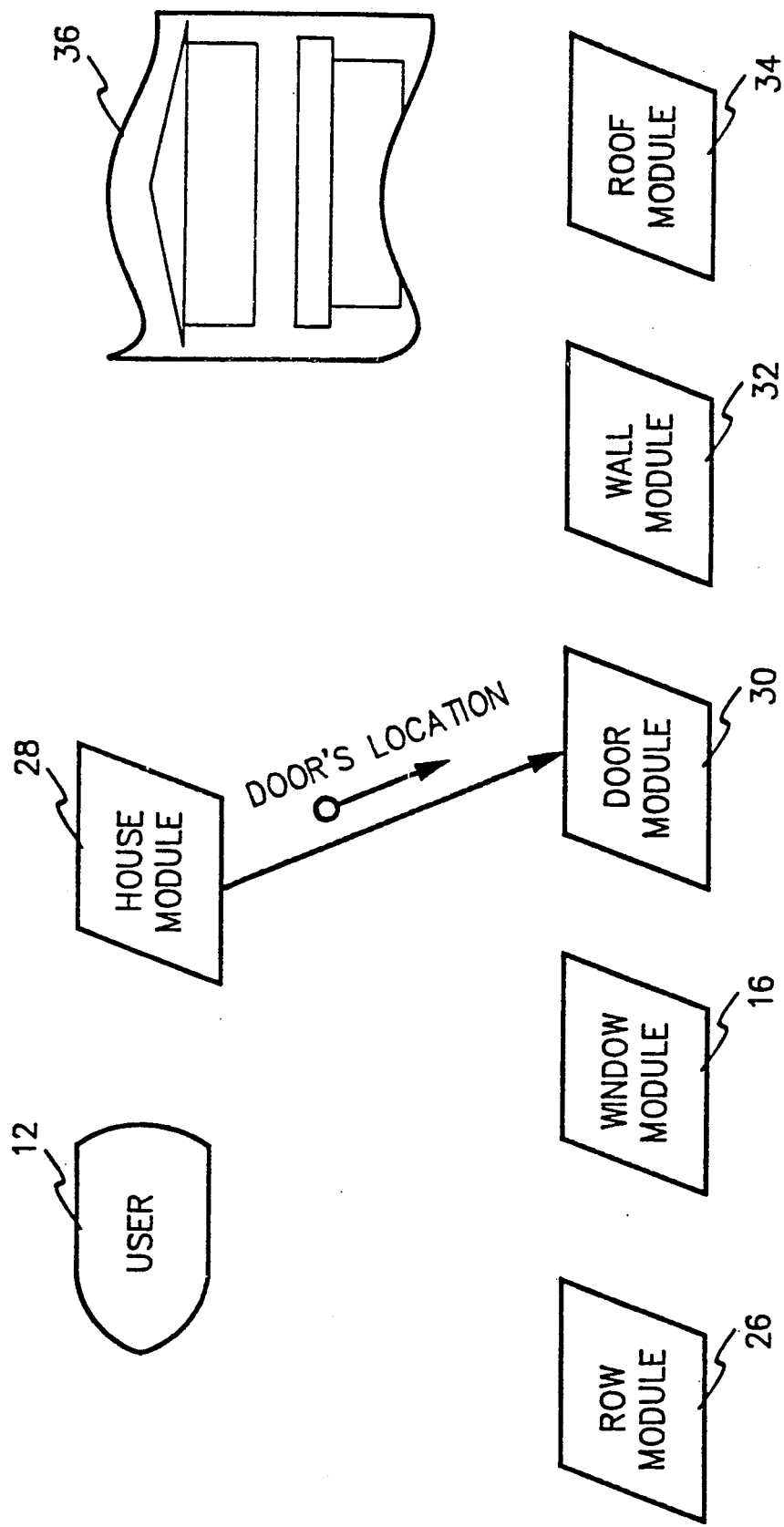
Figure 36:
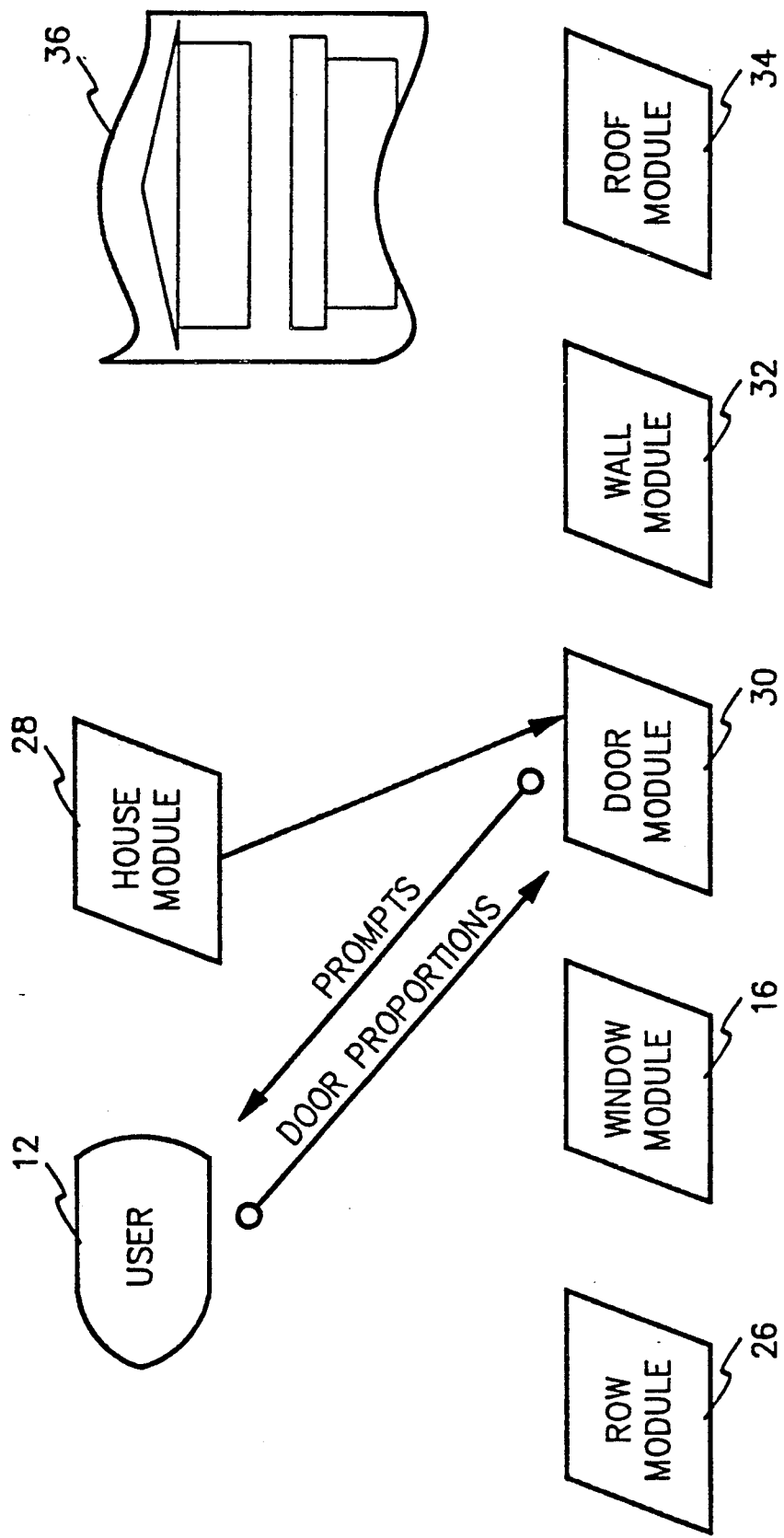
Figure 37:
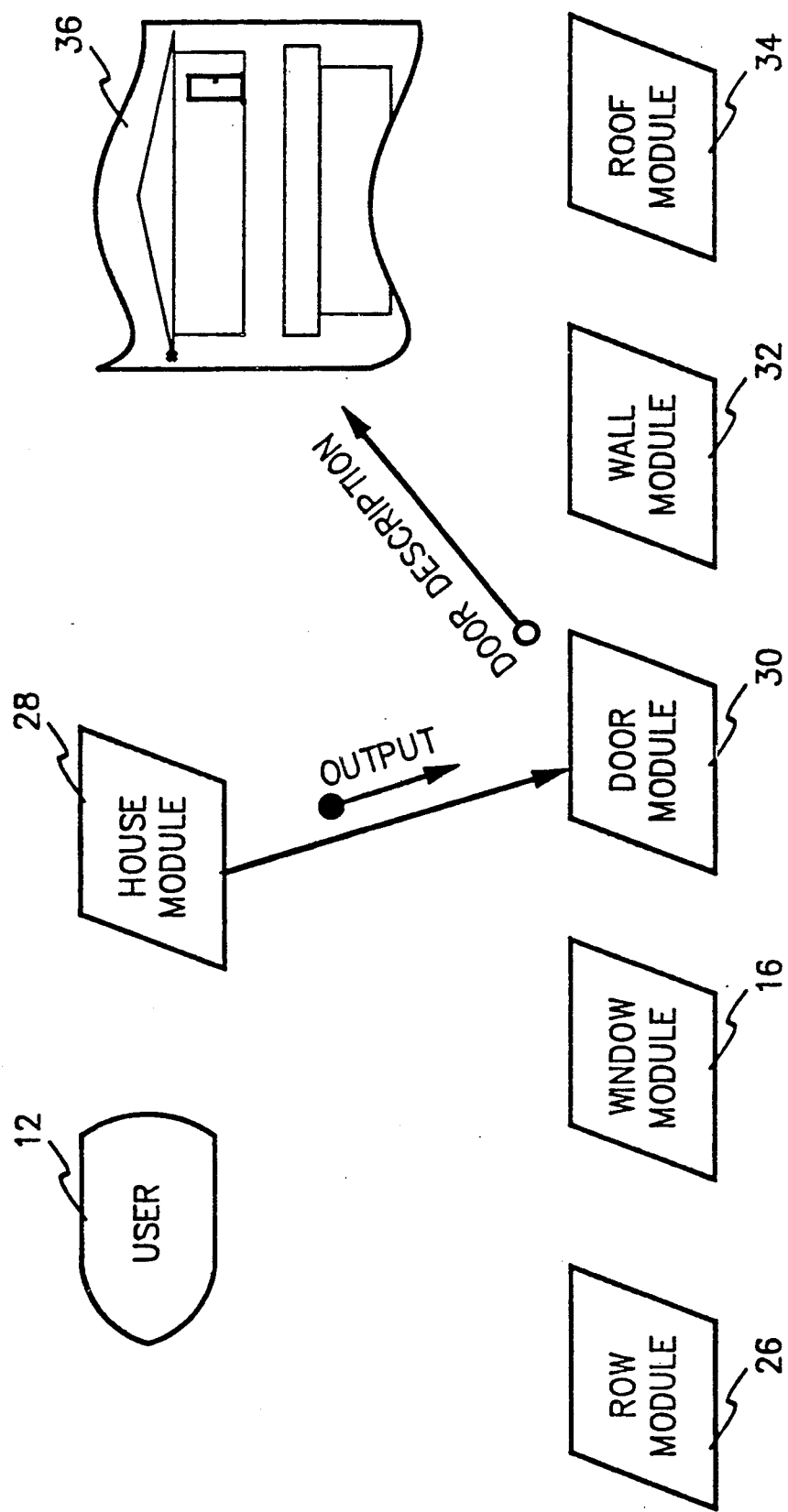
Figure 38:
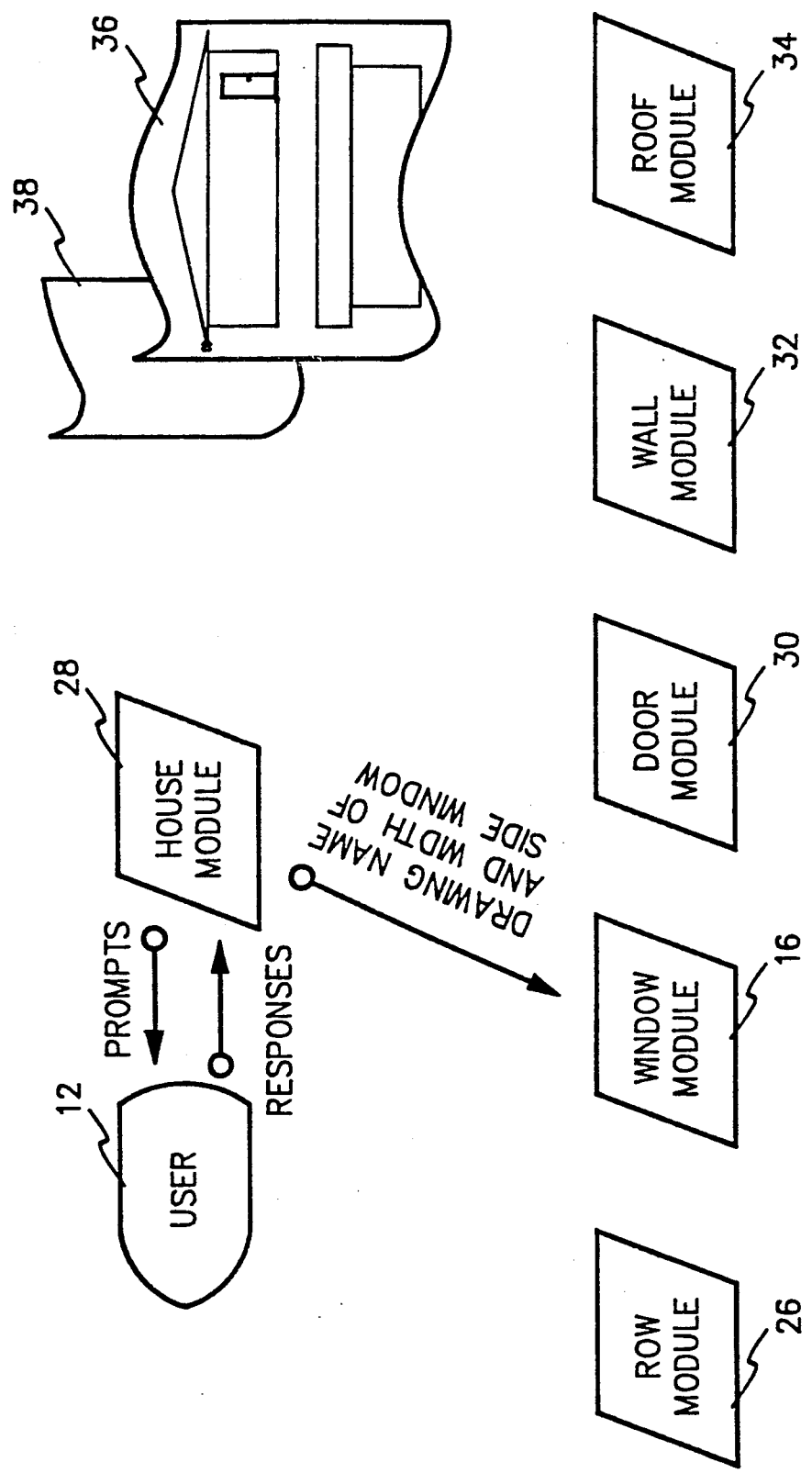
Figure 39:
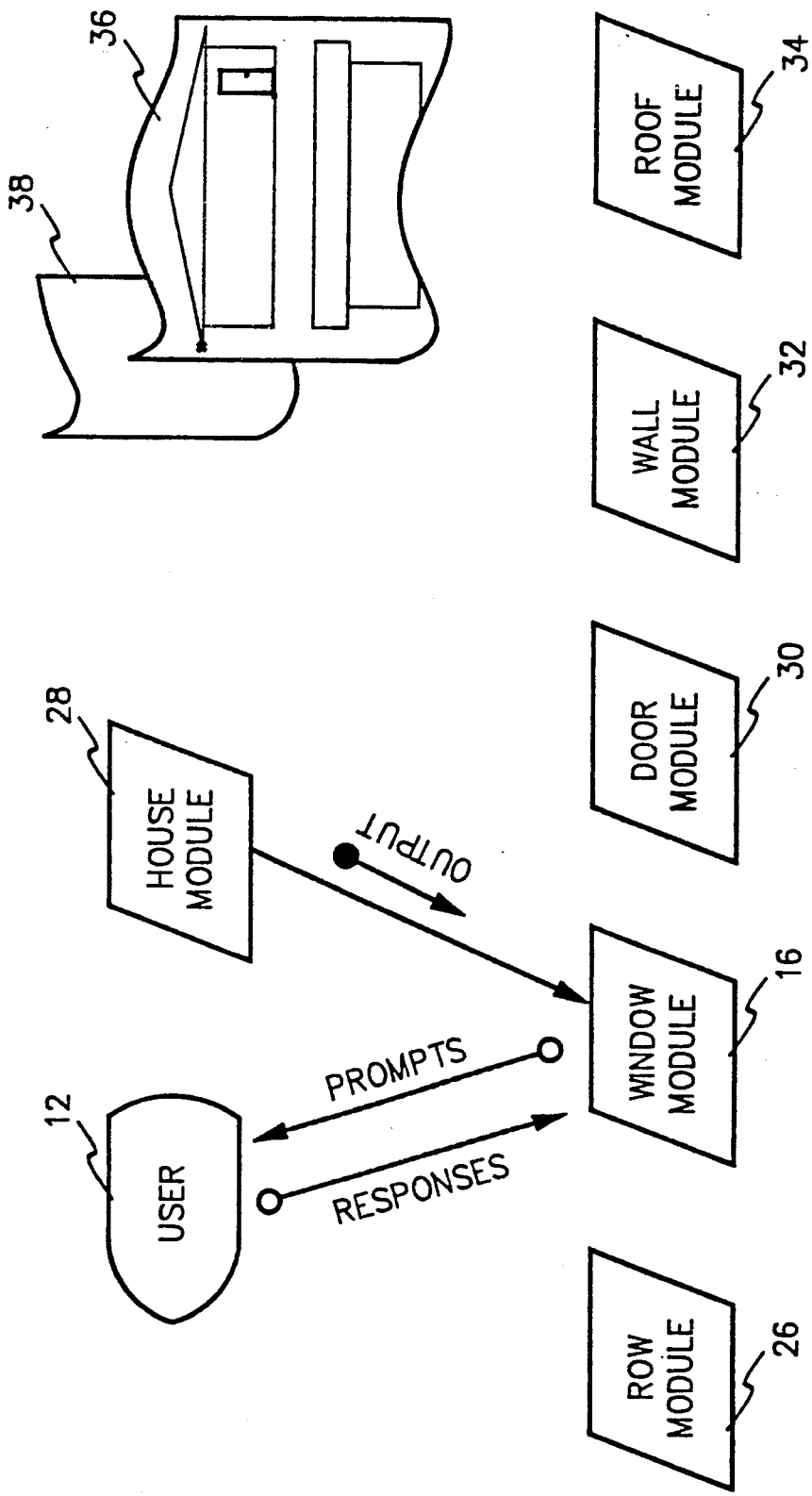
Figure 40:
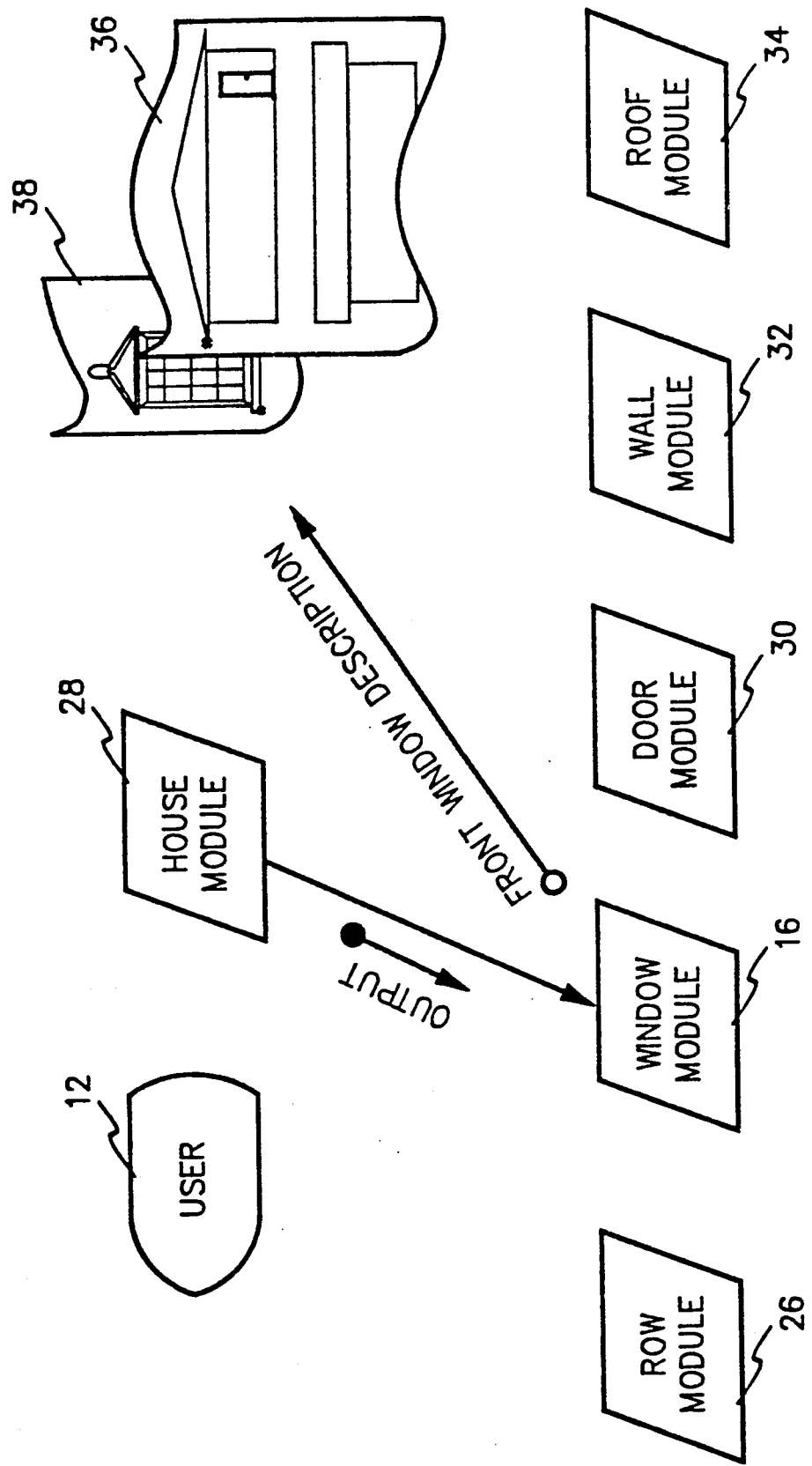
Figure 41:
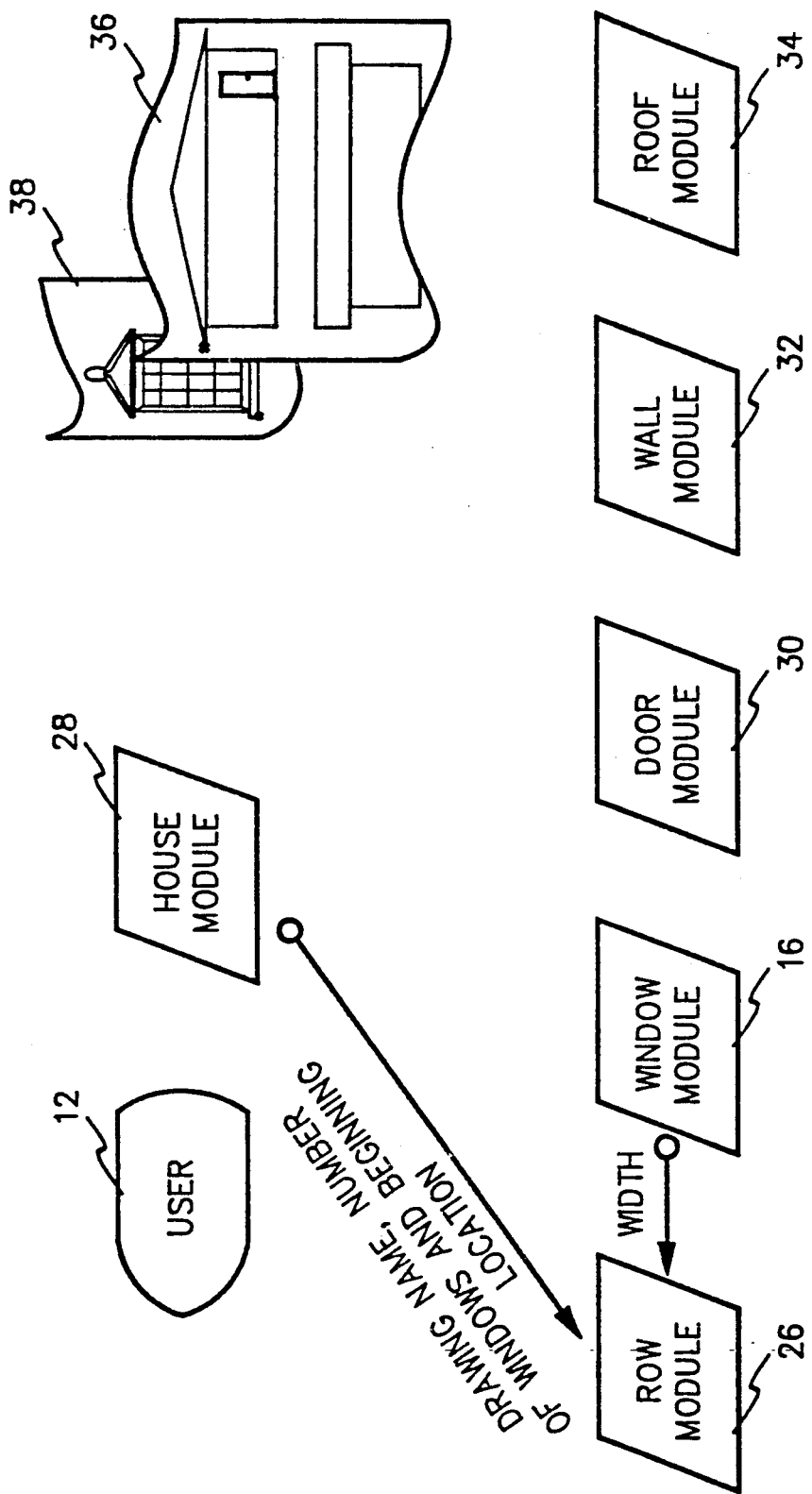
Figure 42:
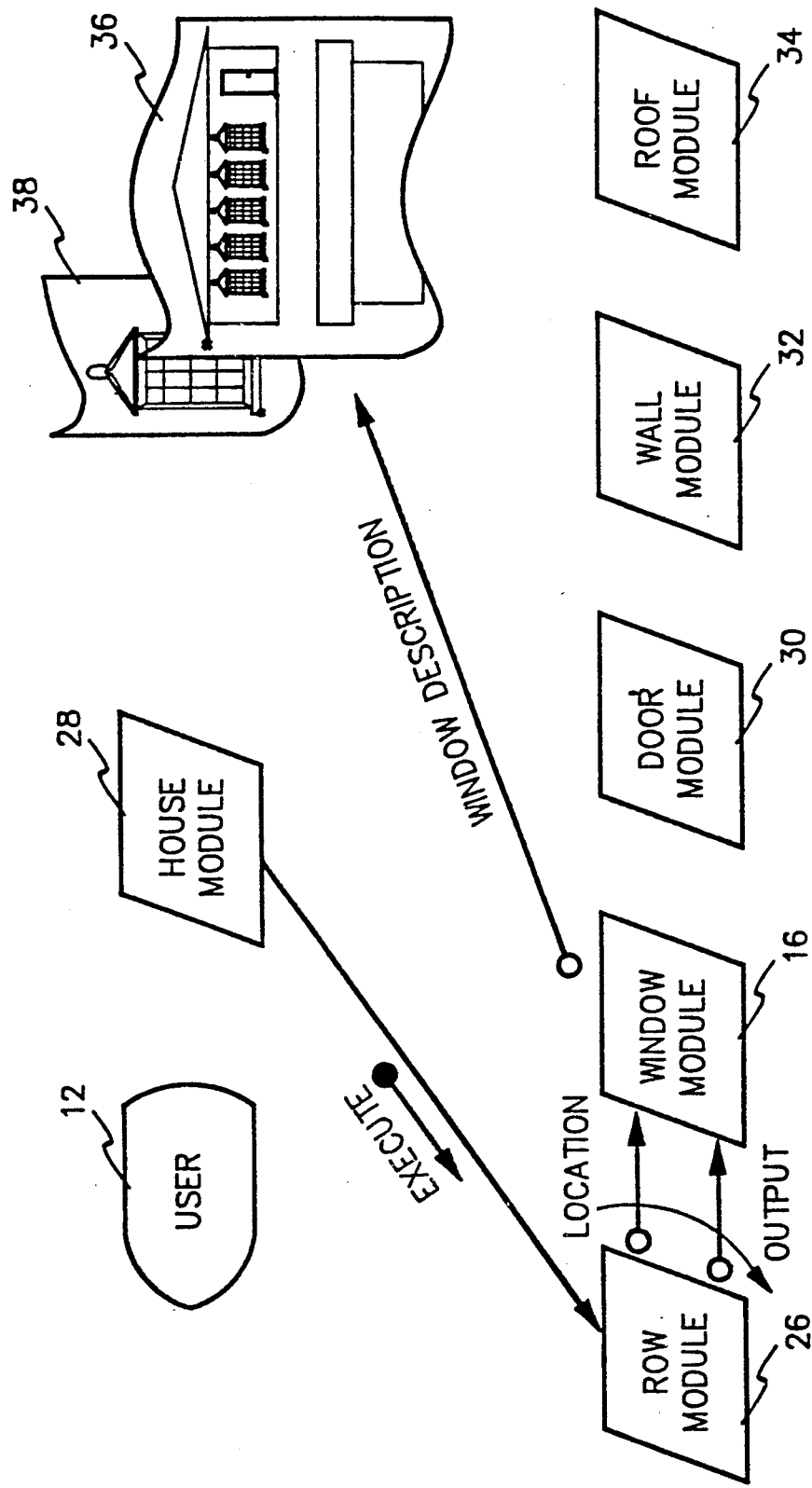
Figure 43:
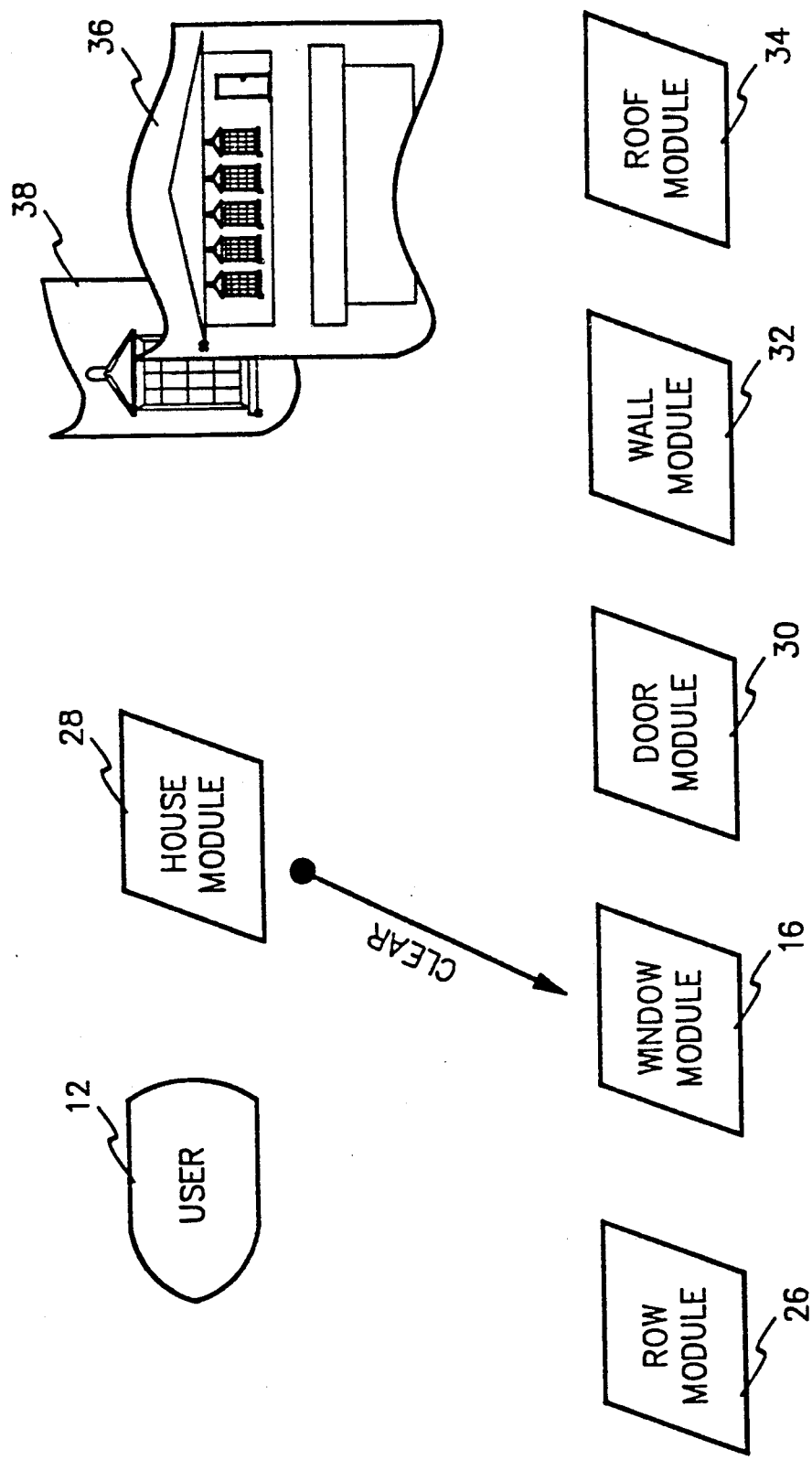
Figure 44:
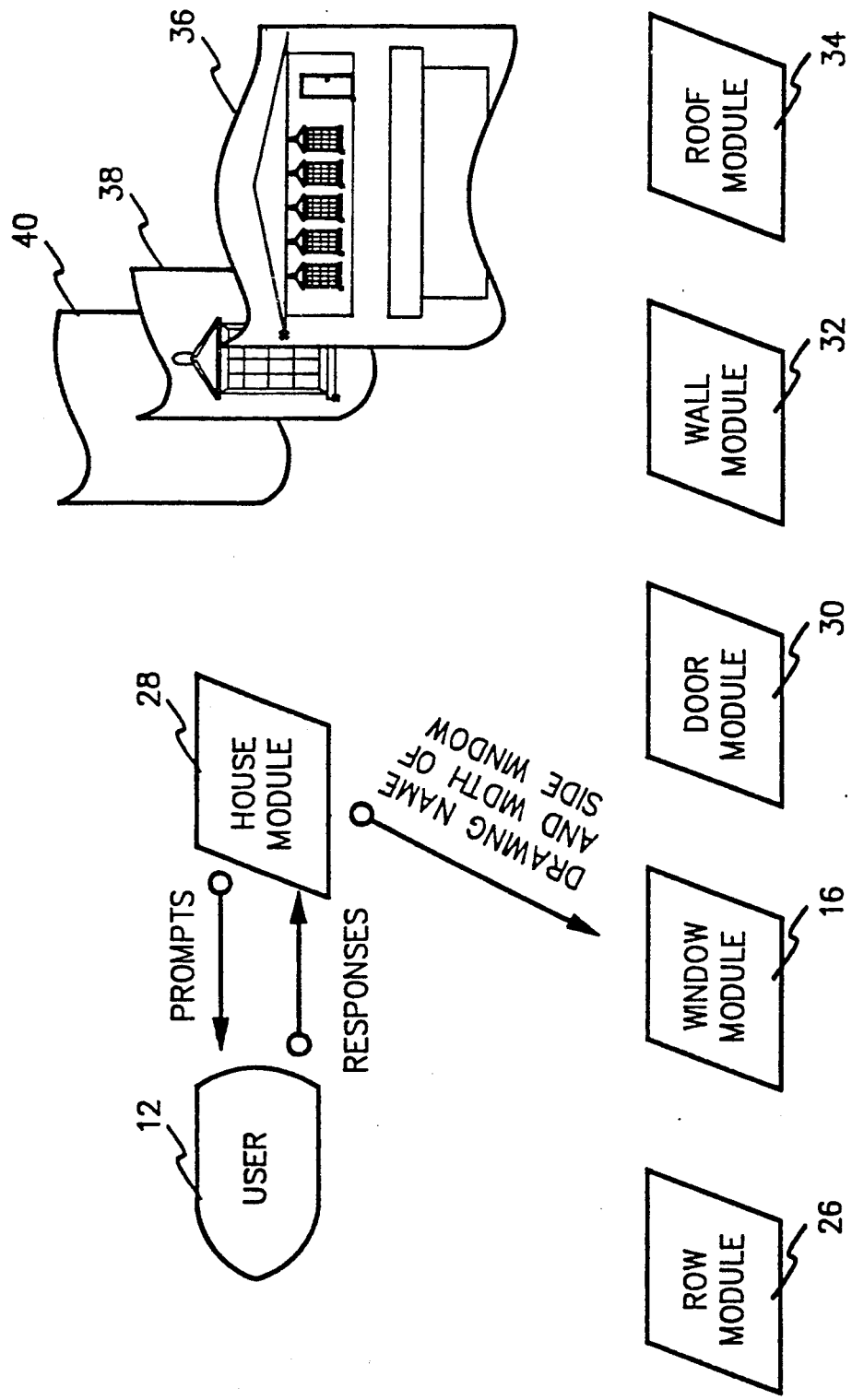
Figure 45:
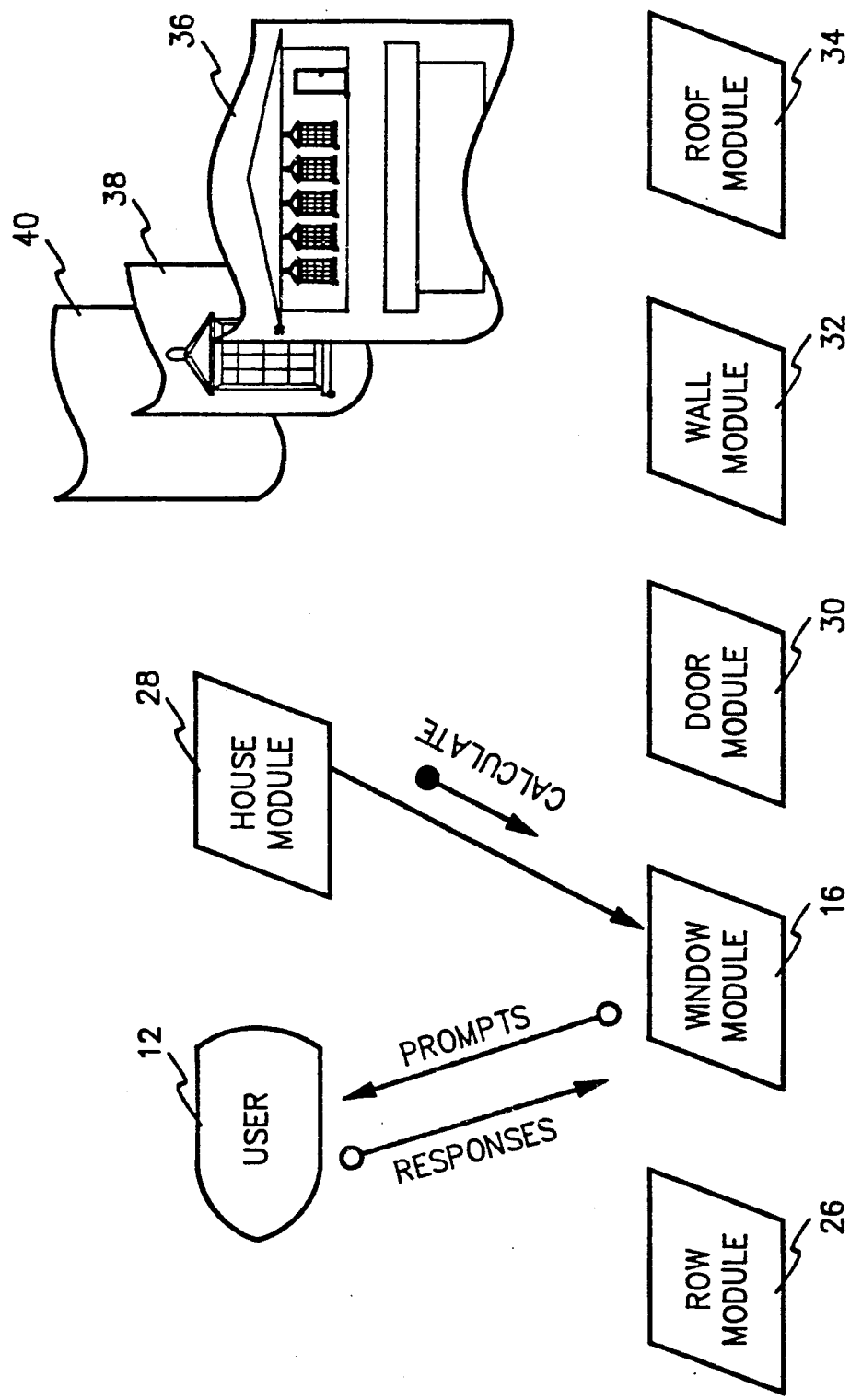
Figure 46:
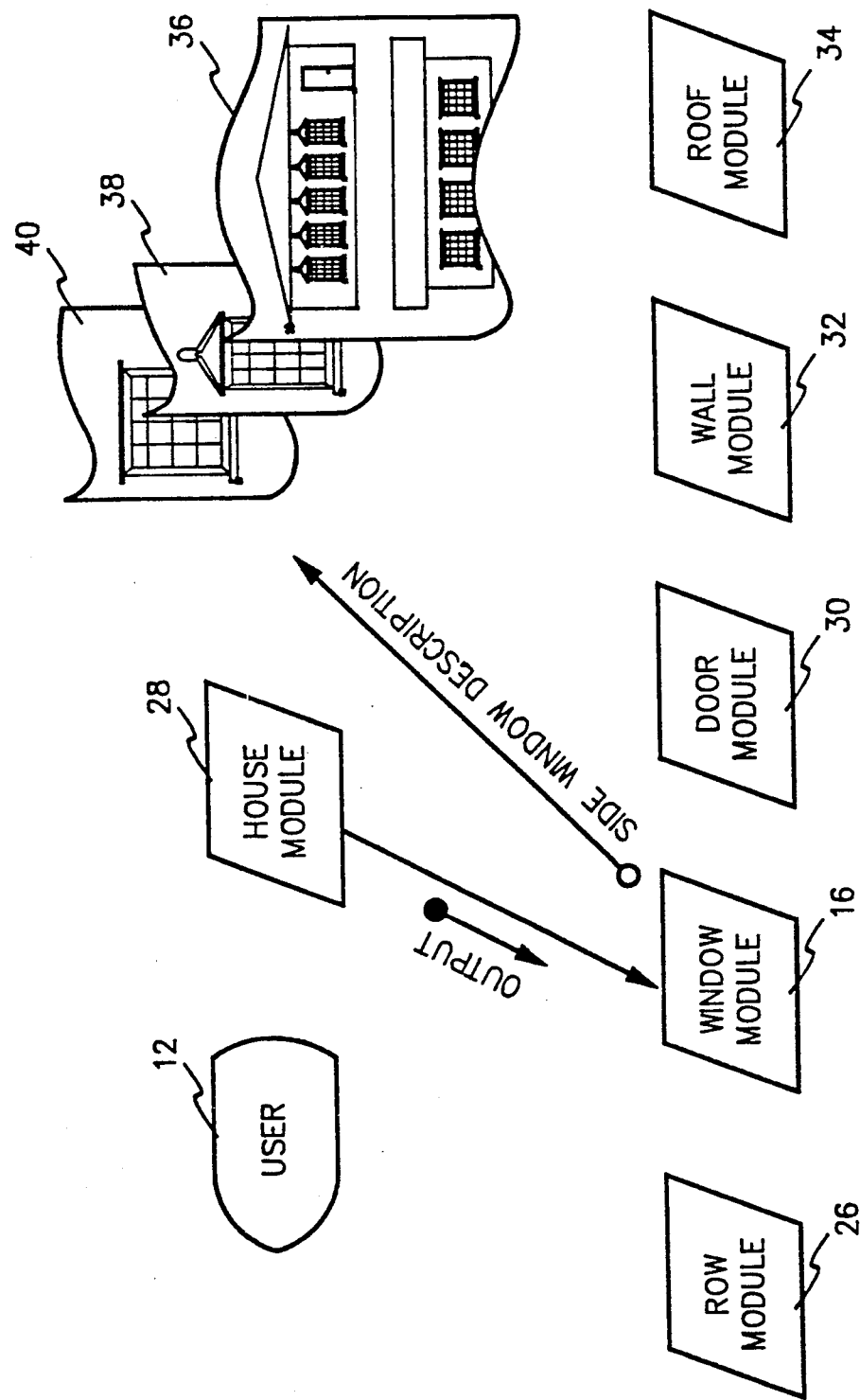
Figure 47:
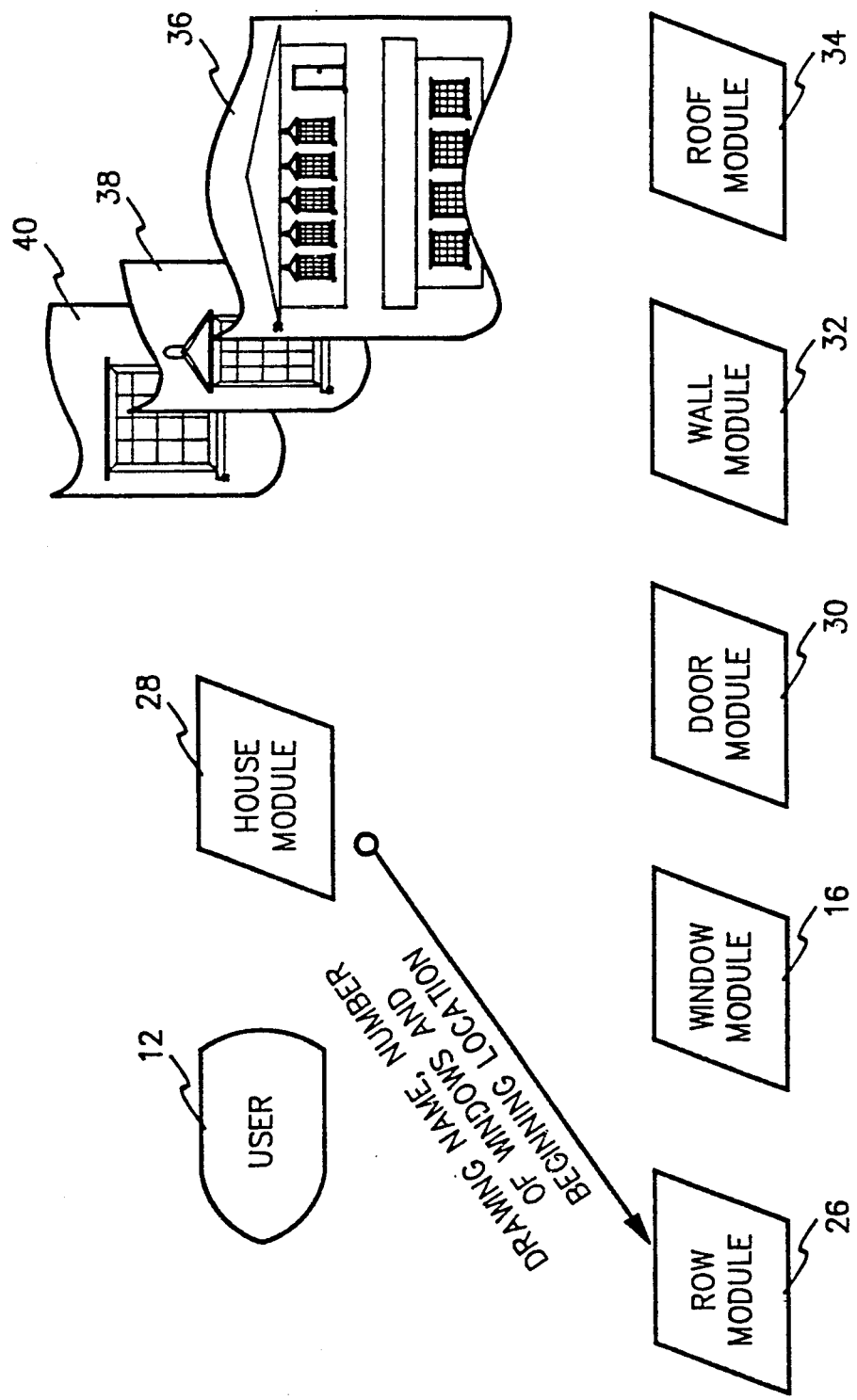
Figure 48:
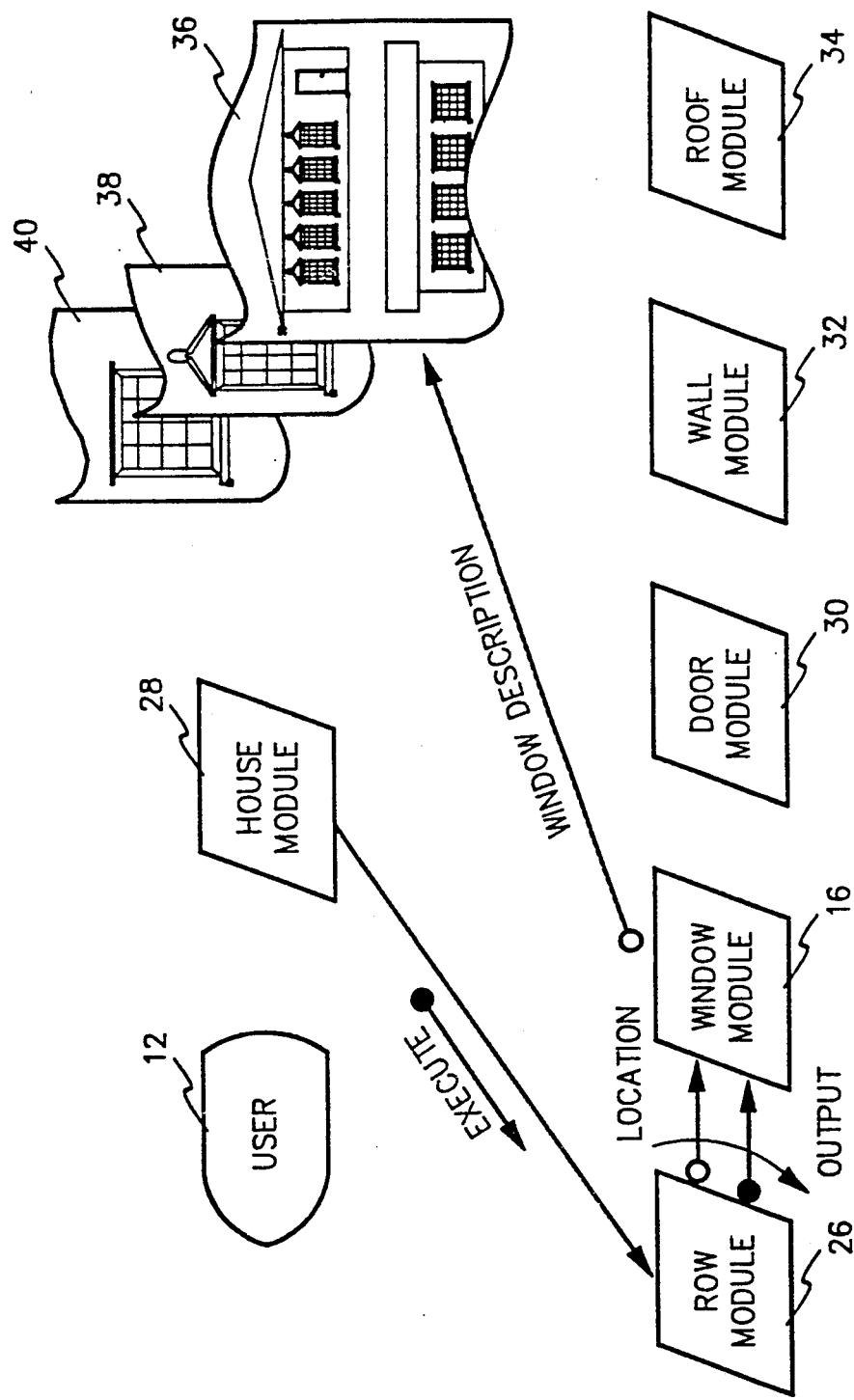
Figure 50:
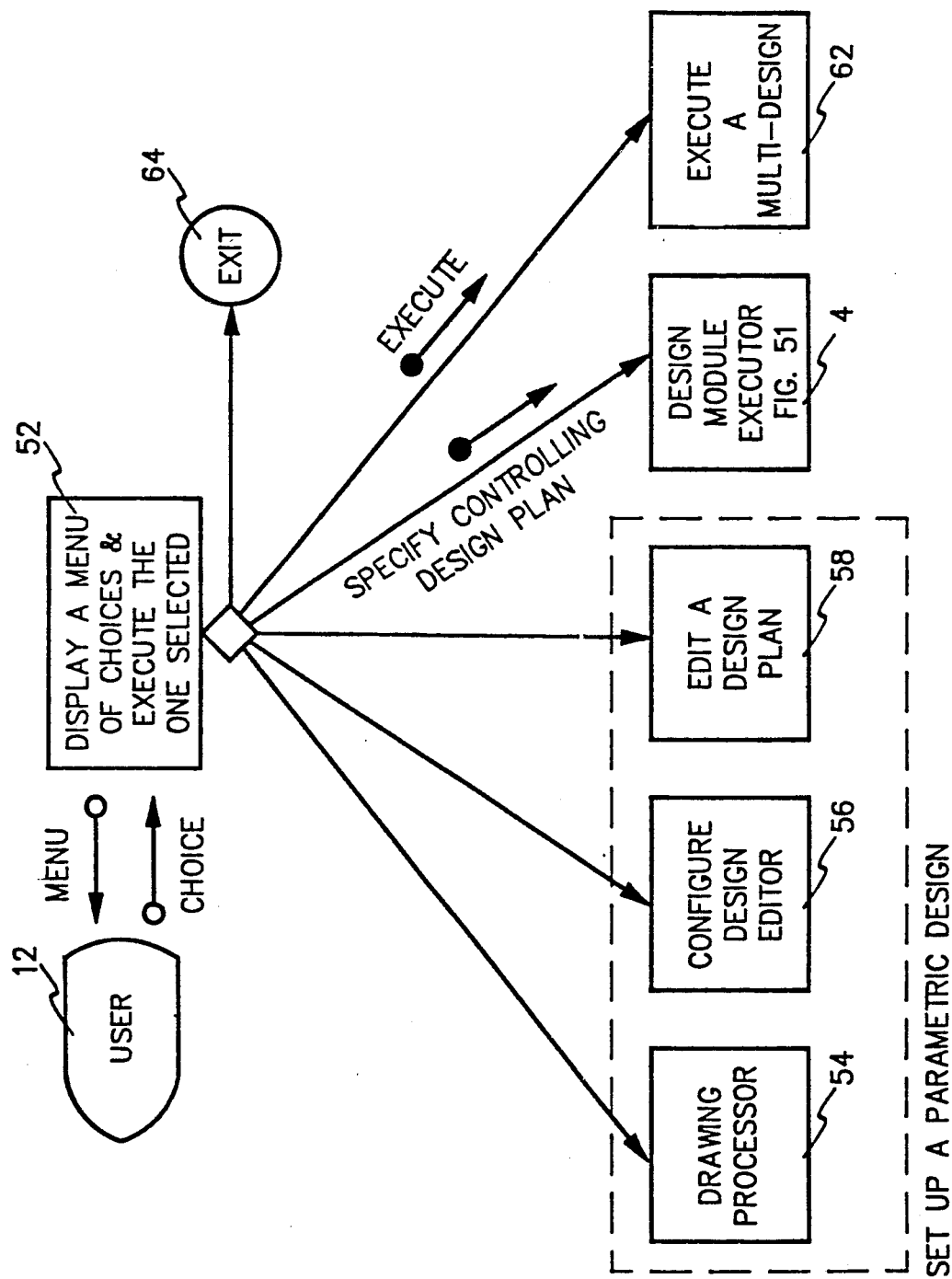
Figure 51:
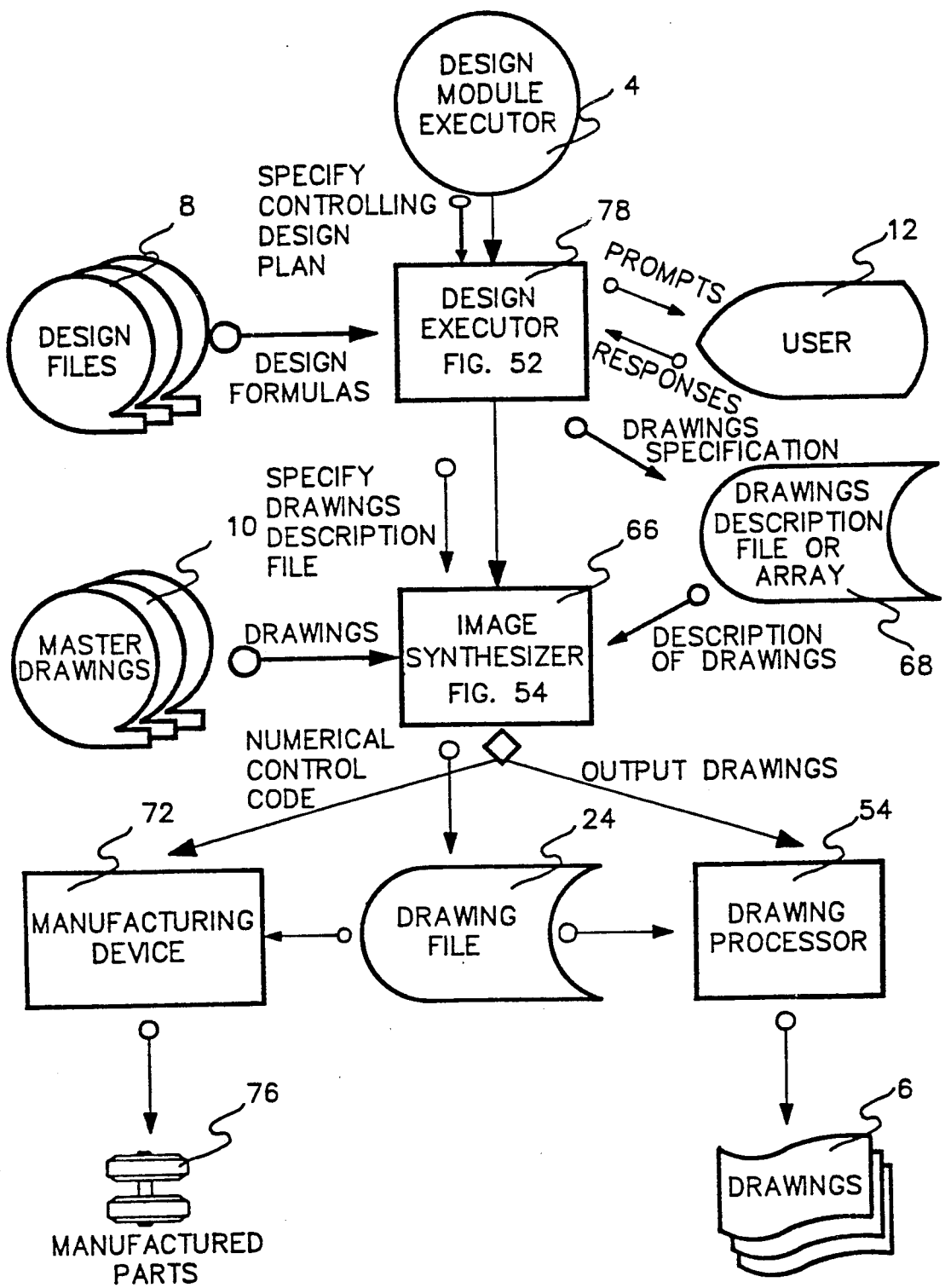
Figure 52:
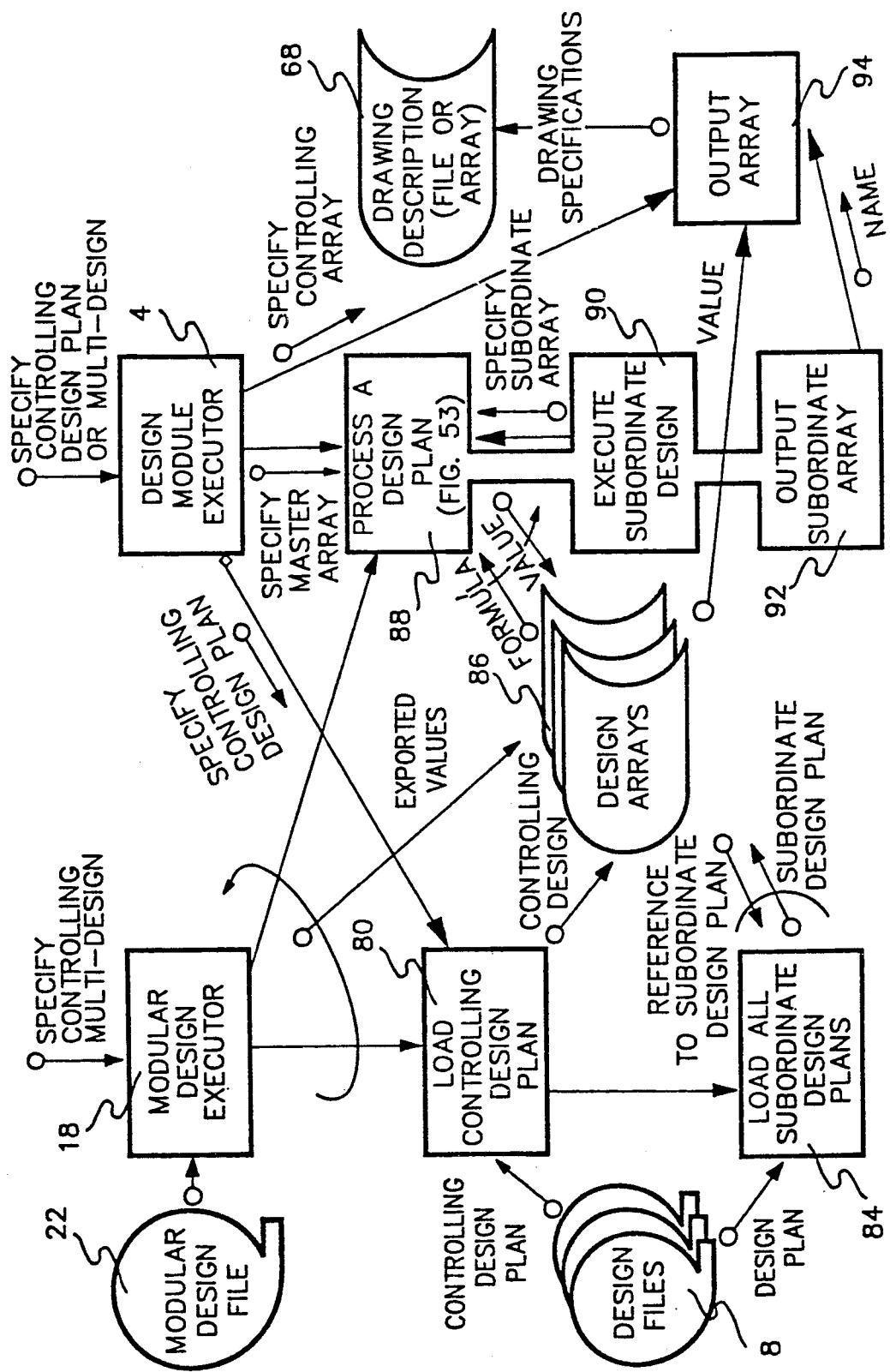
Figure 53:
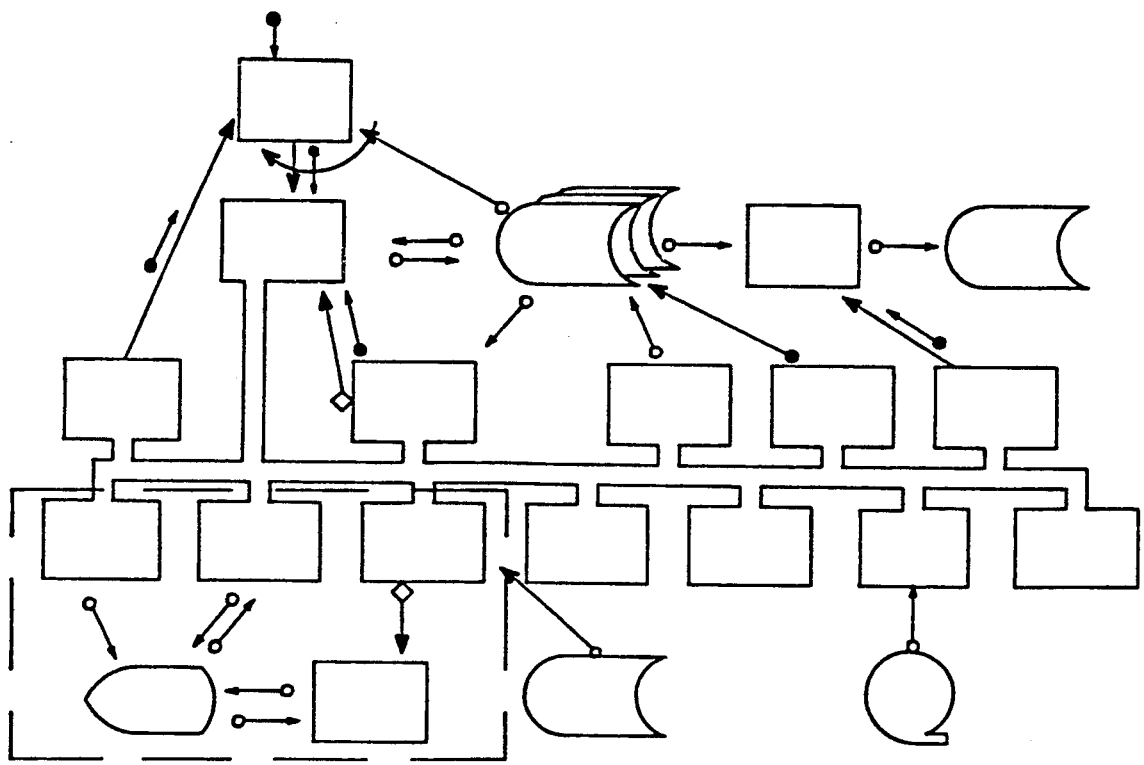
Figure 54:
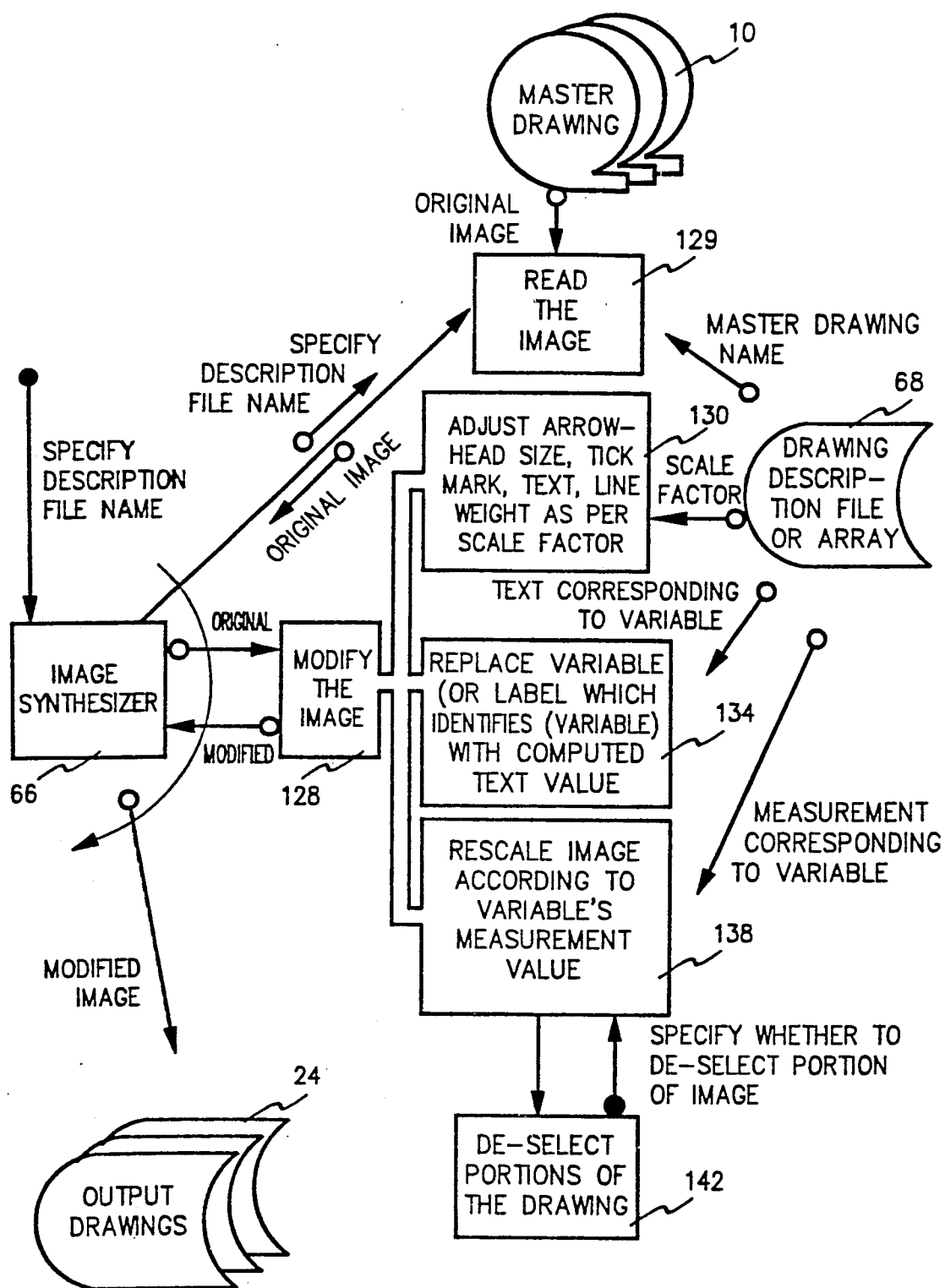
Figure 55:
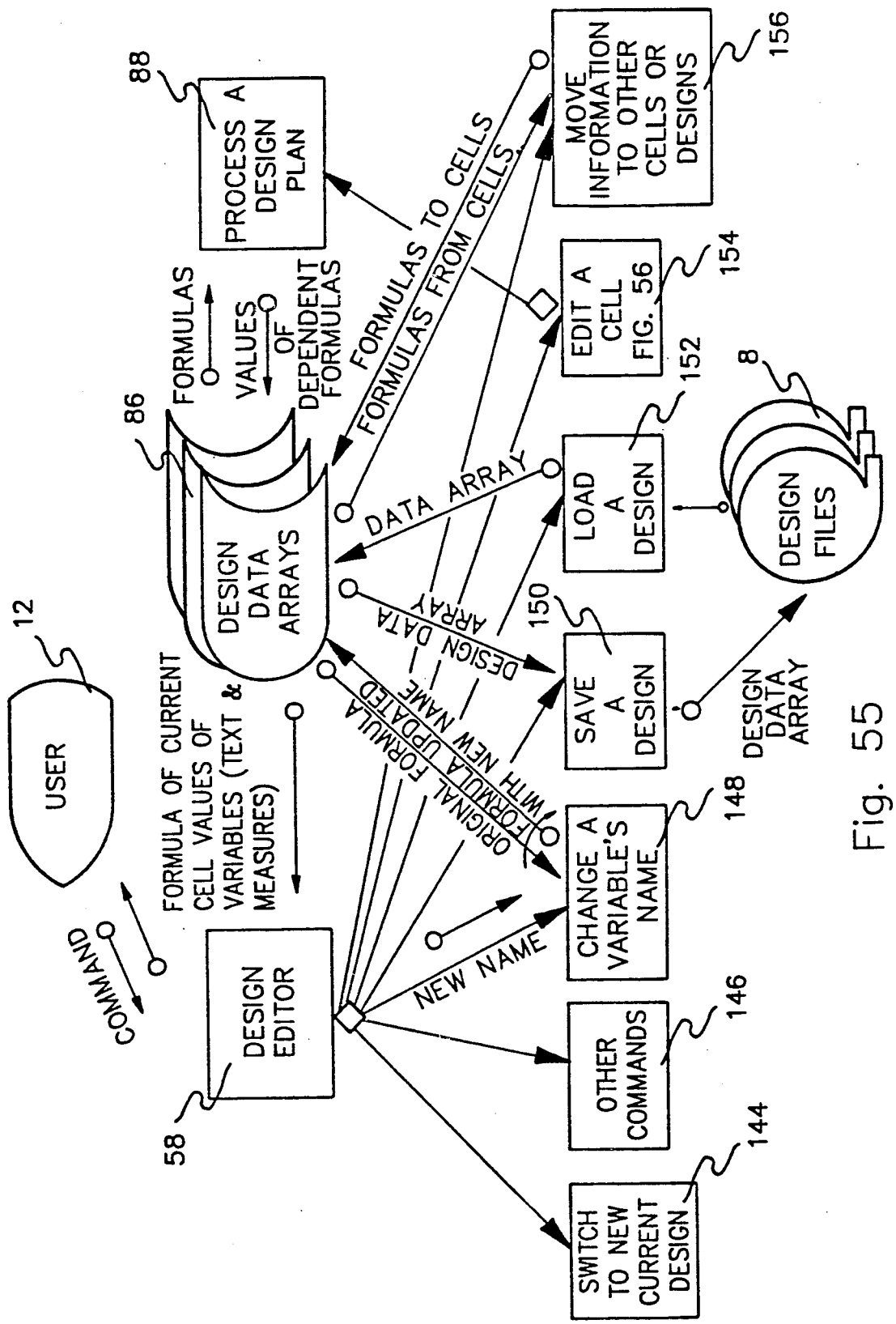
Figure 56:
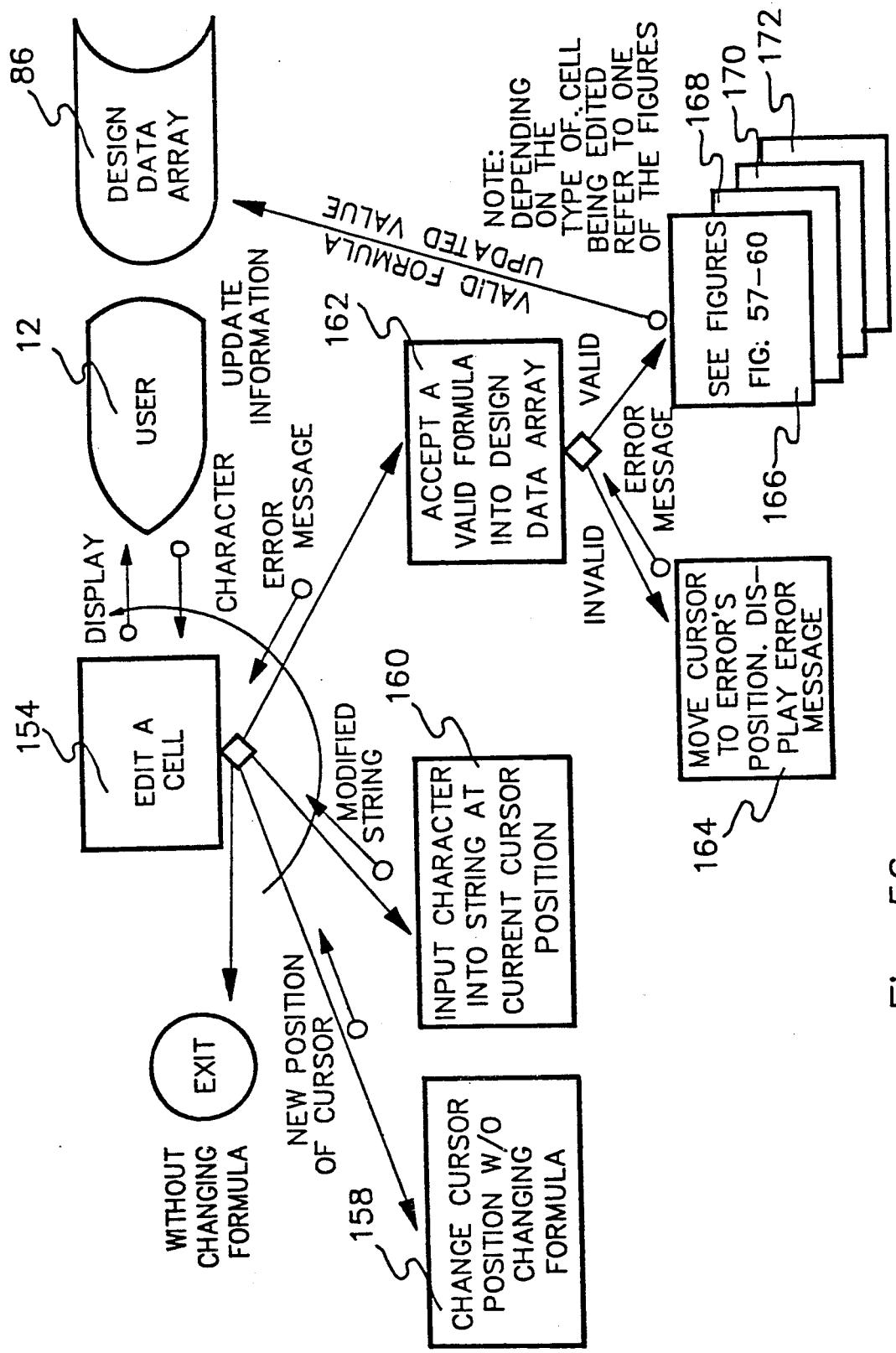
Figure 57:
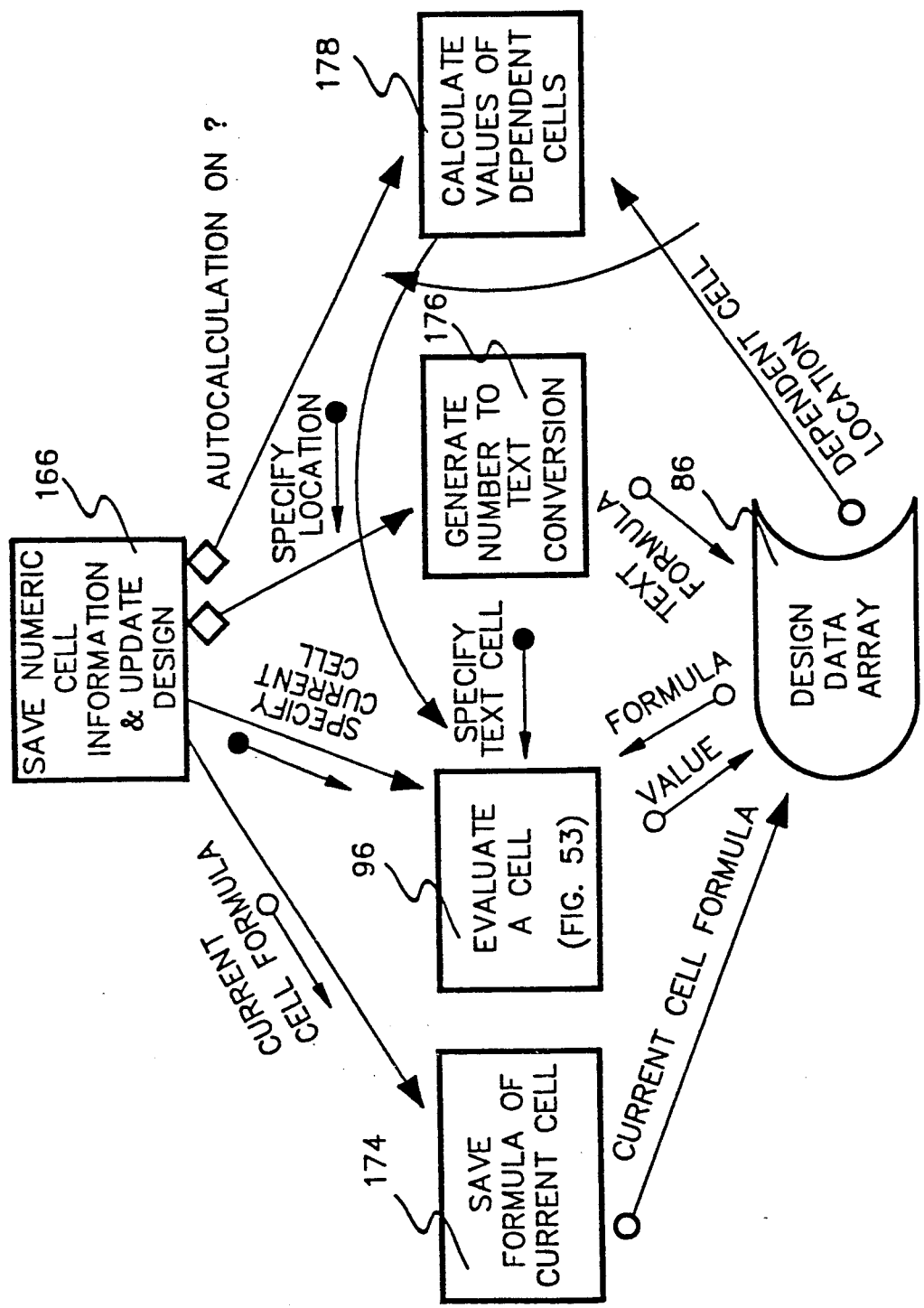
Figure 58:
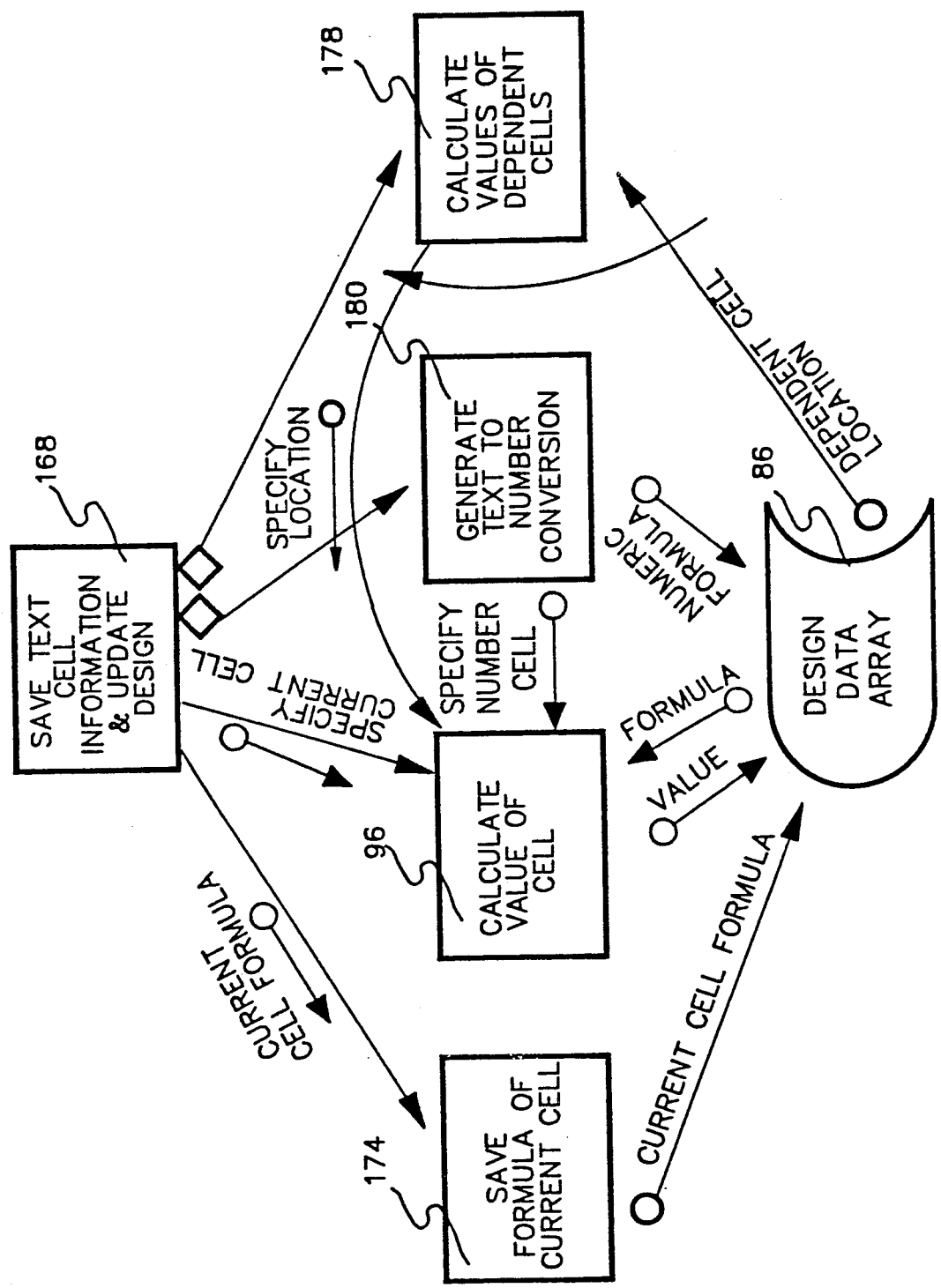
Figure 59:
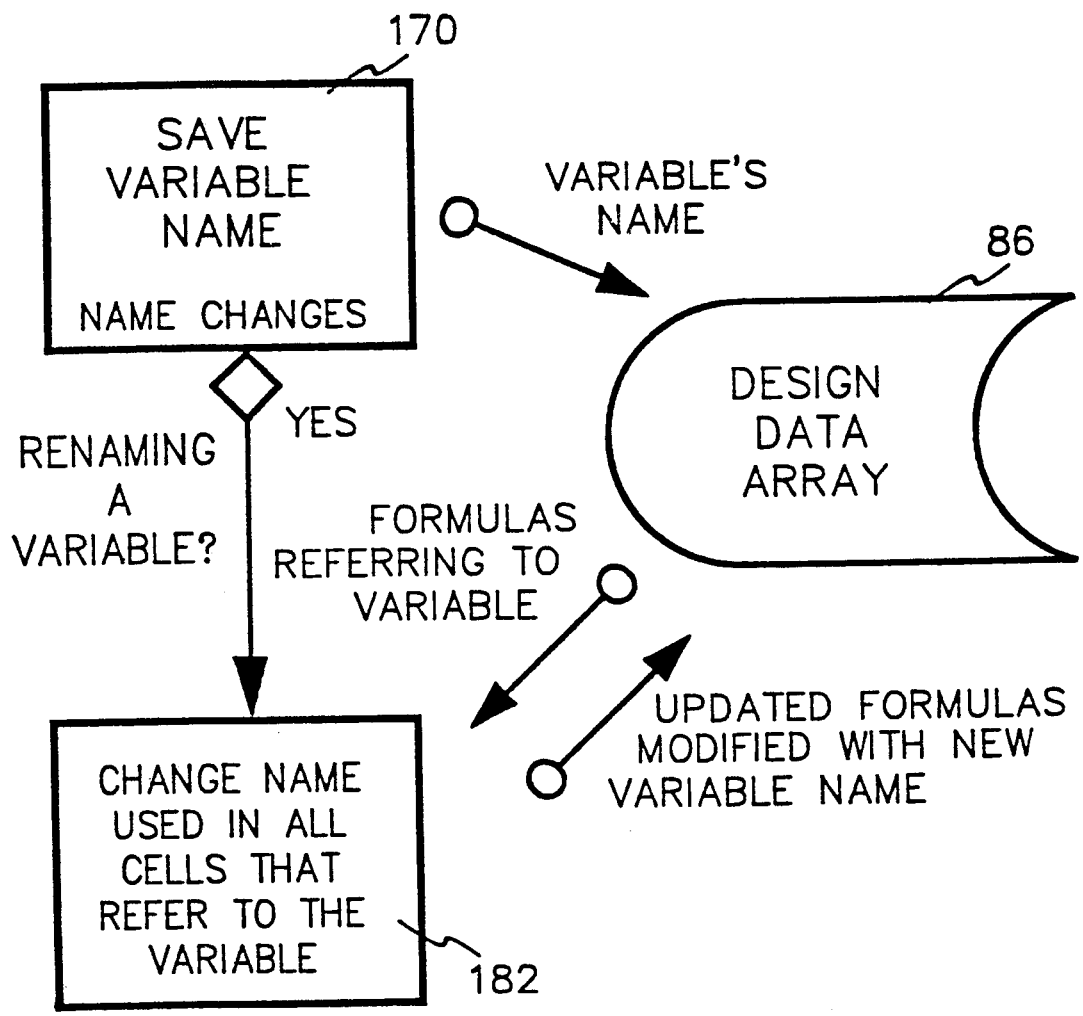
Figure 60:
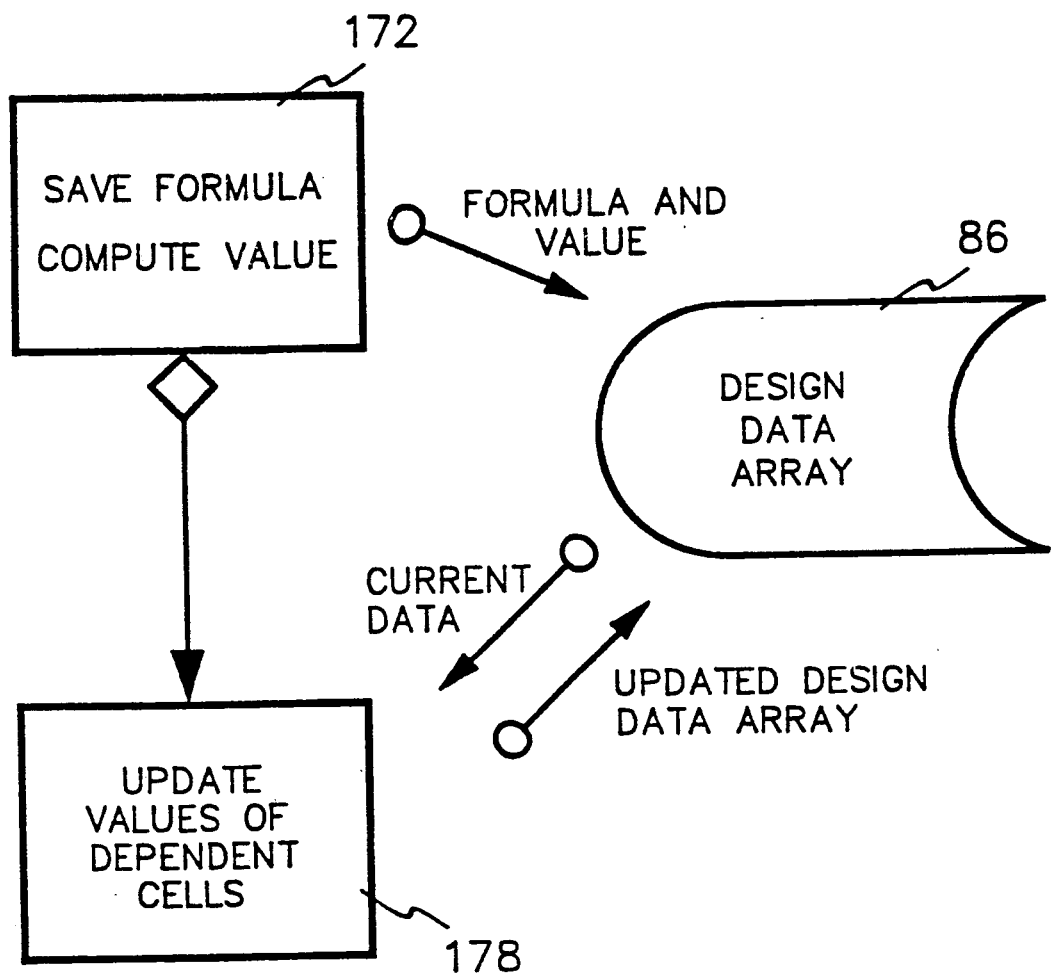
Figure 61:
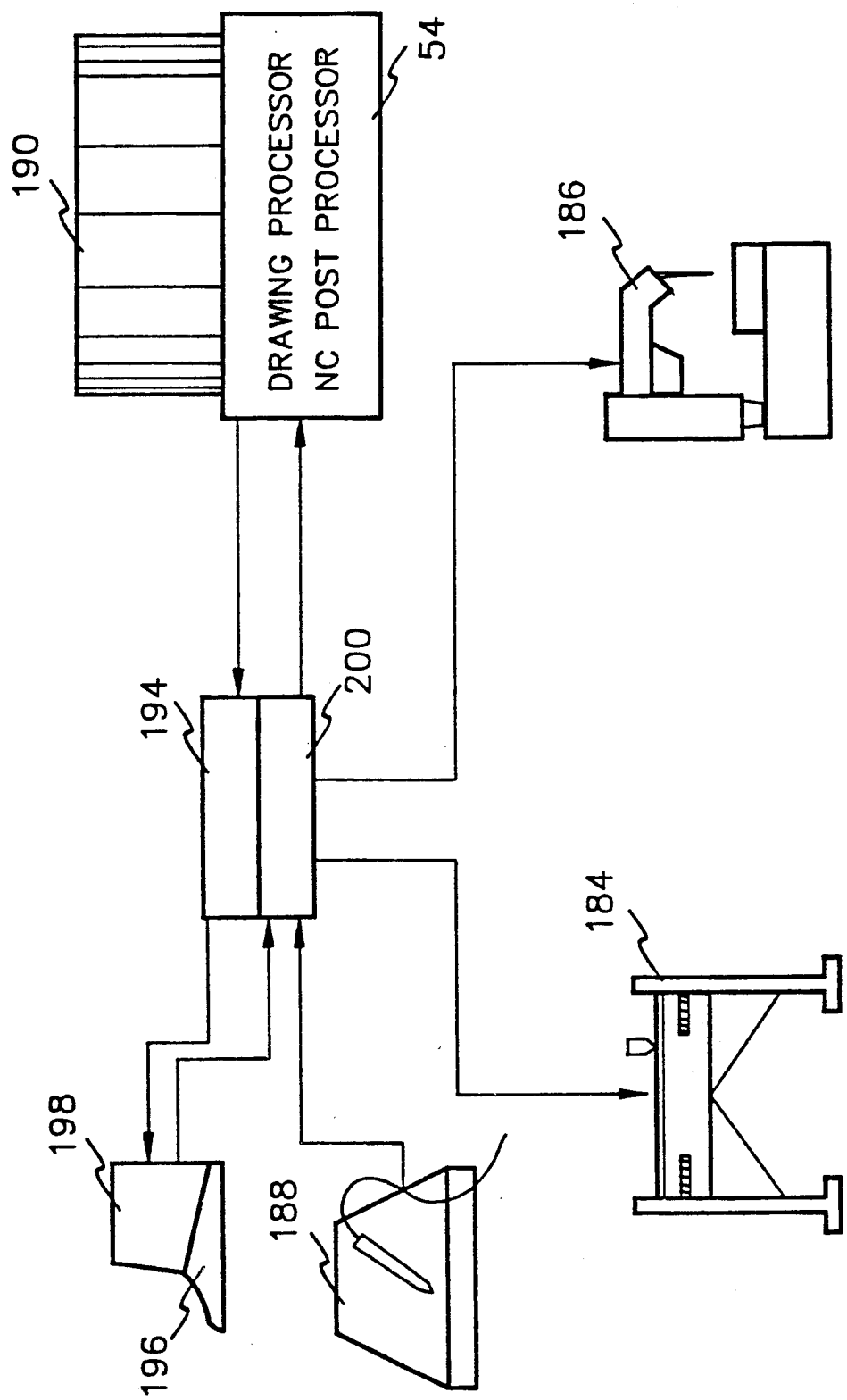

PIG. 18 depicts the on-screen appearance of a DOOR design plan;

FIG. 19 depicts the on-screen appearance of a WALL design plan;

FIG. 20 depicts the on-screen appearance of a ROOF design plan;

FIG. 21 shows the questions generated by the DOOR design plan when it is used as a stand-alone designer;

FIG. 22 shows the questions generated by the WALL design plan when it is used as a stand-alone designer;

FIG. 23 shows the questions generated by the ROOF design plan when it is used as a stand-alone designer;

FIG. 24 is a final drawing created by a user's HOUSE design program in conjunction with the design modules WINDOW, DOOR, WALL, and ROOF;

FIG. 25 depicts the two screens evident to the user when he is running the HOUSE design module in conjunction with its associated design modules, ROW, WINDOW, DOOR, WALL, and ROOF;

FIG. 26 is a detail drawing of the front WINDOW of the HOUSE illustrated in FIG. 24;

FIG. 27 is a detail drawing on the side WINDOW of the HOUSE illustrated in FIG. 24;

FIG. 28 depicts the on-screen appearance of the HOUSE design plan;

FIG. 29 depicts the on-screen appearance of a ROWS design plan which is generic in its capability to supervise other design modules, a capability which can be employed to advantage in generating rows of drawing elements such as windows, columns, kitchen cabinets, etc.;

FIG. 30 illustrates the first step taken by a computer in executing the HOUSE design module in which the user is asked for the overall HOUSE proportions. Also shown are the modules with which the HOUSE module will interact;

FIG. 31 depicts a step in executing the HOUSE design module in which that module exports dimensions to the WALL design module and the ROOF design module;

FIG. 32 depicts a step in executing the HOUSE design module in which that module exports the name of the output drawing file that will hold the composite image of the HOUSE to the WINDOW, DOOR, WALL, ROOF, and ROW design modules;

FIG. 33 depicts a step in the design process in which the HOUSE design module compels the WALL design module to output walls to the composite image;

FIG. 34 depicts a step in the design process in which the HOUSE design module compels the ROOF design module to output a ROOF to the composite image;

FIG. 35 depicts a step in the design process in which the HOUSE design module exports a door's coordinates to the DOOR design module;

FIG. 36 depicts a step in the design process in which the HOUSE design module executes the DOOR design module which then interacts with the user for needed parametric and other information;

FIG. 37 depicts a step in which the HOUSE design module compels the DOOR design module to output a door to the composite image;

FIG. 38 depicts that part of the design process in which the HOUSE design module interacts with the user to determine the width of the front windows and the name of the detail drawing containing their representation and exports this information to the WINDOW design module;

FIG. 39 depicts the step in the design process in which the HOUSE design module compels the WINDOW design module to execute its encoded algorithm; in so doing, the WINDOW design module interacts with the user in order to obtain needed information not previously exported to it by the HOUSE design module;

FIG. 40 depicts a step in the design process in which the HOUSE design module compels the WINDOW design module to output a drawing of the front window;

FIG. 41 depicts a step of the process in which the HOUSE design module exports to the ROWS design module the information needed to generate a row of windows such as beginning location, number of elements, and element width;

FIG. 42 depicts a step of the process in which the HOUSE design module compels the ROWS design module to repeatedly interact with the WINDOW design module, and, in so doing so, to export to it the window's coordinates and to then compel the WINDOW design module to output an image to the composite drawing;

FIG. 43 depicts a step in the parametric design process in which the HOUSE design module clears the WINDOW design module, i.e. enables all of its formulas to recalculate, including the ones in cells which contain exported values;

FIG. 44 depicts that part of the design process in which the HOUSE design module interacts with the user to determine the width of the side window and the name of the detail drawing containing the side window representation and exports this information to the WINDOW design module;

FIG. 45 depicts a step in the design process in which the HOUSE design module compels the WINDOW design module to execute its encoded algorithm; in so doing, the WINDOW design module interacts with the user in order to obtain needed information not previously exported to it by the HOUSE design module;

FIG. 46 depicts a step in the design process in which the HOUSE design module compels the WINDOW design module to output a drawing of the side window;

FIG. 47 depicts a step of the process in which the HOUSE design module exports to the ROWS design module the information needed to generate a row of windows such as beginning location, number of elements, and element width;

FIG. 48 depicts a step of the process in which the HOUSE design module compels the ROWS design module to repeatedly interact with the WINDOW design module, and in so doing to export to it the window's coordinates and to then compel the WINDOW design module to output an image to the composite drawing;

FIG. 49 is a design of a temple and is included as an illustration of the endless designs that can be generated by using a single HOUSE design module to control the parametric design process;

FIG. 50 is a block diagram showing the configuration of capabilities provided in setting up and executing a parametric design;

FIG. 51 is a block diagram showing the operations involved in executing a parametric design and synthesizing the created by executing that design;

FIG. 52 is a block diagram showing the operations involved in executing a parametric design in greater detail than those operations are shown in FIG. 51; it shows the execution of a design plan;

FIG. 53 is a schematic composite of FIGS. 53A and 53 together constitute a block diagram which shows the configuration of capabilities possessed by our novel process and employed in processing a design plan;

FIG. 53C shows, in block form, the relationship between FIGS. 53A and 53B;

FIG. 54 is a block diagram showing the operations involved in synthesizing an image involving design specifications and a master drawing;

FIG. 55 is a block diagram showing the process of editing a design plan;

FIG. 56 is a block diagram detailing the process of editing a cell in a design plan;

FIG. 57 is a block diagram detailing the editing of a number cell and is an expansion of the diagram in FIG. 56;

FIG. 58 is a block diagram detailing the editing of a text cell and is an expansion of the diagram in FIG. 56;

FIG. 59 is a block diagram detailing the editing of a name cell and is an expansion of the editing process illustrated in FIG. 56;

FIG. 60 is a block diagram detailing the editing of the cell which specifies either the master drawing's name, its coordinates of insertion, the scale factor to which its image is to be adjusted, or the angle to which it is to be rotated upon insertion. (This is an expansion of the editing process illustrated in FIG. 56); and FIG. 61 is a block diagram of a system for carrying out our novel method of generating parametric designs.

DETAILED DESCRIPTION OF THE INVENTION

The hardware and software employed to practice the present invention may include any one of several types of commercially available main-frame computers, minicomputers or microcomputers with various operating systems.

In one implementation (see FIG. 61), we use a PC-AT 30 with the usual keyboard 32 and PC-DOS, an AUTOCAD® drawing processor shown in a block 34 and stored as usual on a hard disc 36, a digitizing table 38, a graphics plotter 40, a video monitor 42, a conversion program for translating drawing images into numerical control code such as AUTOCAD's NC Programmer ™ (see block 34) and also stored on hard disc 36, a numerical milling machine 44 capalbe of accepting NC code, and 640K of RAM with two megabytes of extended memory (the memory components are collectively identified by reference character 46). Other suitable types of input-output devices can instead be used.

The generation of parametric designs by the novel parametric design process described hereinbelow also involves the use of a proprietary computer program titled SYNTHESIS™. The image synthesizer is described below with reference to FIG. 54.

SETTING UP A PARAMETRIC DESIGN

FIG. 50 comprises a pictorial overview of the menu selections of the invention, showing the options for both setting up and executing a parametric design. The menu display 52 provides the user 12 with a set of choices with which to set up a parametric design 54, 56 or 58; execute a parametric design 60; or execute a multi-design 62.

In setting up a parametric design, the drawing processor 54 is used to create a master drawing from which other drawings can be created under the control of a design plan module. The master drawing is a template drawing in which those dimensions that vary according to the design are given a label instead of a fixed value. Text that varies according to the design is also given a label. The preferred method is to use the AUTOCAD® program as a drawing processor, in conjunction with a plotter, codigitizing tablet, and NC Programmer™ to generate numerical code capable of driving a numerically controlled milling machine and a tablet menu overlay; however, other drawing processors and equipment configurations can be used instead.

The drawing processor 54 allows the user to view the drawing on a video monitor, to edit the drawing, to plot a drawing onto paper, and to store the drawing electronically. Configuring the design editor 56 allows the user to establish a default formula for automatic conversion between the text and measurement cells that describes each design variable (a default formula is one which automatically effects a specified conversions or other calculation unless it is overridden). This formula is automatically placed in a variable's empty text cell upon editing its corresponding measurement cell (and vice-versa), as will be explained later.

The parametric design plan is a description of the formulas and procedures to be used in carrying out a parametric design. It is edited with the parametric design editor 58. When edited, a design plan is displayed as an array of cells. The parametric design executor 60 (more fully explained below with reference to FIG. 51) executes the algorithm embodied in the design plan. In so doing it might present the user with a series of explanations and prompts. Based on his responses a design is completed.

EXAMPLES OF THREE MODES OF PARAMETRIC DESIGN

There are several modes of user interaction which can be employed when executing design plans. Now will be described three possible specific examples of the modular parametric design process, which will illustrate:

1. Rectification, which underlies our approach to parametric design;
2. Executing a single parametric design module: a WINDOW;
3. The use of a computer program in directing a group of modules to execute a HOUSE design; and
4. A hierarchy of modules interacting to execute a HOUSE design.

The examples chosen are not intended as illustrations in the limiting sense, but as examples of the capabilities of the invention.

Rectification is not unique to SYNTHESIS™. However, SYNTHESIS™ provides additional rectification capabilities not possessed by other products. Only these capabilities are discussed in detail herein. They include:

1. SYNTHESIS™ distinguishes between two types of entities, "fixed" and "proportioned," and rectifies them differently; and
2. SYNTHESIS™ provides a unique means of eliminating unwanted parts of a drawing.

Other essential SYNTHESIS™ capabilities include rectifying according to non-linear dimensions such as radial or angular dimensions.

To understand what is meant by "fixed" and "proportioned" entities, it is essential to define the terms, "entity" and entity "control points". Drawing entities are the primitive elements from which a drawings are built: lines, arcs, etc. They are summarized in FIG. 1. Each type of entity has reference points. For example, the endpoints of a line are its two reference points, as is the center point of a circle. To relocate an entity, its reference points are first relocated; and then the entity is relocated; accordingly. The positions of the reference points are also indicated in FIG. 1.

When rectifying a drawing, there are two ways in which entities can move: either proportionally or fixed with respect to the controlling dimension. Proportioned entities move such that the distance between their reference points expands or decreases in proportion to the change in the controlling dimensions. In contrast, with fixed entities the reference points remain a constant distance from the nearest extension line.

It is important to understand the working difference between these two types of entities. The "BEAM" example (FIGS. 2 and 3) illustrates the difference between proportioned and fixed entities and shows how SYNTHESIS™ supports both in a drawing. The example shows two beams, each with a row of holes in it. In the upper beam, the holes are proportioned entities; and in the lower they are fixed entities. As the lengths of the beams change, the proportioned holes maintain their proportional relationship to each other as well as to the other extension lines, while the fixed holes maintain the same distance from adjacent dimension extension lines.

As the user draws, each time he places an entity in the drawing, he has the choice of making it fixed or proportioned. As a result, the actual parts of the drawing do not have to be exactly dimensioned, as can be seen with the beam. Yet, the user still controls the outcome upon rectification, through use of fixed and proportioned entities.

SYNTHESIS™ has a second unique rectification capability, which enables it to automatically eliminate unwanted parts of a drawing. By editing the dimension text to a value of zero, the user can eliminate the affected portion of the drawing. This can be seen in FIGS. 4 and 5. In the pre-rectified picture, FIG. 4, one of the dimension has been edited to "0.0". In the view subsequent(to rectification, FIG. 5, the affected part has vanished.

The user controls elimination of drawing parts according to the entity elimination rules, which are also unique to SYNTHESIS ™ These are:

(1) Each reference point is controlled horizontally by the closest extension line of a horizontal dimension or the extension line of the selection set in which it belongs. It is similarly affected vertically by the extension line of the corresponding vertical dimension.

(2) A dimension's extension line can be thought of as extending past its apparent end. Its actual extent is user-definable. This can be seen in FIGS. 4 and 5. All parts of the triangle are affected by the second (from-the-left) extension line.

Figure 2:
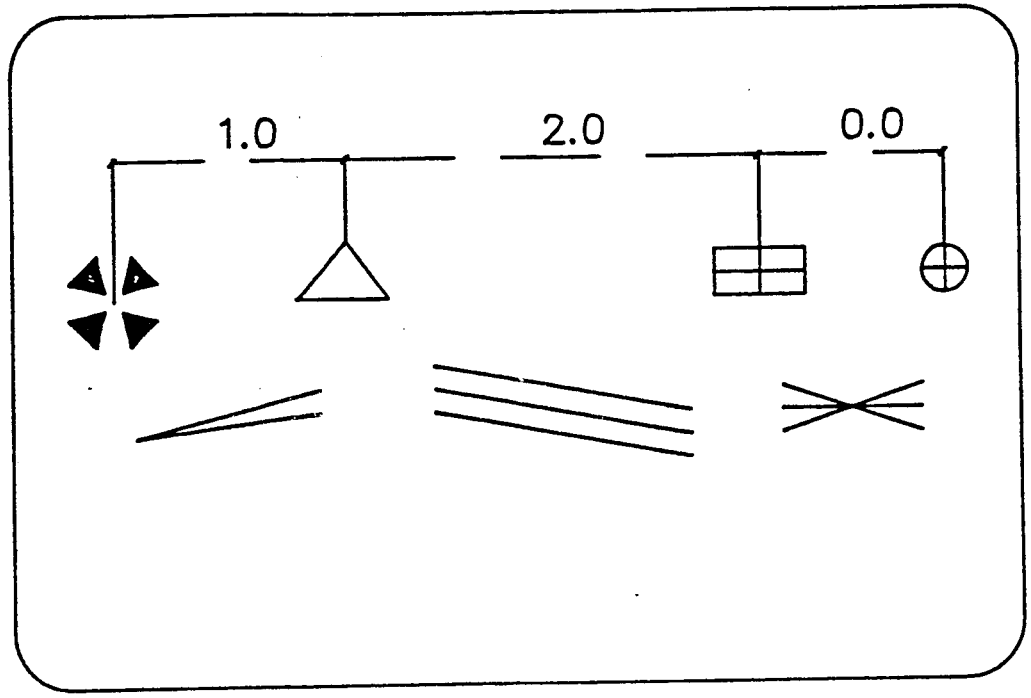
FIGS. 2 and 3 display entity rectification as controlled by fixed and proportioned entities.
Figure 3:
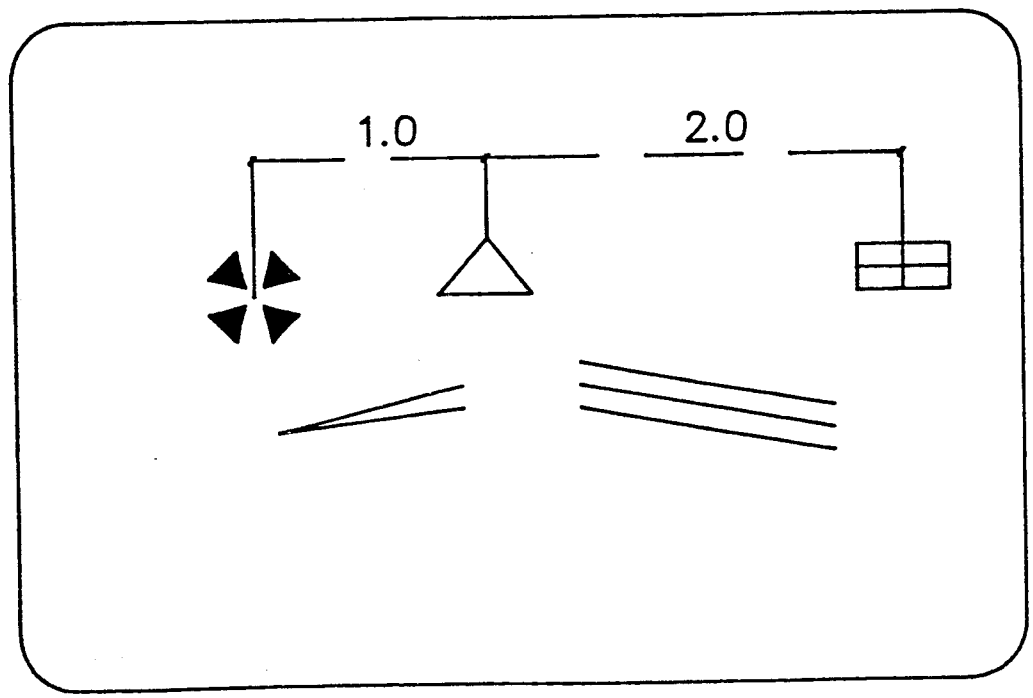

(3) A string of related horizontal dimensions has a user-definable "beginning point." Similarly, there is a user-definable beginning point for strings of vertical dimensions. In FIG. 2 the X-shaped symbol is used to mark the dimension string's beginning.

(4) Those entities with one reference point can be eliminated by assigning their controlling dimension (either horizontal or vertical) a value of zero when the entity is on the end of the dimension farthest from the "beginning point" (along the dimension string).

Figure 4:
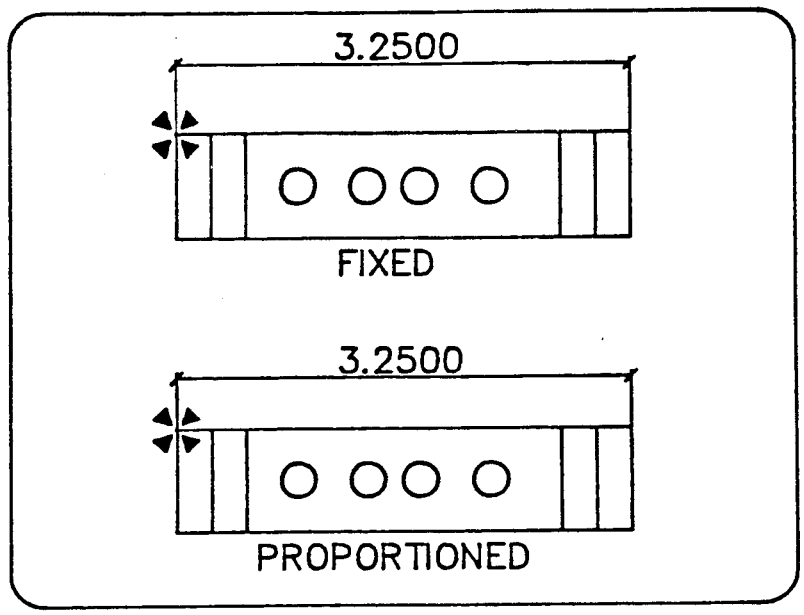
FIGS. 4 and 5 are views similar to FIGS. 2 and 3 but illustrating the importance of reference point location in rectifying drawings.
Figure 5:
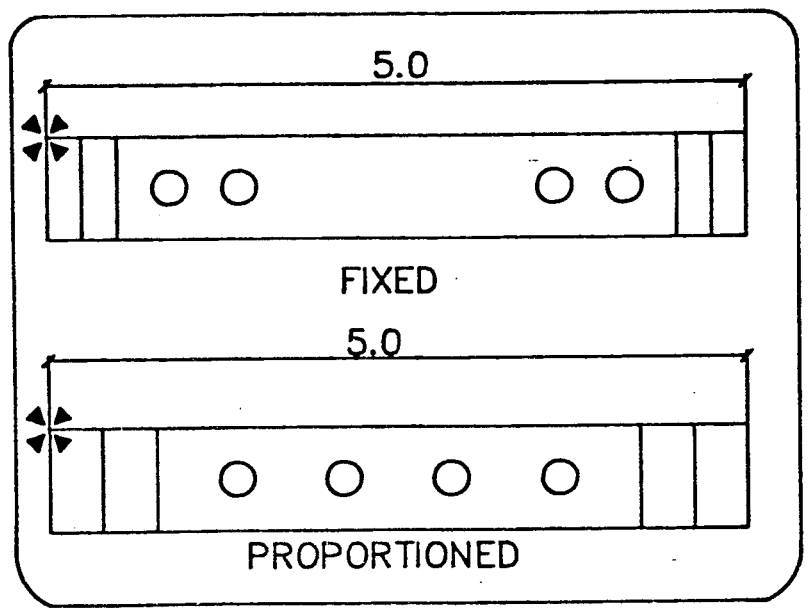

(5) Those entities with more than one control point are eliminated if their controlling dimension has a value of zero for either of the following reasons: all of an entity's reference points are on the end of the dimension farthest from the "beginning point" (as is the case with the entities forming the triangle in FIG. 4); or an entity's reference points are controlled by the extension lines on the opposite ends of the same dimension (as is the case with each of the three intersecting lines in FIG. 4).

Figure 7:
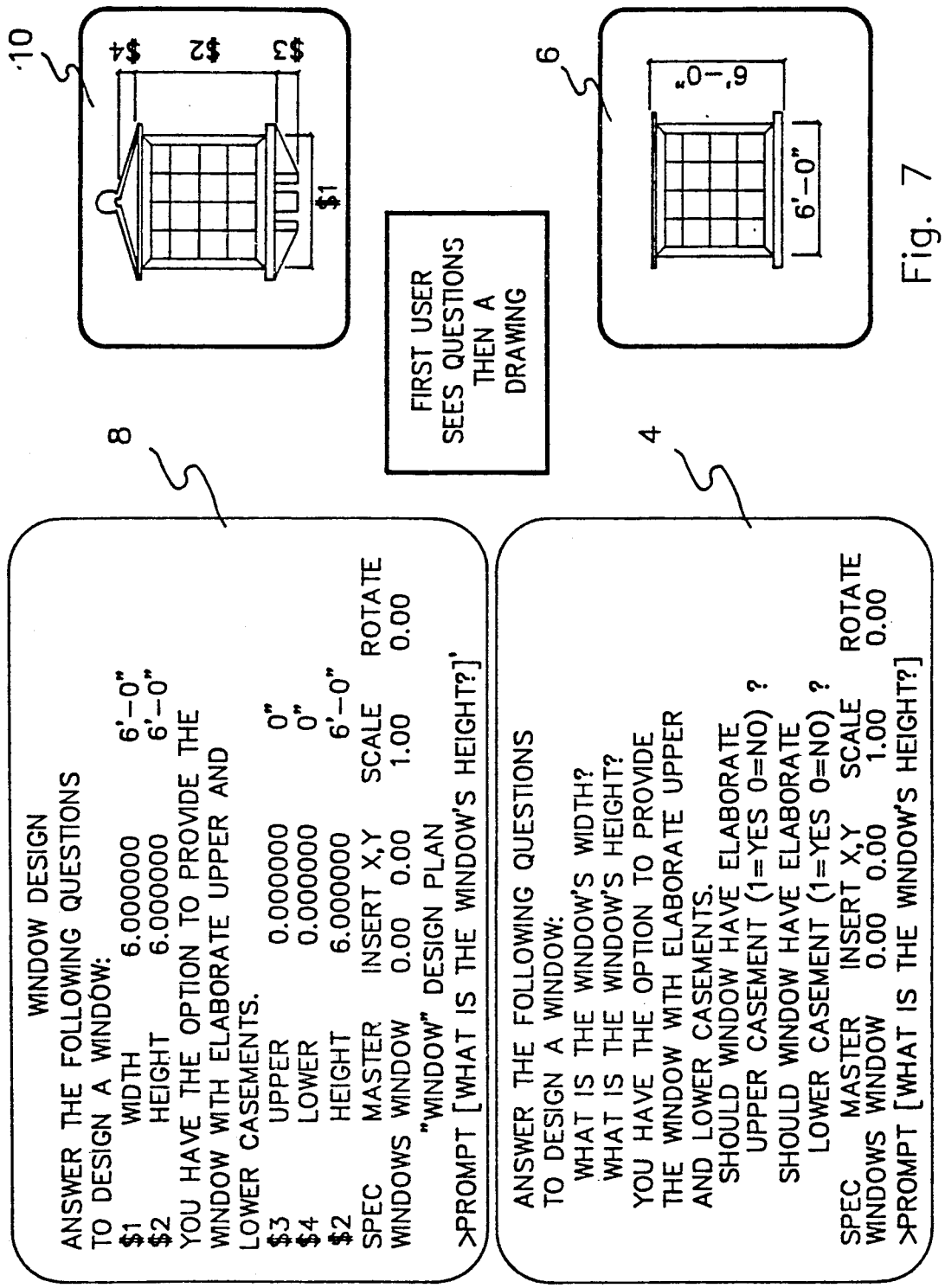
FIG. 7 displays the components of a window module; a design plan and a master drawing and the two screens visible to the user—prompts and final drawing.
Figure 8:
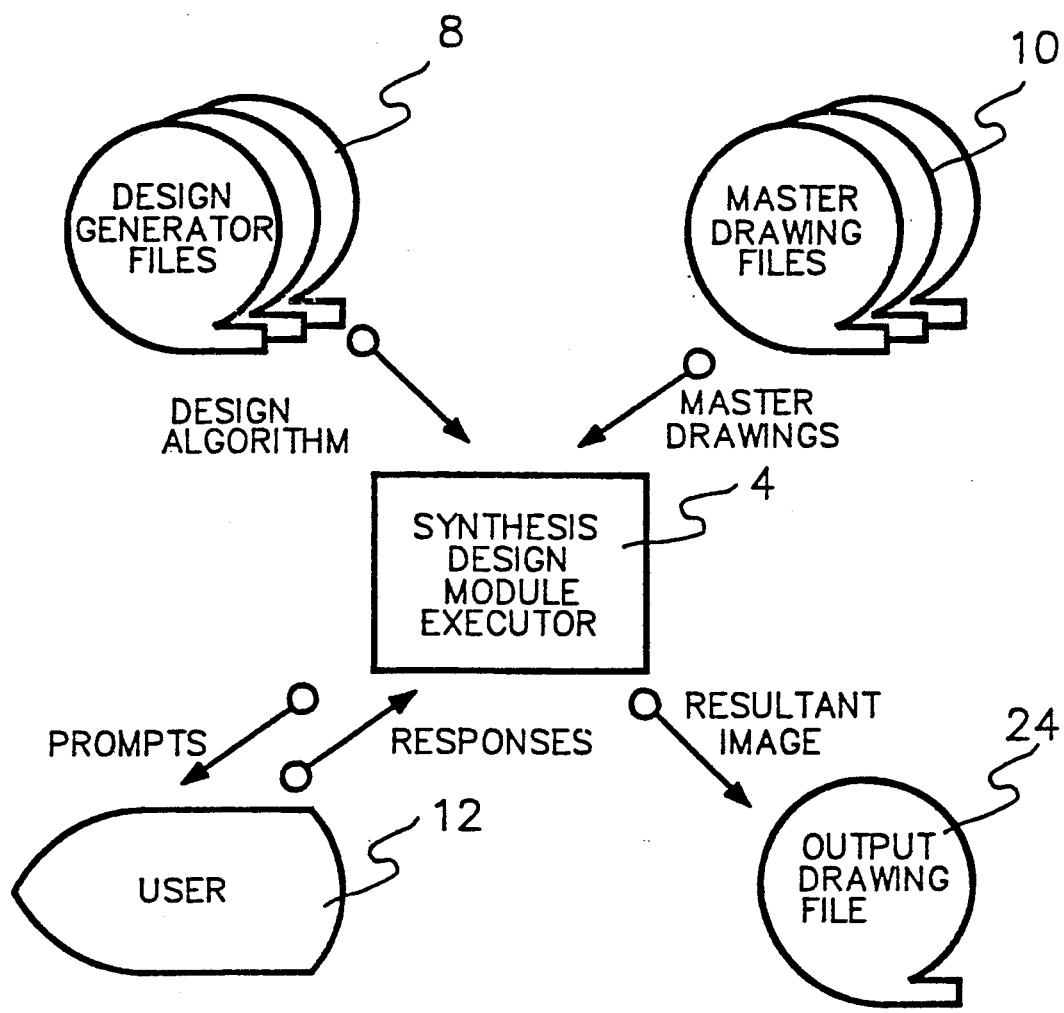
FIG. 8 describes data flow in the situation where a module is used as a stand-alone designer.
Figure 10:
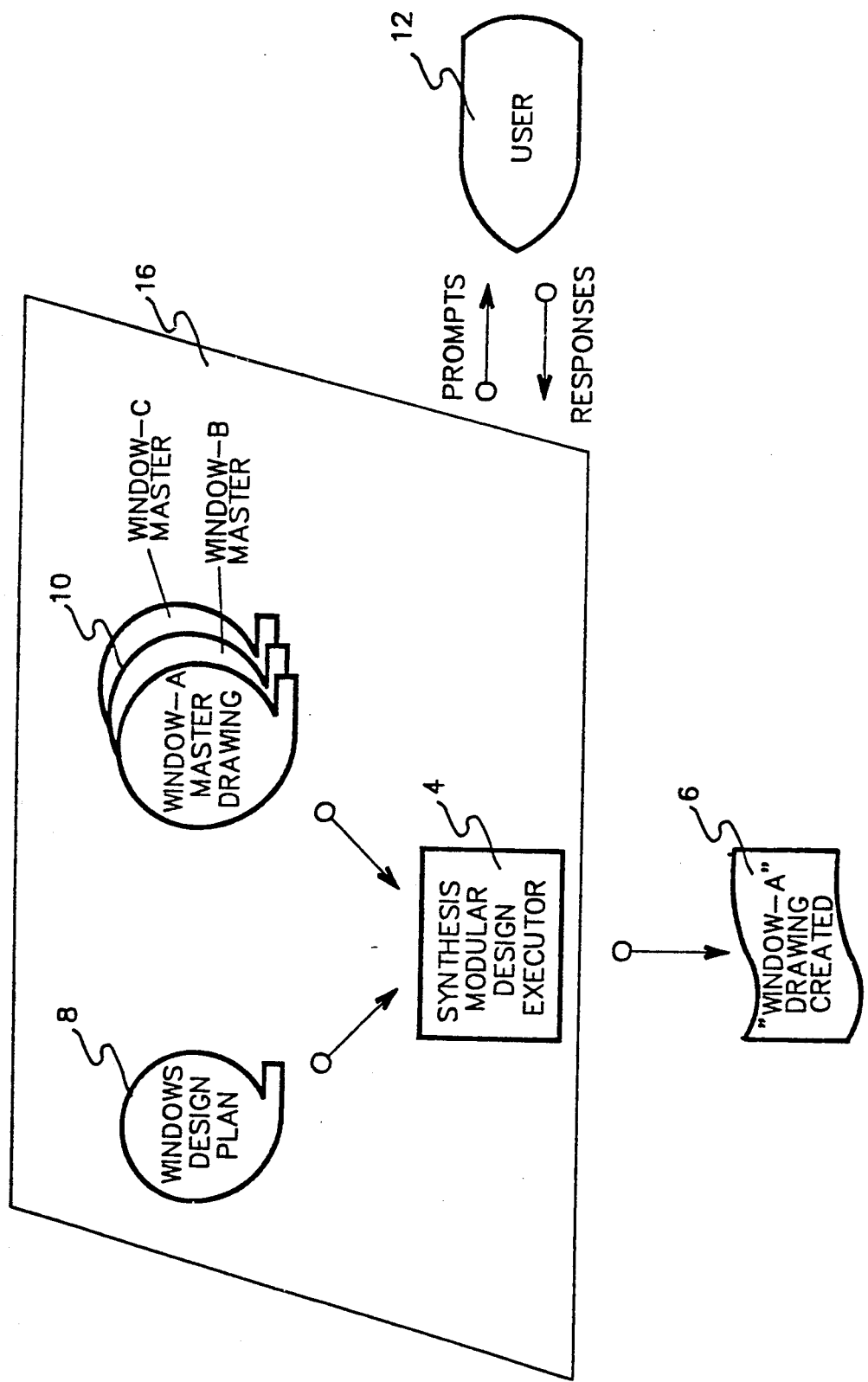
FIG. 10 depicts the three components of the WINDOW design module; the WINDOW design plan, the WINDOW master drawing, and the execution capabilities of a modular design executor employed in our novel design process and entitled SYNTHESIS™, and also shows the data flow in situations where the WINDOW design module is used as a stand-alone designer.
Figure 11:
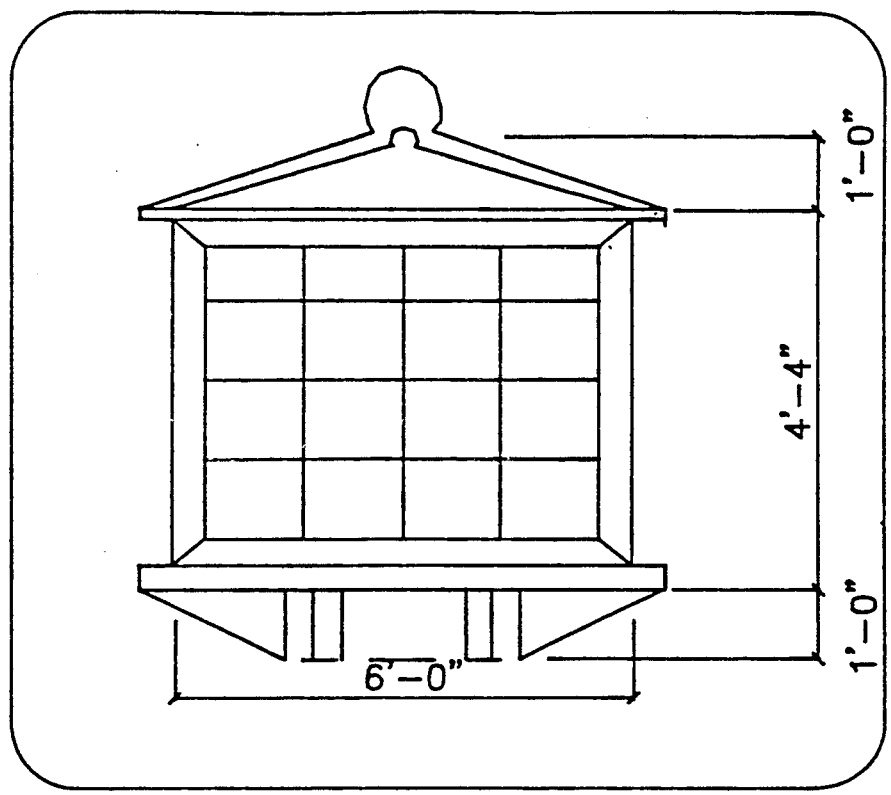
FIG. 11 is a detail of a final WINDOW drawing.
Figure 12:
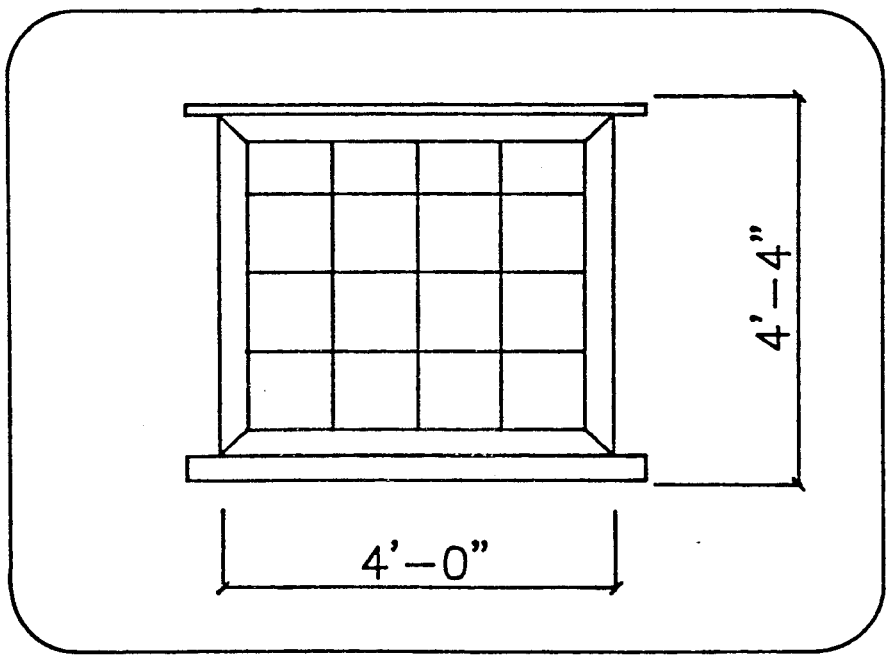
FIG. 12 is another detail of a final WINDOW drawing.

FIG. 7 is a depiction of the "WINDOW" master drawing, showing the appearance of labels—S1, S2, etc.—that correspond to the labels in the design plan 8. This particular example is of a master drawing made with an AUTOCAD® drawing processor, although another drawing processor system would work equally well.

Next we will explain how the user creates the design plan. Beginning from the main menu, 2, as seen in FIG. 6, the user chooses option 3, "Edit a Design plan." An empty design plan appears on the screen. Its format will now be described.

FIG. 9 depicts the on-screen appearance of the WINDOW design plan while it is being edited. It has this appearance only during the design editing process, which is described in detail in FIGS. 55-60. This description is not being used in a limiting sense, but as a means of explanation.

The design plan has 3 regions as seen in FIG. 9. The large upper area, the label region, contains the prompts and formulas used to calculate values for the labels in the master drawing. The master drawing region is the area shown near the bottom which contains the name of the master drawing which will be inserted into the eventual drawing. The formula bar is the bottom row of the design plan. The design plan appears as a matrix of cells. Each cell displays its "current" value. Each cell also contains a formula. The formula of the current cell can be seen in the formula bar at the bottom of the screen.

Certain other features of the design editor are not shown. They include pull-down menus which provide the user with editing commands. For example, the user has the capability to switch to related design plans currently in memory. The user can move from cell to cell, editing a cell's formula. In so doing dependent cells are instantly updated and their new values displayed.

The first type of cell group is referred to here as the drawing variable region. The primary function of the cells in this region is to generate replacement text and measurement values for labels in the master drawing. In this group each row contains four cells; label, variable, measurement and text.

The relationship between the values generated in the cells of the variables region and the master drawing is next described. The label is used to associate the measurement and text computed according to the design plan with similarly labeled text in the master drawing. When the label is in place of dimension text in the master drawing, the related measurement in the design plan provides the distance with which to rectify that dimension. Rectified along with the dimension are its associated parts in the master drawing. Text generated as a result of the design plan replaces its associated label in the master drawing.

The relationship between the cells are now described. The variable name (e.g. height, width) to use in calculations within the design plan refers to the values in either of the related text or measurement cell. Which it refers to depends on the context in which it is used. The measurement contains a formula which results in a number. The text cell contains a formula which results in text.

It is important to note that, the herein presented implementation of our invention makes use of both a label and a variable name This should not be taken in the limiting sense. The two could be combined. By simply placing the variable directly in the drawing, the label could be eliminated from the process.

The next area is referred to here as the output specification region. The primary function of cells in this region is to generate the five over-all parameters which control the insertion of the image of a master drawing. They are: the name of the master drawing, the x-and-y coordinates of insertion, the angle of insertion, the scale factor, and the angle of rotation. These parameters are used to position components of a composite picture. Their role will be explained more fully in the next example, which unlike the present example, makes use of them to form a composite picture.

The current cell's formula appears at the bottom of the screen in the formula bar. The user can move to any cell and edit its formula.

Further relationships between the cells will be described following the current example.

To create the WINDOW design plan, FIG. 25, the user proceeds as follows. With the cell marker on the first line, the user types:
PRINT [WINDOW Design],
then presses <ENTER> to accept the formula. On the second and third lines he types:
PRINT [Answer the following questions to]
PRINT [design a WINDOW:]
Then on lines six, seven, and eight the user places the formulas:
PRINT [You have the option to provide]
PRINT [the WINDOW with elaborate upper]

PRINT [and lower casements.]

Next the user enters the labels. With the cell marker in the first column of the fourth line, the user types "$1". This is the first label in the drawing. In this example, it represents the width of the WINDOW (see FIG. 9). When the user presses <ENTER>, the cell marker moves to the second column, the variable field. Here the user gives the label a variable name.

Similarly, the user provides the other labels, $2, $3, and $4.

The user then places following the variable names in the third column:
WIDTH
HEIGHT
UPPER
LOWER
These are placed in rows four, five, nine and ten, respectively.

The user places in the measurement cells the formulas corresponding to the variables UPPER and LOWER. Values computed in the measurement cells govern rectification of similarly-labeled dimensions in the master drawing.
PROMPT [Should the WINDOW have the elaborate upper casement?]
PROMPT [Should the WINDOW have the elaborate lower casement?]

The user places values in the text cells corresponding to the variables WIDTH and HEIGHT.
PROMPT [What is the WINDOW's width?]
PROMPT [What is the WINDOW's height?]

Finally, the user moves to the first cell in the Master Drawing region to provide a formula for choosing the corresponding master drawing.
[WINDOW]
Editing the design is now complete.

In many ways editing a design plan is similar to editing an ordinary spreadsheet, but there are vital differences:
1. Cells have predefined roles in the process, and these are specific to drafting.
2. Many formulas are entered automatically by SYNTHESIS™.
3. Each variable refers to, and is present on the finished drawing as, two values: measurement and text.

The predefined roles of the cells are these. The cells in the Labels region, at the top of the design plan, define the values that correspond to the labels in the master drawing. They have these roles:
1. The label relates the values computed to the master drawing;
2. The text value is used to replace the corresponding label in the master drawing;
3. The variable is the name by which the formula value is referred to inside the design plan; and
4. The measurement value is used to rectify the part of the drawing which is dimensioned with the corresponding label.

At the bottom of the screen, the Master Drawing region has cells which play the following roles:
1. The Design Plan Name cell names the current design plan when several design plans are in memory at the same time;
2. The Master Drawing cell links the design plan with its corresponding master drawing;
3. The X-insert cell provides the X coordinate with which the base point of the master drawing is to be aligned when its image is inserted into a composite image;
4. Similarly, the next cell defines the Y-insert point;
5. the Scale Factor cell defines the scale factor for inserting the image; and
6. the Rotate cell rotates the image. When it is placed in the master drawing it is rotated according to the angle provided in this cell. For example, in the case of the window, where no rotation was made, the angle of rotation is zero degrees.

It should be noted that each of the variable names in the Label region refers to two cells, a number cell and a text cell. SYNTHESIS™ automatically places a formula in a text cell (of the variables region) whenever the corresponding number cell is edited, and vice-versa. The following formulas were automatically placed in measurement cells corresponding to the variables WIDTH and HEIGHT:
ARCH#($HEIGHT)
ARCH#($WIDTH)
And, these formulas are automatically entered into the text cells corresponding to the variables UPPER and LOWER:
ARCH$(#UPPER)
ARCH$(#LOWER)

In the foregoing formulas the function ARCH# converts from a number's textual representation to its numeric value. The formula can be overwritten if the user wishes to place another formula in the cell. The choice of formula is user-configurable. The user can choose various types of conversion formulas or have none at all.

A default relationship can be established between the text and measurement cells just described. According to this relationship a dimension's measurement value can be automatically represented as text for various units of measure. It works this way; when either one of these cells is first edited a formula is automatically placed in its sister cell. The user can reconfigure the editor during editing to choose whatever mode of text should represent measurement. The user also has the option of overriding the default formula, replacing it with any formula he chooses. The second type of cell group is referred to here as the drawing insertion region. It contains information describing the overall parameters for inserting the master drawing. They are: the master drawing name cell, the X-coordinate cell, the Y-coordinate cell, the scale factor cell, and the angle of rotation cell.

Thus, the hard copy output of the WINDOW design plan would typically appear as follows:

Design Plan Formulae

---

Design Session Name = WINDOW.DEZ

Associated Master Drawing Name = WINDOW

PRINT[          WINDOW Design ]

```
PRINT[Ansswer the following questions to]
PRINT [[deesign a WINDOW:]
$1    $WIDTH
Meas.     ARCH#($WIDTH)
    = 6.000000
Text PPROMPT[What is the WINDOW's width? ]
    = 6'-0"
$2    $HEIGHT
Meas.     ARCH#($HEIGHT)
    = 6.000000
Text PROMPT[What is the WINDOW's height? ]
    = 6'-0"
PRINT[You have the option to provide]
PRINT[the WINDOW with elaborate upper]
PRINT[and lower casements.]
$3    $UPPER
Meas.     PROMPT   [Should WINDOW have elaborate
                   upper casement (1=YES 0=NO) ? ]
    = 0.000000
Text ARCH$(#UPPER)
    = 0"
$4    $LOWER
Meas.     PROMPT   [Should WINDOW have elaborate
                   lower casement (1=YES 0=NO) ? ]
    = 0.000000
Text ARCH$(#LOWER)
    = 0"
Master    [WINDOW]
    = WINDOW
X-Insrt   = 0.00
Y-Insrt   = 0.00
X-Scale   = 1.00
Y-Scale   = 1.00
Rotate    = 0.00
```

Example of a Computer Program Directing a Group of Modules

The second example of executing a parametric design supposes that the user has a program which designs a HOUSE but that the program has no graphic representation of that structure. The present invention would supply the drawings through the appropriate component design modules. The drawing HOUSE-A, FIG. 24, is the desired completed drawing for this example.

Figure 13:
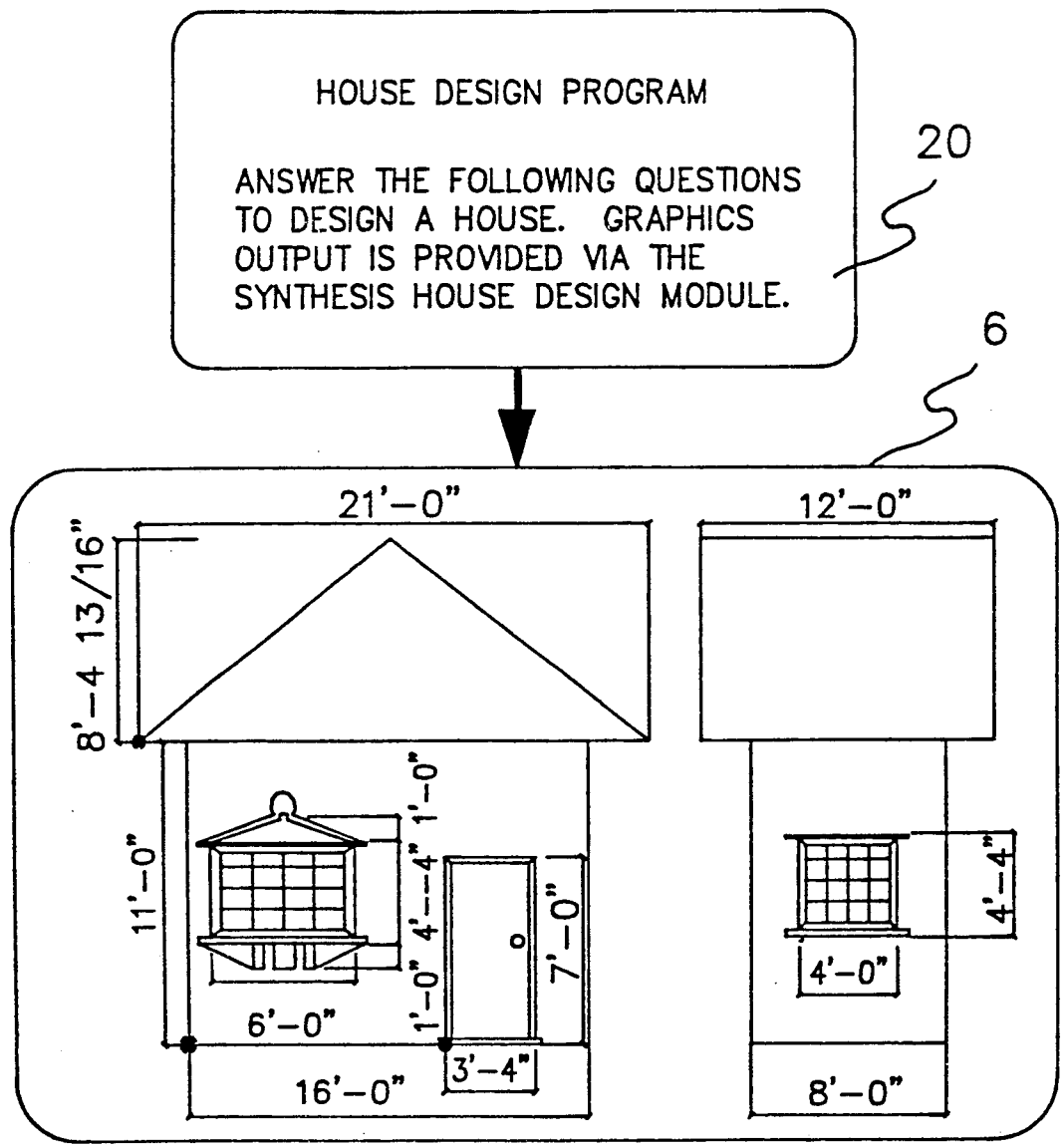
FIG. 13 show the screens evident to the user in executing a HOUSE design and the final HOUSE drawing.

The user is presented with the main menu screen of his HOUSE design plan, FIG. 13. Although the form of the prompts may vary, the user will usually be asked a series of questions by a commercial design program relating to the specifications of the HOUSE. After the user responds to design questions, he is presented with a completed drawing of his HOUSE 36.

Figure 14:
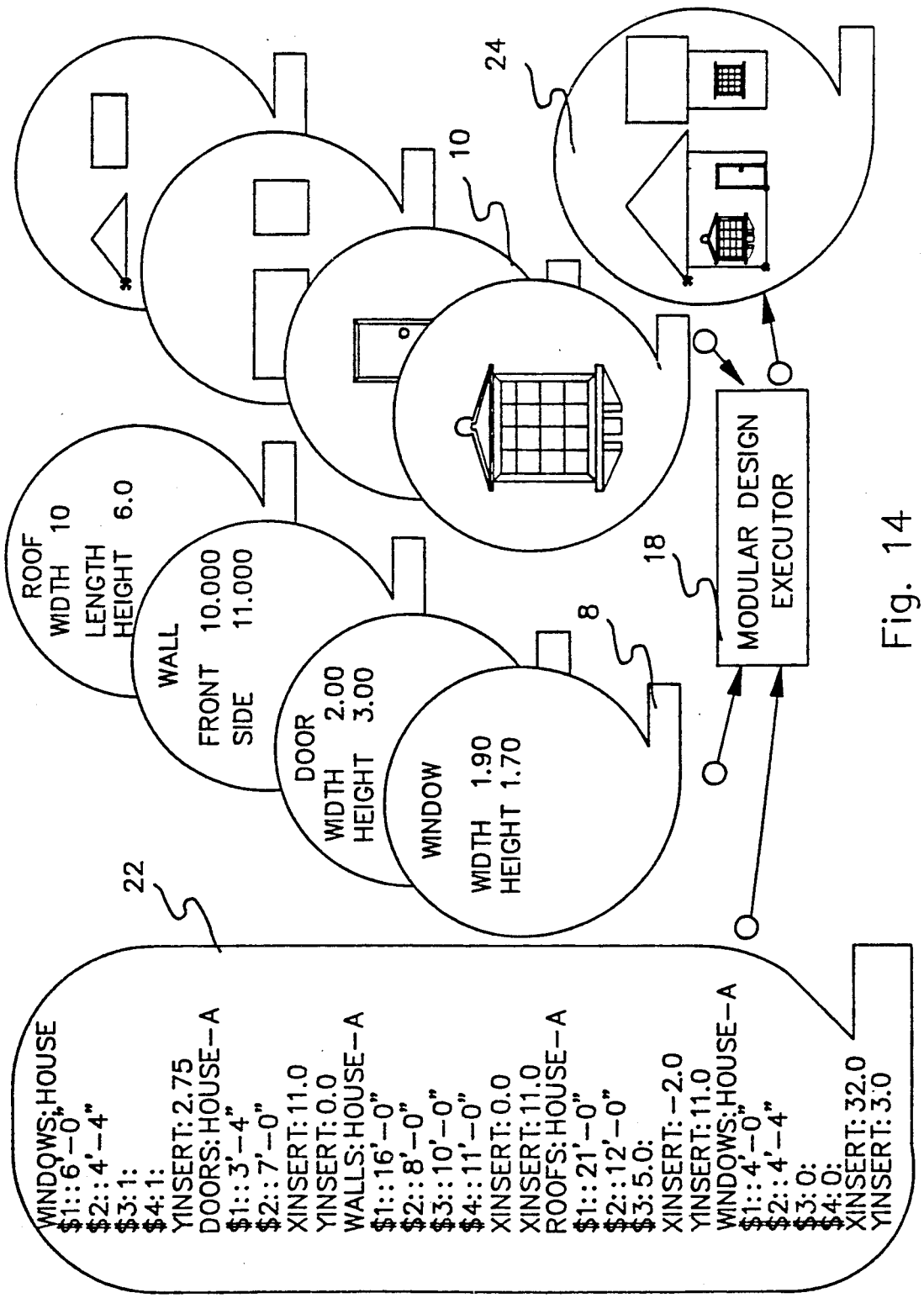
FIG. 14 represents the data flow among the elements of a modular design executor, those elements being the multi-design file produced by the user's HOUSE design program; the design plans (WINDOW, DOOR, WALL, and ROOF); the master drawings (WINDOW, DOOR, WALL, and ROOF); the electronically stored image of the HOUSE, and the modular design executor.

Refer now to FIG. 14 which illustrates the capabilities of the invention during the execution of a multi-design process. In the example of this mode, the program supplants the user and interacts with each module, completely or in part. In the example of the HOUSE design, the design modules 10 being dealt with are the WINDOW module, the DOOR module, the WALL module, and the ROOF module. Here again, the term "module" refers to the specific master drawing, the design plan and the capability of the two to interact with the computer program and each other (the user is not aware of the modules). The above-enumerated exemplary design modules, here being used in conjunction with a design program, can also be used as stand-alone modules as in the first example of parametric design. When the design program passes values corresponding to the variables defined in the design plan, those values are accepted in place of the values normally computed by its formula.

The computer program places the values it calculates into the multi-design file. These values are used to drive the modules, composed of design plans 10 and master drawings 8, in creation of the house image 24.

An explanation now will be given of the syntax used within the multi-spec file formulas 22, where:

[] signifies an optional formula,

... signifies that the formula can be repeated as desired, and

< > signifies a variable such as width, height, etc.

The information for the first design plan—the WINDOW design plan—in the multi-spec file reads:

WINDOW:HOUSE-A
$1::6'-0"
$2::4'-4"
$3:1:
$4:1:
XINSERT:7.0
YINSERT:2.75

The corresponding syntax is the following:

<design plan name>:<output drawing name>
[<variable>:<measurement>:<text>]
...
XINSERT <value>]
YINSERT:<value>]

The multi-design file contains five such blocks of information. We will examine the first of these in detail and explain how the values are passed and how the usual mode of execution is overridden by information provided in the file. The first block makes use of the design plan WINDOW to add an image to the drawing file HOUSE-A. The is described in the first line of the file, "WINDOW:HOUSE-A." The next six lines provide values for six variables in the design plan: text is provided corresponding to $1 and $2; and numbers for $3, $4, XINSERT, and YINSERT. These values supplant those that would normally be calculated for these six variables. This is true regardless of how their calculation is specified in the design plan. Variables that aren't passed are calculated according to their formulas in the design plan. Note that multi-design files can pass values corresponding to a variable's text or measurement or both.

This is a very powerful capability since it transforms variables which might otherwise depend, for example, on user input or upon values of other variables into constants.

This description is not intended in a limiting sense but as an example of the type of information passed between design plans in a multi-spec file.

Figure 15:
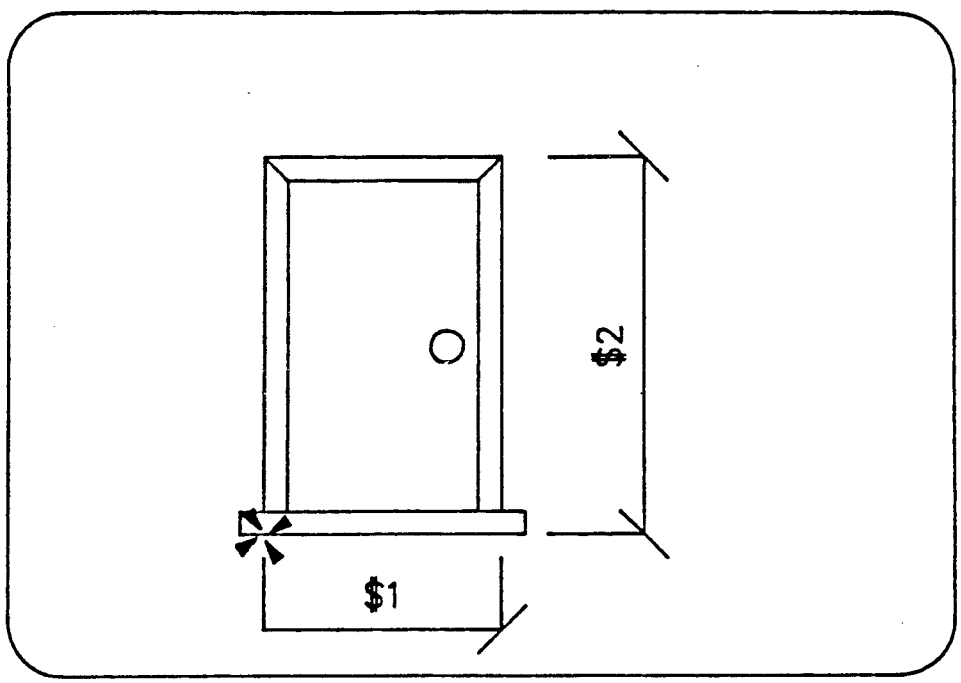
FIG. 15 is a DOOR master drawing with variable dimensions.
Figure 16:
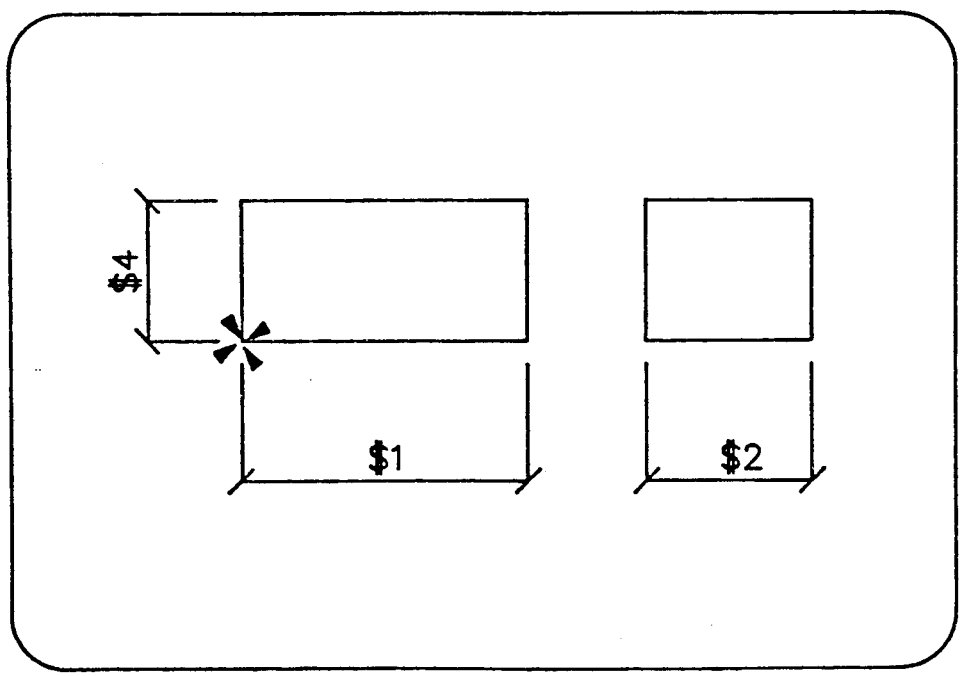
FIG. 16 is a WALL master drawing with variable dimensions.
Figure 17:
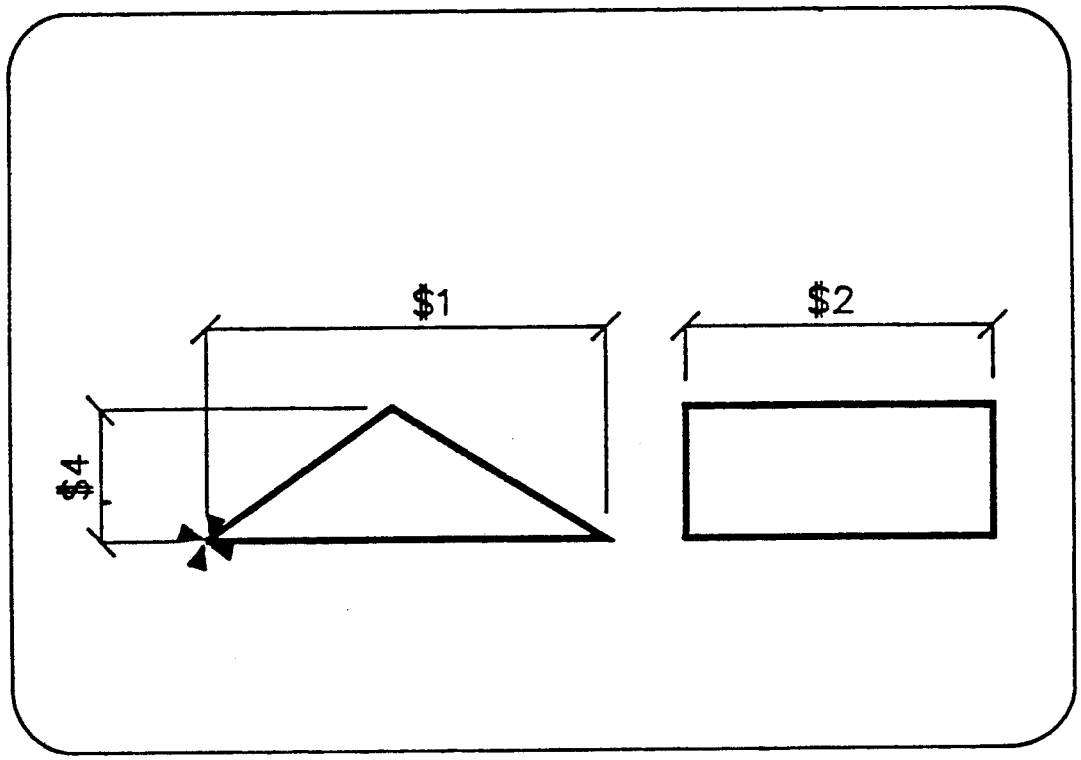
FIG. 17 is a ROOF master drawing with variable dimensions.

Refer now to FIGS. 15, 16, and 17 which illustrates the DOOR master drawing, the WALL master drawing and the ROOF master drawing, respectively. These master drawings are used to form the composite drawing of the house. These form the basis for individualized design components and, again, are not seen by the user during the design process.

FIGS. 21, 22, and 23 illustrate the design screens produced by the design editor according to the DOOR design plan, the WALL design plan, and the ROOF design plan, respectively.

FIG. 24 is the composite drawing of the house. It is an enlargement of the house already seen in the house file 24 in FIG. 14.

SYNTHESIS ™ utilizes the information contained in the cells to position together the images of the four master drawings (WINDOW, DOOR, WALL, and ROOF) in the composite picture. A base point is placed in each master drawing at the time it is created. (They are marked with crosses in FIGS. 15, 16, 17 and 10). The base point serves as a reference. The image is placed so that the base point aligns itself with the point of insertion specified by the design plan. (For illustration purposes the base points are visible in the composite image FIG. 24.) The rotation angle, zero in this example, causes the image to be rotated about its base point by an amount equal to the specified angle.

Hierarchy of Modules Interaction to Execute a House Design

In the following example, a hierarchy of design modules interact to design a HOUSE. First we describe the commands which allow a specsheet to interact and control subordinate design generation. EXPORT-(<design plan's name>,<variable name>,<value>) exports a value to a subordinate design module. When a value is passed, the subordinate module is prevented from calculating the value. In doing so it suppresses the normal mode by which the subordinate module would calculate the value.

As used in this description, the term "export" means to pass information, such as width, from a controlling design plan to a subordinate design plan without performing calculations on that information. IMPORT-S(<subordinate design module name>, <variable name>) imports a value from a subordinate module. "Import" means to pass information up the hierarchy of design plans without performing calculations.

CALCULATE(<subordinate design module's name>)

causes a design module to calculate the values corresponding to its formulas but not output a drawing based on calculations. It is prevented from calculating values for cells to which a value was exported by a supervising module.

CLEAR(<subordinate design plans name>)
clears the protection that exported-to cells have from calculating values. This command enables all cells in the design module to calculate.

OUTPUT(<subordinate design module's name>)
causes subordinate module to output a drawing.

FIG. 30 portrays the user's experience in executing the HOUSE design plan. First, the user sees a screen of information and prompts 29 for which he provides answers, one-at-a-time; then he sees screen showing a view of the completed house 6.

FIGS. 26 and 27 illustrate detail drawings which are also produced as a result of executing the HOUSE design plan. They describe the typical front and side windows, respectively.

Now we will describe how to establish the house design module beginning with the execution of the subordinate modules. No modification is required to the already described subordinate modules (WINDOW, DOOR, WALL, and ROOF).

Design Plan Formulae
_____

Design Session Name = DOOR.DEZ

Associated Master Drawing Name = DOOR

PRINT[              DOOR Design ]

PRINT[Answer the following questions to design]

PRINT[a DOOR:]

$1    $WIDTH

Meas.    ARCH#($WIDTH)

= 3.000000

Text PROMPT[What is the DOOR's width? ]

= 3'-0"

$2    $HEIGHT

Meas.    ARCH#($HEIGHT)

= 7.500000

Text PROMPT[What is the DOOR's height? ]

= 7'-6"

Master    [DOOR]

= DOOR

X-Insrt   = 0.00

Y-Insrt   = 0.00

X-Scale   = 1.00

Y-Scale   = 1.00

Rotate    = 0.00

*  *  *

Design Plan Formulae
_____

Design Session Name = ROOF.DEZ

Associated Master Drawing Name = ROOF

PRINT [              ROOF Design ]

PRINT [Answer the following questions to design]

PRINT [a ROOF: ]

$1    $WIDTH of the ROOF

Meas.    ARCH#($WIDTH)

= 10.000000

Text PROMPT [What is the width of the ROOF? ]

= 10'-0"

$4    $HEIGHT

Meas.    .4*#WIDTH

= 4.000000

Text ARCH$ (#HEIGHT)

= 4'-0"

$3    $BETWEEN -- distance between views of the ROOF

Meas.    .2*#WIDTH

= 2.000000

Text ARCH$ (#BETWEEN)

= 2'-0"

$2    $LENGTH -- length of the ROOF

Meas.    ARCH# ($LENGTH)

= 6.000000

Text PROMPT [What is the ROOF's length? ]

= 6'-0"

Master    [ROOF]

= ROOF

X-Insrt    = 0.00

Y-Insrt    = 0.00

X-Scale    = 1.00

Y-Scale    = 1.00

Rotate    = 0.00

\*    \*    \*

Design Plan Formulae
------------------------

Design Session Name = WALL.DEZ

Associated Master Drawing Name = WALL

PRINT [                    WALL Design ]

PRINT [Answer the following questions to design ]

PRINT [the front and side views of a WALL:]

$1   $FRONT length of the WALL
Meas.     ARCH# ($FRONT)
    = 10.000000
Text PROMPT [What is the length of the front of the WALL? ]
    = 10'-0"
$2   $SIDE LENGTH of the WALL
Meas.     ARCH# ($SIDE)
    = 10.000000
Text PROMPT [What is the length of the side of the WALL? ]
    = 10'-0"
$3   $BETWEEN views of WALL distance
Meas.     ARCH# ($BETWEEN)
    = 10.000000
Text PROMPT [What is the distance between WALLs? ]
    = 10'-0"
$4   $HEIGHT
Meas.     ARCH# ($HEIGHT)
    = 10.000000
Text PROMPT [What is the height of the WALL? ]
    = 10'-0"
Master    [WALL]
    = WALL
X-Insrt   = 0.00
Y-Insrt   = 0.00
X-Scale   = 1.00
Y-Scale   = 1.00
Rotate    = 0.00

An additional module called ROWS is also required. It generates rows of elements. It is included to illustrate that a module can both be blind to what it supervises as well as to whatever it is being supervised by. For example, it can create rows of kitchen cabinets; columns; or, in this case, windows. The ROWS module has no master drawing. The appearance of its design plan is shown in FIG. 29. The formulas for the ROWS design plan are as follows.

Design Plan Formulae
_____

Design Session Name = row.dez
Associated Master Drawing Name = new.dwg
# DRAWING

```
Value      1
    =             2.00
Text (null)
    = (null)
# OBJNAME
Value      (null)
    =             1.00
Text IF(DRAWING# = 1, "WINDOW.dez", "column.dez")
    = WINDOW.dez
# CALCOBJ
Value      (null)
    = (null)
Text CALCSPC$(OBJNAME$)
    = column.dez
# TOTLENGTH
Value      GETNUM("What is the length of the row? ",10)
    =            24.00
Text (null)
    = (null)
# ENDSPACE
Value      PROMPTR("How much space would you like on the
ends of the row? ",0,TOTLENGTH# /2, 0)
    =             0.00
Text (null)
    = (null)
# OBJWIDTH
Value      IMPORT(OBJNAME$, "WIDTH#")
    =             4.00
Text (null)
    = (null)
# MAXOBJ
Value      TRUNC((TOTLENGTH# - (ENDSPACE# * 2)) /
OBJWIDTH#)
    =             6.00
Text (null)
    = (null)
# NUM_OBJ
```

Value     PROMPTR("How many objects would you like in the row? ",0,MAXOBJ#,MAXOBJ#)
    =         12.00
Text (null)
    = (null)
#   SPACE_BETWEEN
Value     (TOTLENGTH# - (2 * ENDSPACE#) - (OBJWIDTH# * NUM_OBJ#)) / (NUM_OBJ# -1)
    =         -2.18
Text (null)
    = (null)
#   START_XINS
Value     GETNUM("What is the starting Xinsert of the row? ",0)
    =         28.00
Text (null)
    = (null)
#   START_YINS
Value     GETNUM("What is the starting Y-insert of the row? ",0)
    =         1.00
Text (null)
    = (null)
#   XINS_1
Value     START_XINS# + ENDSPACE#
    =         28.00
Text (null)
    = (null)
#   XINS_2
Value     XINS_1# + OBJWIDTH# + SPACE_BETWEEN#
    =         29.82
Text (null)
    = (null)
#   XINS_3
Value     XINS_2# + OBJWIDTH# + SPACE_BETWEEN#
    =         31.64
Text (null)
    = (null)

# XINS_4
Value    XINS_3# + OBJWIDTH# + SPACE_BETWEEN#
    =         33.45
Text (null)
    = (null)
# XINS_5
Value    XINS_4# + OBJWIDTH# + SPACE_BETWEEN#
    =         35.27
Text (null)
    = (null)
# EX_XINS_1
Value    IF(NUM_OBJ#         >      0,
EXPORT(OBJNAME$ ,"XINSERT#",XINS_1#),0)
    =  .      1.00
Text (null)
    = (null)
# EX_YINS_1
Value    IF(NUM_OBJ#  >   0,   EXPORT(OBJNAME$
"YINSERT#", START_YINS#),0)
    =          1.00
Text (null)
    = (null)
# MAKE_1
Value    (null)
    = (null)
Text IF(NUM_OBJ# > 0, OUTPUTSPC$(OBJNAME$), "not done")
    = column.dez
# EX_XINS_2
Value    IF(NUM_OBJ#  >1,    EXPORT(OBJNAME$   ,
"XINSERT#", XINS_2#),0)
    =          1.00
Text (null)
    = (null)
# MAKE_2
Value    (null)
    = (null)
Text IF(NUM_OBJ# > 1, OUTPUTSPC$(OBJNAME$), "not done")
    = column.dez

# EX_XINS_3
Value    IF(NUM_OBJ# > 2,  EXPORT(OBJNAME$ ,
"XINSERT#", XINS_3#),0)
    =          1.00
Text (null)
    = (null)
# MAKE_3
Value    (null)
    = (null)
Text IF(NUM_OBJ# > 2, OUTPUTSPC$(OBJNAME$), "not done")
    = column.dez
# EX_XINS_4
Value    IF(NUM_OBJ# > 3, EXPORT(OBJNAME$) ,
"XINSERT#", XINS_4#),0)
    =          1.00
Text (null)
    = (null)
# MAKE_4
Value    (null)
    = (null)
Text IF(NUM_OBJ# > 3, OUTPUTSPC$(OBJNAME$), "not done")
    = column.dez
# EX_XINS_5
Value    IF(NUM_OBJ# > 4, EXPORT(OBJNAME$) ,
"XINSERT#", XINS_5#),0)
    =          1.00
Text (null)
    = (null)
# MAKE_5
Value    (null)
    = (null)
Text IF(NUM_OBJ# > 4, OUTPUTSPC$(OBJNAME$), "not done")
    = column.dez
# SHEETNAME
Value    (null)
    = (null)
Text "row.dez"

```
       = row.dez
# MASTERNAME
Value    (null)
       = (null)
Text "new.dwg"
       = new.dwg
# XINSERT
Value    0.0
       =           0.00
Text ARCH$(XINSERT#)
       = 0"
# YINSERT
Value    0.0
       =           0.00
Text ARCH$(YINSERT#)
       = 0"
# SCALE
Value    1.0
       =           1.00
Text ARCH$(SCALE#)
       = 1'-0"
# ROTATION
Value    0.0
       =           0.00
Text ARCH$(ROTATION#)
       = 0"
```

Next, the user establishes the HOUSE design plan. That design plan supervises all of the other modules and in so doing produces all the aspects of the house. FIG. 28 shows how the HOUSE design plan appears in the design editor. Next we provide formulas for the HOUSE design plan.

```
Design Plan Formulae
----------------------------
Design Session Name = HOUSE.DEZ
Associated Master Drawing Name = new
       W   ###############
Value    (null)
       = (null)
Text PRINT$("     WELCOME TO THE HOUSE DESIGNER.")
       =          WELCOME TO THE HOUSE DESIGNER.
```

```
Answer     ##############
0Value     (null)
     = (null)
Text PRINT$("Answer the following questions to design a HOUSE.")
     = Answer the following questions to design a HOUSE.
#  EAVE_LENGTH
Value     PROMPTR("How long should the eaves be on ROOF?",0,5,2)
     =            2.00
Text (null)
     = (null)
#  ROOF_HEIGHT
Value     5
     =            5.00
Text (null)
     = (null)
#  HOUSE_WIDTH
Value     PROMPTR("How wide should the HOUSE be?",5,80,20)
     =            20.00
Text (null)
     = (null)
#  HOUSE_HEIGHT
Value     20
     =            20.00
Text (null)
     = (null)
#  HOUSE_LENGTH
Value     PROMPTR("How long should the HOUSE be?",5,50,20)
     =            20.00
Text (null)
     = (null)
#  WALL_HEIGHT
Value     HOUSE_HEIGHT# - ROOF_HEIGHT#
     =            14.00
```

```
Text    ARCH$(WALL_HEIGHT#)
    = 14'-0"
# ROOF_LENGTH
Value   HOUSE_LENGTH# + (EAVE_LENGTH# * 2)
    =           24.00
Text (null)
    = (null)
# ROOF_WIDTH
Value   HOUSE_WIDTH# + (EAVE_LENGTH# * 2)
    =           24.00
Text (null)
    = (null)
# SPACE
Value   4
    =            4.00
Text (null)
    = (null)
# EX_ROOF_SPACE
Value   EXPORT("ROOF.dez","BETWEEN#",SPACE#)
    =            1.00
Text (null)
    = (null)
# EX_ROOF_HEIGHT
Value   EXPORT("ROOF.dez","HEIGHT#",ROOF_HEIGHT#)
    =            1.00
Text (null)
    = (null)
# EX_ROOF_LENGTH
Value   EXPORT("ROOF.dez","LENGTH#",ROOF_LENGTH#)
    =            1.00
Text (null)
    = (null)
# EX_ROOF_WIDTH
Value   EXPORT("ROOF.dez","WIDTH#",ROOF_WIDTH#)
    =            1.00
Text (null)
    = (null)
```

# EX_ROOF_YINS
Value   EXPORT("ROOF.dez","YINSERT#",WALL_HEIGHT#)
    =         1.00
Text ARCH$(EX_ROOF_YINS#)
    = (null)
# WALL_SPACE
Value   SPACE# + (EAVE_LENGTH# * 2)
    =         8.00
Text (null)
    = (null)
# EX_WALL_SPACE
Value   EXPORT("WALL.dez","BETWEEN#",WALL_SPACE#)
    =         1.00
Text (null)
    = (null)
# EX_WALL_XINS
Value   EXPORT("WALL.dez","XINSERT#",EAVE_LENGTH#)
    =         1.00
Text (null)
    = (null)
# EX_WALL_HEIGHT
Value   EXPORT("WALL.dez","HEIGHT#",WALL_HEIGHT#)
    =         1.00
Text (null)
    = (null)
# EX_WALL_LENGTH
Value   EXPORT("WALL.dez","SIDE#",HOUSE_LENGTH#)
    =         1.00
Text (null)
    = (null)
# EX_WALL_WIDTH
Value   EXPORT("WALL.dez","FRONT#",HOUSE_WIDTH#)
    =         1.00
Text (null)
    = (null)
# EX_WALL_YINS

```
Value    EXPORT("WALL.dez", "YINSERT#", 0)
    =         1.00
Text ARCH$(EX_WALL_YINS#)
    = (null)
# DO_ROOF
Value   (null)
    = (null)
Text OUTPUTSPC$(CALCSPC$("ROOF.dez"))
    = ROOF.dez
# DO_WALLS
Value   (null)
    = (null)
Text OUTPUTSPC$(CALCSPC$("WALL.dez"))
    = WALL.dez
#Do doo  ################
Value   (null)
    = (null)
Text (null)
    = (null)
# CALC_DOOR
Value   (null)
    = (null)
Text CALCSPC$("door.dez")
    = door.dez
# DOOR_WIDTH
Value   IMPORT("door.dez", "WIDTH#")
    =         3.00
Text (null)
    = (null)
# DOOR_INSERT
Value   3
    =         3.00
Text (null)
    = (null)
# EX_DOOR_XINS
Value   EXPORT("door.dez","XINSERT$",    HOUSE_WIDTH#
- DOOR_INSERT#- DOOR_WIDTH# + EAVE_LENGTH#)
    =         1.00
```

```
Text (null)
     = (null)
# EX_DOOR_YINS
Value    EXPORT("door.dez", "YINSERT#", 0)
     =         1.00
Text ARCH$(EX_DOOR_YINS#)
     = (null)
# DO_DOOR Value     (null)
     = (null)
Text OUTPUTSPC$("door.dez")
     = door.dez
# SET_DRAW_WIN
Value    EXPORT("row.dez", "DRAWING#", 1)
     =         1.00
Text (null)
     = (null)
##############
Value     (null)
     = (null)
Text PRINT$("Next, design the WINDOW for the front of
the HOUSE.")
     = Next, design the WINDOW for the front of the
HOUSE.
# EX_WIN_LENGTH
Value    EXPORT("row.dez","TOTLENGTH#",HOUSE_WIDTH#
- DOOR_WIDTH# - DOOR_INSERT#)
     =         1.00
Text (null)
     = (null)
# EX_WIN_XINS
Value    EXPORT("row.dez","START_XINS#",EAVE_LENGTH#)
     =         1.00
Text (null)
     = (null)
# EX_WIN_YINS
```

```
Value    EXPORT("row.dez","START_YINS#", 2)
    =        1.00
Text ARCH$(EX_WIN_YINS#)
    = (null)
#    EX_WIN_NAME
Value    EXPORT("row.dez", "OBJNAME#", 1)
    =        1.00
Text (null)
    = (null)
#    DO_FRONT_WINS
Value    (null)
    = (null)
Text CALCSPC$("row.dez")
    = row.dez
##############
Value    (null)
    = (null)
Text PRINT$("Next, design the WINDOW for the side of the
HOUSE.")
    = Next, design the WINDOW for the side of the
HOUSE.
#    EX_WIN_WIDTH
Value    EXPORT("row.dez","TOTLENGTH#",HOUSE_LENGTH#)
    =        1.00
Text (null)
    = (null)
#    EX_SIDEWIN_XINS
Value    EXPORT("row.dez","START_XINS#", ROOF_WIDTH# +
SPACE# + EAVE_LENGTH#)
    =        1.00
Text (null)
    = (null)
#    DO_SIDE_WINS
Value    (null)
    = (null)
Text CALCSPC$("row.dez")
    = row.dez
```

# SHEETNAME
Value    (null)
     = (null)
Text "HOUSE.dez
     = HOUSE.dez
# MASTERNAME
Value    (null)
     = (null)
Text "new"
     = new
# XINSERT
Value    0.0
     =            0.00
Text ARCH$(XINSERT#)
     = 0"
# YINSERT
Value    0.0
     =            0.00
Text ARCH$(YINSERT#)
     = 0"
# SCALE
Value    1.0
     =            1.00
Text ARCH$(SCALE#)
     = 1'-0"
# ROTATION
Value    0.0
     =            0.00
Text ARCH$(ROTATION#)
     = 0"

FIGS. 30-48 illustrate the role of each module and show the part it plays in creating the HOUSE-A drawing, FIG. 24. The figures illustrate how the various design plans can interact with each other.

FIGS. 30-48 are not necessarily in the order in which they are executed in a multi-design. During this entire process the user only sees the prompts for variables which the invention needs to complete the HOUSE drawing. The user will not see the completed drawing until all questions are answered.

Refer now to FIG. 30 which depicts what happens when the user is prompted for HOUSE proportions by the HOUSE module 28 which is in control. At this point, the HOUSE module 28 is only prompting the user 12 and not interacting with subordinate modules.

In FIG. 31, the HOUSE module 28 is shown as exporting the HOUSE width, length and height to the WALL module 32 and the ROOF length, width and height to the ROOF module 34.

The output drawing name, HOUSE-A, is exported to the ROWS module 26, DOOR module 30, WALL module 32, and ROOF module 34. As discussed above, the ROWS module 26 is a generic design plan which can be used with any design program. It has the capability of designing similar components, such as rows of windows, based on mathematical formulas, and user-originated information in a single transaction; i.e., without a creation of a new design plan for each of the similar elements.

In FIG. 33, the design plan of the WALL module 32 is shown as being compelled by the design plan of the HOUSE module 28 to output a description of the walls to the HOUSE-A drawing.

Similarly, the design plan of the HOUSE module 28 is shown as compelling the design plan of the ROOF module 34 to output the roof description to the HOUSE-A drawing as seen in FIG. 34.

In FIG. 35, the HOUSE module 28 is shown as calculating the locations of the doors and exporting those locations to the DOOR module 30.

The next step, shown in FIG. 36, is that the HOUSE module 28 passes control to the DOOR Module 30 which prompts the user 12 for the width and height of the door, which is then calculated by the HOUSE module 28 and passed to the DOOR module 30.

In FIG. 37, the DOOR module 30 is shown as being compelled by the HOUSE module 28 to pass the door description to HOUSE-A drawing.

In FIG. 38, the user 12 is being prompted for the type and number of windows and the detail drawing name for a typical front window. The HOUSE module 28 then calculates the number of windows and exports their width and name to the WINDOW module 16.

The HOUSE module 28 passes control to the WINDOW module 16 (see FIG. 39) so it can calculate the unspecified window design values The WINDOW module 16 prompts the user for the height and appearance of the window.

In FIG. 40, the HOUSE module 28 is shown as passing control to the WINDOW module 16 to output the typical front window description to the HOUSE-A drawing, which then adds a front view of the house to the HOUSE-A drawing.

The HOUSE module 28 (see FIG. 41) now knows the number of front windows and their beginning location, so it passes that information to the ROWS module 26 which in turn calculates the placement of each window by interacting with the WINDOW module 16 and the HOUSE module 28 as in FIG. 42. The window placement is exported to the HOUSE-A drawing along with a command to output the window description.

Now, that the window descriptions for the front windows of the house have been exported, the WINDOW module 16 (see FIG. 50) is cleared of all front window descriptions by the HOUSE module 28.

Now, the the HOUSE module 28 prompts the user for information regarding the side windows of the house (see FIG. 45). The width and name of a typical side window are then exported to the WINDOW module 16.

In FIG. 45, the HOUSE module 28 is shown as passing control to the WINDOW module to calculate the unprovided window design values and create a side drawing to be added to the HOUSE-A drawing. The WINDOW module 16 prompts the user for the height and appearance of each side window and then (see FIG. 46) exports the side window descriptions to the HOUSE-A drawing after it has been passed control by the HOUSE module 28.

In FIG. 47, the HOUSE module 28 is shown as passing the number of side windows and their beginning locations to the ROWS module 26.

In FIG. 48, the ROWS module 26 and the WINDOW module 16 are shown as interacting to calculate the placement of each window. This is repeated as many times as necessary, once for each window. Then, the WINDOW module 16 exports the placement of the windows to the HOUSE-A drawing, along with a command to output a window description.

In the same manner, other modules can interact with each other and with the user to create portions or all of a drawing.

FIG. 49 is a simple illustration of how a TEMPLE module 42 could replace a HOUSE module 28 and a COLUMN DESIGN module 44 might replace a WINDOW module 16. Once again, this demonstration is not intended to be interpreted in a limiting sense.

SUMMARY OF THE PARAMETRIC DESIGN PROCESS

The processes of the invention involve many steps. Those relating to FIG. 50 have already been described above.

Referring next to FIG. 51, to execute a parametric design module 60, the controlling design plan is specified. The appropriate design plans from the design plan files 8 are loaded, and the user 12 is presented with screens of design information and prompts. Based on user response and information computed and gathered, the parametric design module executor 60 specifies:
1. the name of master drawing, name of output drawing 6, and the scale factor, point of insertion, and angle of rotation; and
2. drawing measurement values and text values to replace variables in the master drawings.

These drawing specifications are then combined with the data from the master drawings stored in the master drawings data file 10 and in the image synthesizer 66 (more fully explained below with reference FIG. 54) to create an electronic representation of a synthesized drawing 70. Depending on the desire of the user, either a manufacturing device 72 produces a manufactured part 76; or drawings 6 are produced in the drawing processor 74 based on the image 70.

Refer now to FIG. 52, which is a more detailed diagram of our novel process for executing a parametric design. The user 12 of the design program specifies the controlling design plan 8 necessary to execute a design plan 78. The controlling design plan is loaded as shown at 80 into the design plan array 86. The controlling design plan then calls design plans from the design plan files 8. The required design plan(s) then become the controlling design plan's subordinate(s) and are loaded as indicated by reference character 84 into the design plan array 86. Each of these subordinates plans may have other plans subordinate to itself. These too are loaded until all related plans are in the array. Control is passed to the design plan processor 88 (more fully explained in FIG. 53) which specifies the master array. Formula data is passed from the design plan arrays 86 to design plan processor 88, and values are calculated and traded back from the design plan processor 88 to the design plan arrays 86. This can be repeated as often as necessary. If a formula requires the execution of a subordinate design plan and specifies a subordinate array, it calls design plan processor 88 and returns control to itself. This process is called recursion.

In normal computer operations, a computer calls another function, which is called a subroutine, to perform a specific task. Recursion is a method by which a computer function calls itself, as in the present invention when a design plan operates on its own information. The design plan is located in memory twice and is blind to the fact that it calls itself. Recursion takes place in the present invention only while processing a design plan and evaluating a cell (more fully explained below with reference to FIG. 53).

The execution of a design plan 78 can also output a subordinate array which is loaded into the output array 94 and becomes data within the drawing specifications array 68. After the subordinate array and controlling array have been specified, the output array 94 is passed to the drawings specifications array 68.

FIG. 53 illustrates the evaluation of a design plan cell while executing a parametric design 60 and the evaluations of a cell during editing as will be further described in FIGS. 57-60. It is an expansion of the process described in FIG. 52. It is subdivided into the twelve most important types of capabilities required in formula execution which are identified by reference characters 98, 100, 102, 104, 106, 108, 110, 112, 114, 116, 118, and 120 and discussed below.

Three of these capabilities require user involvement and are set off in the dashed area 121. The invention also has the capability of providing customized screens of procedural information 108 to the user 12, who is then prompted for appropriate information 110 regarding the variables of the drawing. Through prompts and responses, a specific user's design program—for example, a commercial bicycle design program without drawings—can be given individual and new values.

SYNTHESIS™ has the capability of executing and reading the output from the user's design program 122. To do so, the design program executor and/or output reader 112 execute the user's design program 122. The program generates a report file 124. Thereafter, values are read from the report file 124 by the design program executor and/or output reader 112 and provided to other cells. Values from other cells can be read by the value obtainer 100 which also has the capability of executing the cell if the cell is unexecuted by passing control to the cell evaluator 96 recursively. The cell value obtainer 100 can also import values from subordinate arrays. External data files can be accessed as shown at 118 from a database or text file 126. Design variables can be combined with mathematical and textual manipulation 116. For example, the formula: $x+3*(Prompt[Please\ input\ Number:])$ could be used to prompt the user for a specific number which in turn becomes part of a mathematical formula.

The design plan also has the capability of determining the order in which formulas in the design plan are executed using the order of operation determiner 120. Formulas which depend on values calculated in other formulas are executed subsequently as shown at 114. Some formulas, groups of formulas, or even whole design plans may execute conditionally or repetitively. Where this is the case, the invention has the capability of knowing whether, as well as when, to execute formulas. A particular design plan can have control passed to it repetitively by a parent design plan, each time outputting drawing specifications. The cell value exporter 102 can export values to subordinate arrays contained in the design array 86. As it does, the cell value exporter 102 sets a flag which protects the cell from recalculation by subordinate array executor 98. The subordinate array unprotector 104 clears the flags set by the cell value exporter 102. Thus, it frees all cells for recalculation by the subordinate array executor 98. The subordinate array outputter 106 outputs subordinate arrays through the use of the array outputter 94. The array outputter 94 loads the values into the design array 86 and outputs them to the drawing description file or array 68. Subordinate array executor 98 can calculate the values of all cells in the subordinate array by using the design plan processor 88 recursively. When doing so, cells to which values were previously exported by the cell value exporter 102 are protected from such recalculation.

Refer now to FIG. 54 which depicts the process of reading a master drawing 10 to produce a new output drawing 24 within the image synthesizer 66. The name of the description file 68 is specified to the image synthesizer 66 which employs the image reader 129 to read the relevant master drawing from a master drawing file 10. In order to do so, the image reader 129 obtains the master drawing file's name from the drawing description file 68. Next, the image synthesizer 66 feeds the original image to the image modifier 128. The image modifier 128 returns a modified image to the image synthesizer 66. The image modifier 128 employs three capabilities in modifying the image: the scale factor adjustor 130 is used to adjust the image allowing for the scale factor; the label substituter 134 replaces the label in the master drawing with its associated text as described in the drawing description file; and the rescaler 138 adjusts the image in accordance with the measurement value corresponding to the label as described in drawing description file 68. During the rescaling, if the drawing has a variable whose measurement value is zero, that portion of the drawing is deselected as shown by reference character 142.

Thus, either a single drawing can be synthesized or multiple drawings formed, each containing multiple synthesized images. This depends on how many drawings are described in the drawing description file.

EDITING A DESIGN PLAN

Refer now to FIG. 55 which illustrates the process of editing a design plan. The user 12 inputs a command to the design editor 58. This command is executed; and the screen is updated interactively. The user 12 has options including: to switch to a new current design plan 144; to move to another cell 146; to change a variable's name 148; to save a design plan 150; to load a design plan 152; to edit a cell 154 which is explained more fully in FIG. 56; or to move information to other cells or design plans 156. Editing a cell results in updating a design plan, while both saving a design plan 150 and loading a design plan 152 would result in transmitting information to the design plan data array 86. Editing a cell 154 would result in processing a design plan 88.

Refer now to FIG. 56 for the procedure of editing a cell in a design plan. At this point, the user can make the following choices: change the cursor position without changing the formula 158; input a character into the formula string at the current cursor position 160; or accept a valid formula into design plan data array 62. If an invalid formula is inserted, an error message is displayed by the error message displayer 164 which moves the cursor to the error's position. When a valid formula is being entered, the updated information is added to the design plan data array 86. The procedure is more fully explained below with reference to FIGS. 57-60.

Refer now to FIG. 57 which depicts the routine employed in storing a valid formula upon completing the editing of a parametric variable's number cell within the design plan. First, the numeric cell information updater 166 calls the current formula saver 174 to add the formula to the data array 86. Next, the numeric cell updater 166 passes control to the cell evaluator 96 and in so doing specifies the current cell's location to the cell evaluator 96 which evaluates and then stores the value in the data array 86. If the text cell adjoining that measurement cell has no formula, as of yet, a number-to-text formula default is generated, by the number-to-text converter 176, and stored in the data array 86. (This cell can be re-edited by the user in a subsequent edit operation). Then, the cell evaluator 96 is used to load and evaluate the text formula; and the value is then added to the design plan data array 86. Next, the numeric cell updater 166 uses the dependent cell calculator 178 to update the dependent cells. This means that all other cells where formulas depend on the current cell are recalculated, and their new current value is displayed.

Refer now to FIG. 58 which depicts the routine employed in storing a valid formula upon completing the editing of a parametric variable's number cell within the design plan. First, the text cell information updater 168 calls the current formula saver 174 to add the formula to the data array 86. Next, the text cell updater 168 calls the cell evaluator 96, specifying the current cell's location to the cell evaluator 96 which evaluates and then stores the value in the data array 86. If the text cell adjoining the measurement cell has no formula, as of yet, a number-to-text formula default is generated by the text to number convertor 180 and sorted in the data array 86. (This cell can be re-edited by the user in a subsequent edit operation). Then, the cell evaluator 96 is used to load and evaluate the text formula; and the value is then added to the design plan data array 86. Next, the text cell updater 168 uses the dependent cell calculator 178 to update the dependent cells. This means that all other cells where formulas depend on the current cell are recalculated and their new current value is displayed.

Refer now to FIG. 59 which illustrates the routine for editing a parametric variable's name cell. If a cell is being renamed, the variable name changer 128 loads all formulas referring to the variable from the data array 86 and updates them as new variable names. The variable name editor 170 saves the variable name in the design data array 86.

FIG. 60 illustrates the method of editing formulas in the design data array 86 that correspond to the design plan's output specification region. The insertion formula updater 172 saves the formula in the design data array 86. All dependent formulas are updated using the dependent cell calculator 178. Updated values are stored in the design data array 86.

The invention may be embodied in other specific forms without departing from the spirit or essential characteristics thereof. The present embodiments are therefore to be considered in all respects as illustrative and not restrictive, the scope of invention being indicated by the appended claims rather than by the foregoing description; and all changes which come within the meaning and range of equivalency of the claims are therefore intended to be changes which come within the meaning and range of equivalency of the claims are therefore intended to be embraced therein.

What is claimed is:

1. A method of employing a general purpose interactive system which includes a computer with a memory means, a monitor coupled to said computer for displaying data outputted from the computer, and a data entry device coupled to said computer for inputting data to the computer to create an accomplished design by first engineering said design and then portraying said design in the form of electronically storable data, said method comprising the steps of:
   employing said data entry device to establish a multiplicity of design plans, each comprising a two-dimensional array of cells;
   editing one of said design plans by employing said computer to write a value defined in a cell of one of said design plans from said one design plan into a cell of a second of those design plans;
   employing said computer to update the value of all related cells in said multiplicity of design plans; and
   electronically storing in said computer data representing said accomplished design and generated by using said computer to output at least one of said updated values to said computer memory.

2. A method of creating an accomplished design as defined in claim 1 which includes the step of using said data entry device to edit a primary or secondary design plan by inputting to said computer instructions which result in their being in at least one of the cells of one of the multiplicity of design plans a textual manipulation or a mathematical statement defining a set value, said statement containing as an element thereof a value defined in a related cell of said design plan.

3. A method of creating an accomplished design as defined in either of the preceding claims 1 and 2 which includes the steps of:
   using said data entry device to edit a primary or secondary array of cells of one of said multiplicity of design plans by inputting to said computer instructions which result in their being in at least one of said cells a statement that both: (i) defines a value, and (ii) refers to at least one cell of another of said multiplicity of design plans;
   employing the computer to update the values in all related cells and, in so doing, to utilize the referred-to value for each referred-to cell rather than the statement-provided value in said cell; and displaying the updated values of the cells of a particular design plan on the monitor as the cells of said design plan are edited.

4. A method of creating an accomplished design as defined in either of the preceding claims 1 or 2 which includes the steps of:
   utilizing said date entry device to input into each of one or more cells of a supervisory design plan a command statement that refers to a subordinate design plan;
   utilizing the computer to evaluate the statement(s) in said supervisory design plan;
   utilizing said computer to evaluate all of the statements in the cells of the referred-to design plan pursuant to at least one supervisory design plan command statement; and
   thereafter utilizing said computer to output to the memory means at least one value defined in the statements corresponding to the cells of said referred-to design plan.

5. A method of creating an accomplished design as defined in either of the preceding claims 1 or 2 which includes the steps of:
   employing said data entry device to establish a master drawing with text and dimensions represented by variables related to a reference point in said drawing;
   continuously displaying the updated master drawing on said monitor as said master drawing is established, whereby the user can visually monitor the appearance of said master drawings as it is established;
   utilizing said data input device to input to at least one of the design plans one or more statements providing positional information; and
   thereafter electronically storing in said memory means data representing said accomplished design and generated by employing the computer to position the image derived from said master drawing relative to said reference point pursuant to the statement(s) which provide positional information.

6. A method of employing a general purpose interactive system which includes a computer with a memory means, a monitor coupled to said computer for displaying data outputted from the computer, and a data entry device coupled to said computer for inputting data to the computer to create an accomplished design by first engineering said design and then outputting data portraying said design in the form of electronically storable data, said method comprising the steps of:
   displaying on said monitor a design plan with an array of cells;
   employing said data entry device to store in said memory means a set of data elements in which at least one element is a value corresponding to one of the cells in said design plan;
   using said data entry device to input a command which will cause said computer to utilize said value in the remaining steps of the process;
   employing said computer to update the values of all related design plan cells; and
   electronically storing in said computer data representing said accomplished design and generated by storing said values in said memory means.

7. A method of creating an accomplished design as defined in claim 6 which includes the steps of:
   using said data entry device to edit cells by inputting to said computer instructions which result in their being in at least one of said cells a textual manipulation or a mathematical statement defining a set value, said statement containing as an element thereof a value defined in a related cell of said design plan pursuant to a solicitation for information;
   employing the computer to update all related cells; and
   displaying the updated values of said cells on the monitor as the array of cells is edited.

8. A method of creating an accomplished design as defined in either of the preceding claims 6 or 7 which includes the steps of:
   using said data entry device to input to one or more cells of said design plan a statement that defines a numeric or text value;
   employing said data entry device to store in said memory means at least one data element which is a value corresponding to one of the cells of said design plan;
   using said data entry device to input a command which will cause said computer to: (a) replace said statement-defined value in said cell with the value from said set, and (b) utilize said value in the remaining steps of the process;
   employing said computer to update the values of all related design plan cells;
   electronically storing in said computer data representing said accomplished design and generated by writing at least one of said updated values from the cell in which said value is found to said memory means.

9. A method of creating an accomplished design as defined in claim 8 which includes the steps of:
   using said data entry device to input a command which will cause said computer to reinstate said statement-defined value in any involved cell of the design plan;
   utilizing said reinstated value in the remaining steps of the process;
   thereafter employing said computer to update the values of all related design plan cells; and
   electronically storing in said computer data representing said accomplished design and generated by storing said values in said memory means.

10. A method of creating an accomplished design as defined in claim 8 which includes the steps of:
    employing said data entry device to enter an instruction which results in said computer performing a series of operations according to an algorithm stored in said memory means in the form of a computer program, said operations including those of:
    (i) generating a set of values containing at least one value corresponding to one of the cells of said design plan, and
    (ii) storing said values in said memory means; and thereafter employing said computer to:
    (iii) place in said one cell the value generated by the computer, and
    (iv) utilize the thus provided value corresponding to said cell and generated by performing said series of operations in generating the accomplished design.

11. A method of creating an accomplished design as defined in either of the preceding claim 6 or 7 which includes the steps of:
    using said data entry device to input a command which will cause said computer to reinstate said statement-defined value in any involved cell of the design plan;

utilizing said reinstated value in the remaining steps of the process;

thereafter employing said computer to update the values of all related design plan cells; and electronically storing in said computer data representing said accomplished design and generated by storing said values in said memory means.

12. A method of creating an accomplished design as defined in either of the preceding claims 6 or 7 which includes the steps of:

employing said data entry device to enter an instruction which results in said computer performing a series of operations according to an algorithm stored in said memory means in the form of a computer program, said operations including those of:

(i) generating a set of values containing at least one value corresponding to one of the cells of said design plan, and (ii) storing said values in said memory means; and thereafter employing said computer to:

(iii) place in said one cell the value generated by the computer, and (iv) utilize the thus provided value corresponding to said cell and generated by performing said series of operations in generating the accomplished design.

13. A method of creating an accomplished design as defined in either of the preceding claims 6 or 7 which includes the steps of:

employing said data entry device to store in said memory means at least one data element which is the name of a particular design plan; and thereafter using said data entry device to input a command which will cause said computer to electronically store in said computer data representing said accomplished design and generated by storing at least one value corresponding a cell of said named design plan in said memory means.

14. A method of creating an accomplished design as defined in either of the preceding claims 6 or 7 which includes the steps of:

employing said data entry device to establish a master drawing with text and dimensions represented by variables related to a reference point in said drawing;

continuously displaying the updated master drawing on said monitor as said master drawing is established, whereby the user can visually monitor the appearance of said master drawing as it is established;

utilizing said data input device to input into one or more of said design plan cells statements that provide positional information;

thereafter employing said data entry device to store in said memory means at least one data element which includes positional information; and electronically storing in said computer data representing said accomplished design and generated by employing the computer to position the image derived from said master drawing pursuant to the positional information in said one data element.

15. A method of employing a general purpose interactive system which includes a computer with a memory means, a monitor coupled to said computer for displaying data outputted from the computer, and a data entry device coupled to said computer for inputting data to the computer to create an accomplished design by first engineering said design and then portraying said design in the form of electronically storable data, said method comprising the steps of:

employing said data entry device to establish one or more edited design plans, each of said edited design plans comprising a contiguous, two-dimensional array of cells;

employing said data entry device to input to said computer one or more statements, each of said statements defining a solicitation for a set value and each of said statements corresponding to a particular cell of one of said design plans;

employing said data entry device to input to said computer an instruction which will result in said monitor so displaying each of said solicitations for information that the cells of the edited design plan(s) are hidden from the user;

employing said data entry device to input to said computer items of information which are responses to said solicitations;

transferring each item of information entered pursuant to a solicitation to related ones of said design plan cells; and thereafter electronically storing in said computer data representing said accomplished design and generated by employing the computer to store at least one of said items of information in said memory means.

16. A method of creating an accomplished design as defined in claim 15 which includes the steps of:

using said data entry device to edit cells of said design plan(s) by inputting to said computer instructions which result in their being in at least one of said cells a textual manipulation or a mathematical statement defining a set value and containing as an element thereof a value defined in a related cell of said design plan which contains a value that is determined pursuant to a solicitation for information;

employing the computer to update all related cells of said design plan; and displaying the updated values of said cells on the monitor as the cells of said design plan are edited.

17. A method of creating an accomplished design as defined in either of the preceding claims 13 or 16 which includes the steps of:

displaying said solicitations and the items of information entered in response to said solicitations on said monitor so that the user can check the items of information inputted to the computer;

transferring each item of information entered in response to a solicitation to related ones of said array's cells; and thereafter electronically storing in said computer data representing said accomplished design and generated by employing the computer to store at least one of said items of information in said memory means.

18. A method as defined in either of the preceding claims 15 or 16 which includes the steps of:

employing said data entry device to input to the computer at least one statement which defines a solicitation for a set value and which refers to a value in a cell of one of said design plans;

employing said data entry device to input to said computer a set value which is a response to one of said solicitations for a set value;

transferring said set value to a specific cell of said design plan; and thereafter displaying at least one other solicitation defined in a statement which refers to the set value that was inputted pursuant to the previous solicitation.

19. A method as defined in either of the preceding claims 15 or 16 which includes the steps of:

employing said data entry device to input to said computer a first statement which defines a first solicitation for a set value and a second statement which defines a second solicitation and which refers to the set value entered in response to the solicitation;

employing said monitor to display the first solicitation;

employing said data input device to input the set value which is the response to the first solicitation;

employing said monitor to display the second solicitation which has its contents dependent upon the set value entered in response to the first solicitation;

employing said data input device to input information pursuant to the second solicitation; and electronically storing in said computer data representing said accomplished design and generated by employing the computer to store at least the information generated in response to said second solicitation in said memory means.

20. A method as defined in either of the preceding claims 15 or 16 which includes the steps of:

employing said data entry device to input to said computer one or more statements, each of which corresponds to a cell of one of the edited design plans and defines a solicitation for a textual value;

employing said data entry device to input to said computer a set value which is a response to said solicitation for a textual value;

transferring said set value to the specific cell of an edited design plan corresponding to said solicitation; and thereafter electronically storing in said computer data representing said accomplished design and generated by employing the computer to write the set value furnished in response to the solicitation for a textual value from said specific cell of said design plan to said memory means.

21. A method as defined in either of the preceding claims 15 or 16 which includes the steps of:

employing said data entry device to input to said computer one or more statements, each of which corresponds to a cell of one of the edited design plans and defines a solicitation for a numerical value;

employing said data entry device to input to said computer a set value which is a response to said solicitation for a numerical value;

transferring said set value to the specific cell in an edited design plan corresponding to said solicitation; and thereafter electronically storing in said computer data representing said accomplished design and generated by employing the computer to write the set value furnished in response to the solicitation for a numerical value from said specific cell of said design plan to said memory means.

22. A method of creating an accomplished design as defined in either of the preceding claims 15 or 16 which includes the additional steps of:

employing said computer to generate a master drawing;

employing said data entry device in a manner which will cause said computer to define a reference point in said master drawing;

employing said data entry device to input to said computer a statement which defines a solicitation for positional information;

employing said data entry device to input to said computer an instruction which will result in said monitor displaying said solicitation for positional information;

employing said data entry device to input to said computer an litem of positional information which is a response to the solicitation for positional information; and employing said computer to generate data describing said accomplished design as aforesaid and to position said accomplished design in a manner which relates the design to the reference point in conformity with said item of positional information.

23. A method of creating an accomplished design as defined in either of the preceding claims 15 or 16 which includes the steps of:

employing said data entry device to cause said computer to write to its memory means a set of data elements having at least one element which is a value that corresponds to one of the cells of the design plan, said one cell being related to a statement which defines a solicitation for a value;

using said data entry to: (a) input a command which will cause said computer to replace in said one cell a value provided by a response to said solicitation for a value with the value from said set of data elements, and (b) utilize said value in the remaining steps of the process; and employing said computer to update the values of all related design plan cells; and thereafter electronically storing in said computer data representing said accomplished design and generated by writing at least the value from the set of data element from said one cell to the memory means.

24. A method of creating an accomplished design as defined in either of the preceding claims 15 or 16 which includes the steps of:

utilizing said computer to solicit the user for the name of a design plan to execute;

utilizing the data entry device to provide the name of a design plan furnished by the user as a response to said solicitation;

utilizing the computer to evaluate at least one statement which defines a solicitation for a set value and which has been inputted as aforesaid to a cell of the named design plan; and thereafter utilizing said computer to output to its memory means at least the value defined by the aforesaid statement in the cell of the named design plan.

25. A method of creating an accomplished design as defined in either of the preceding claims 15 or 16 which includes the steps of:

utilizing the data entry device to edit said one and a second of said design plans;

so utilizing said data entry device as to input to said computer as aforesaid statements defining solicitations for information, each said solicitation being related to a particular cell of said second design plan;

utilizing the computer to provide a coordinated presentation of the solicitations related to the original design plan and at least two solicitations related to said additional design plan; and thereafter utilizing said computer to output to its memory means at least one value furnished in response to a solicitation defined by a statement in the cell of the second design plan and at least one value furnished in response to a solicitation defined in a statement in a cell of the first design plan.

26. A general purpose interactive system for generating an accomplished design of an item by first engineering said design and then portraying said design in the form of electronically storable data, said system comprising:

a computer with a memory means;

a monitor coupled to said computer for displaying data outputted from the computer;

a data entry device coupled to said computer for inputting data to the computer;

a design plan consisting of elements of data which are stored in said memory means and which, when acted upon by the computer, are displayed on said monitor as a planar array of cells, each of which can contain a statement defining a value with at least one of said statements having the capacity to contain as an element thereof a value defined in another of said design plan cells;

means which, upon activation of said data entry means by a user, results in the editing of said statements by said computer;

means which causes said computer to update all cells related to a cell containing an edited statement;

means for causing the monitor to display the updated values of said cells as a particular design plan is edited;

means providing at least one master drawing in said memory means; and design generator means which causes said computer to parametrically combine the values in the cells of said design plan with data derived from a master drawing into an accomplished design.

27. A system as defined in claim 26 in which:

a master drawing contains at least one item of variable text; and at least one design plan cell has as an element thereof a statement that defines a set textual value related to said variable text;

whereby an accomplished design can be parametrically produced by substituting for a set textual value from a design plan cell an item of variable text derived from said master drawing.

28. A system as defined in claim 26 which includes:

a master drawing containing as an element thereof a variable dimension;

a design plan which contains as an element thereof a statement that defines a dimension value related to at least said variable dimension; and wherein the design generator means causes said computer to produce the accomplished design by:

(i) modifying the magnitude of a dimension of the master drawing pursuant to a related dimension value from a cell of the design, and (ii) resizing elements of the master drawing in accord with values in the cells of the design plan which annotate those master drawing elements.

29. A method of employing a general purpose interactive system which includes a computer with a memory means, a monitor coupled to said computer for displaying data outputted from the computer, and a data entry device coupled to said computer for inputting data to the computer to create an accomplished design by first engineering said design and then portraying said design in the form of electronically storable data, said method being limited to the following steps:

employing said data entry device to establish and store in said memory means a plurality of master drawings, each having variable text and dimensions;

employing said data entry device to store in said memory means a drawing description data array comprising:

(i) the names of one or more said master drawings, (ii) set text values that correspond to said variable text, and (iii) set dimension values that correspond to said variable dimensions;

thereafter employing said data entry device to input to said computer an execution instruction which specifies that a drawing be created pursuant to said drawing description data array; and thereafter electronically storing in said computer data representing said accomplished design and derived by modifying and combining the elements of those of master drawings with names appearing in said drawing description data array, said design representing data being generated by:

(i) resizing master drawing elements represented by variables as necessary to conform to the corresponding set dimensional values in said drawing description data array, and (ii) replacing variable text with the corresponding set text values from the drawing description data array.

30. A method of creating an accomplished design as defined in claim 29:

which includes the additional step of employing said data entry device to store in said memory means a drawing description data array as aforesaid that further comprises a scale factor value; and wherein, in employing said computer to generate data describing said accomplished design, the scale of the design is established according to said scale factor value.

31. A method of employing a general purposes interactive system which includes a computer with a memory means, a monitor coupled to said computer for displaying data outputted from the computer, and a data entry device coupled to said computer for inputting data to the computer to create an accomplished design by first engineering said design and then portraying said design in the form of electronically storable data, said method being limited to the following steps:

employing said data entry device to establish and store in said memory means a set of electronic data representing master drawing variable text and dimensions;

employing said data entry device to establish a reference point in the master drawing;

continuously displaying the updated master drawing on said monitor as said master drawing is established, whereby the user can visually monitor the appearance of said master drawing as it is established;

utilizing the data input device to input into said design plan at least one statement providing positional information; and thereafter electronically storing in said computer data representing said accomplished design and generated by employing the computer to position the image derived from said master drawing relative to said reference point in accord with the positional information contained in said statement(s).

32. A method of employing a general purpose interactive system which includes a computer with a memory means, a monitor coupled to said computer for displaying data outputted from the computer, and a data entry device coupled to said computer for inputting data to the computer to create an accomplished design by first engineering said design and then portraying said design in the form of electronically storable data, said method being limited to the following steps;

employing said data entry device to establish and store in said memory means a set of electronic data representing a single master drawing having variable text and dimensions;

employing said data entry device to store in said memory means a drawing description data array comprising:
(i) the name of the single master drawing,
(ii) set text values that correspond to said variable text, and
(iii) set dimension values that correspond to said variable dimension;

employing said data entry device to input to said computer an execution instruction which specifies that a drawing be created pursuant to said drawing description data array; and thereafter electronically storing in said computer data representing said accomplished design and derived from that master drawing with the name appearing in the drawing description data array by:
(i) resizing elements of the single, named master drawing represented by variables as necessary to conform to the corresponding set dimensional values in said drawing description data array, and
(ii) replacing variable text with corresponding text values from the drawing description data array.

* * * * *

UNITED STATES PATENT AND TRADEMARK OFFICE
CERTIFICATE OF CORRECTION

PATENT NO. : 5,197,120
DATED : 23 March 1993
INVENTOR(S) : Jay R. Saxton et al.

It is certified that error appears in the above—identified patent and that said Letters Patent is hereby corrected as shown below:

Column 3, line 32, change "at" to --that--.

Column 4, line 3, change "s ill" to --still--.

Column 5, line 60, after "match" insert a --period--.

Column 8, line 26, change "PIG." to --FIG.--.

Column 19, line 61, before "XINSERT" insert a --bracket--.

Column 19, line 62, before "YINSERT" insert a --bracket--.

UNITED STATES PATENT AND TRADEMARK OFFICE
CERTIFICATE OF CORRECTION

PATENT NO. : 5,197,120  
DATED : March 23, 1993  
INVENTOR(S) : Jay R. Saxton, et al Page 2 of 2

It is certified that error appears in the above-indentified patent and that said Letters Patent is hereby corrected as shown below:

Column 60, line 45, change "13" to --15--.

Signed and Sealed this

Twenty-sixth Day of July, 1994

*Attest:*

BRUCE LEHMAN

*Attesting Officer*  *Commissioner of Patents and Trademarks*